US012793646B2

(12) United States Patent
Huang et al.

(10) Patent No.: US 12,793,646 B2
(45) Date of Patent: Nov. 10, 2026

(54) SHIFTING REGISTER UNIT, DISPLAY PANEL, DISPLAY APPARATUS AND DRIVING METHOD

(71) Applicants: Chengdu BOE Optoelectronics Technology Co., Ltd., Sichuan Province (CN); BOE Technology Group Co., Ltd., Beijing (CN); Beijing BOE Technology Development Co., Ltd., Beijing (CN)

(72) Inventors: Yao Huang, Beijing (CN); Mengmeng Du, Beijing (CN)

(73) Assignees: Chengdu BOE Optoelectronics Technology Co., Ltd., Chengdu (CN); Beijing BOE Technology Development Co., Ltd., Beijing (CN)

( * ) Notice: Subject to any disclaimer, the term of this patent is extended or adjusted under 35 U.S.C. 154(b) by 281 days.

(21) Appl. No.: 18/697,360

(22) PCT Filed: Aug. 31, 2023

(86) PCT No.: PCT/CN2023/116239

§ 371 (c)(1),
(2) Date: Mar. 29, 2024

(87) PCT Pub. No.: WO2025/043630

PCT Pub. Date: Mar. 6, 2025

(65) Prior Publication Data

US 2026/0141862 A1 May 21, 2026

(51) Int. Cl.
*G09G 3/3266* (2016.01)
*G09G 3/3233* (2016.01)
(Continued)

(52) U.S. Cl.
CPC ......... *G09G 3/3266* (2013.01); *G09G 3/3233* (2013.01); *G11C 19/28* (2013.01);
(Continued)

(58) Field of Classification Search
CPC .. G09G 3/3266; G09G 3/3233; G09G 3/3677; G09G 2300/0426;
(Continued)

(56) References Cited

U.S. PATENT DOCUMENTS

| | | | | |
|---|---|---|---|---|
| 2011/0216876 A1* | 9/2011 | Amano | G11C 19/28 | 327/296 |
| 2012/0105397 A1* | 5/2012 | Tan | G09G 3/3677 | 377/64 |

(Continued)

FOREIGN PATENT DOCUMENTS

| | | | |
|---|---|---|---|
| CN | 1928981 A | 3/2007 | |
| CN | 101650506 A | 2/2010 | |

(Continued)

*Primary Examiner* — Stephen G Sherman
(74) *Attorney, Agent, or Firm* — Workman Nydegger

(57) ABSTRACT

Embodiments of the present disclosure provide a shifting register unit, a display panel, a display apparatus and a driving method. The shifting register unit includes a shifting register, configured to output a cascaded signal through a cascaded output terminal, and an output circuit, electrically connected with the shifting register, and configured to control a driving output terminal to output a gate scanning signal according to a signal of an output control signal terminal and a signal of a reference signal terminal.

39 Claims, 33 Drawing Sheets

(51) Int. Cl.
*G11C 19/28* (2006.01)
*G09G 3/36* (2006.01)

(52) U.S. Cl.
CPC ... *G09G 3/3677* (2013.01); *G09G 2300/0426* (2013.01); *G09G 2300/0842* (2013.01); *G09G 2310/0286* (2013.01); *G09G 2310/08* (2013.01); *G09G 2330/021* (2013.01)

(58) Field of Classification Search
CPC ... G09G 2300/0842; G09G 2310/0286; G09G 2310/08; G09G 2330/021; G11C 19/28
See application file for complete search history.

(56) References Cited

U.S. PATENT DOCUMENTS

| | | | | |
|---|---|---|---|---|
| 2015/0255031 | A1* | 9/2015 | Cao | G09G 3/3677 345/210 |
| 2016/0210926 | A1 | 7/2016 | Amino et al. | |
| 2017/0031389 | A1* | 2/2017 | Yoo | G06F 3/0443 |
| 2022/0013078 | A1 | 1/2022 | Kim et al. | |
| 2022/0084470 | A1 | 3/2022 | Park | |
| 2023/0071031 | A1 | 3/2023 | Qing et al. | |

FOREIGN PATENT DOCUMENTS

| | | | | | |
|---|---|---|---|---|---|
| CN | 108806611 | A | * | 11/2018 | G09G 3/3266 |
| CN | 110148389 | A | | 8/2019 | |
| CN | 210692046 | U | | 6/2020 | |
| CN | 112259038 | A | | 1/2021 | |
| CN | 112909085 | A | | 6/2021 | |
| CN | 113724667 | A | * | 11/2021 | G02F 1/13454 |
| CN | 113744693 | A | | 12/2021 | |
| CN | 114270431 | A | | 4/2022 | |
| CN | 115938324 | A | | 4/2023 | |
| CN | 116363982 | A | | 6/2023 | |
| KR | 20170136089 | A | | 12/2017 | |
| WO | 2021169555 | A1 | | 9/2021 | |
| WO | 2022246611 | A1 | | 12/2022 | |

* cited by examiner

SHIFTING REGISTER UNIT, DISPLAY PANEL, DISPLAY APPARATUS AND DRIVING METHOD

CROSS-REFERENCE TO RELATED APPLICATIONS

This application is a National Stage of International Application No. PCT/CN2023/116239, filed Aug. 31, 2023, which is hereby incorporated by reference in its entirety.

TECHNICAL FIELD

The present disclosure relates to the technical field of display, in particular to a shifting register unit, a display panel, a display apparatus and a driving method.

BACKGROUND

With the rapid development of display technologies, display panels present a development tendency towards high integration level and low cost. A gate driver on array, GOA integrates a driving control circuit on an array substrate of a display panel to form scanning driving for the display panel. At present, the driving control circuit is typically composed of a plurality of cascaded shifting register units.

SUMMARY

A shifting register unit provided by some embodiments of the present disclosure includes:

a shifting register, configured to output a cascaded signal through a cascaded output terminal; and an output circuit, electrically connected with the shifting register, and configured to control a driving output terminal to output a gate scanning signal according to a signal of a first voltage signal terminal and a signal of a reference signal terminal; the shifting register includes: a first control sub-circuit; the first control sub-circuit is electrically connected with a first node, a second node, a second voltage signal terminal and a first clock signal terminal in the shifting register; and the first control sub-circuit is configured to control a voltage of the second node according to a voltage of the first node and a signal of the first clock signal terminal.

In some possible implementations provided by the present disclosure, the shifting register includes: an input sub-circuit, configured to provide a signal of an input signal terminal to the first node in response to a signal of a second clock signal terminal.

In some possible implementations provided by the present disclosure, the input sub-circuit includes: a first transistor; and a first electrode of the first transistor is electrically connected with the input signal terminal, a second electrode of the first transistor is electrically connected with the first node, and a third electrode of the first transistor is electrically connected with the second clock signal terminal.

In some possible implementations provided by the present disclosure, the first control sub-circuit includes: a second transistor, a third transistor, a fourth transistor and a first capacitor;

a first electrode of the second transistor is electrically connected with the first clock signal terminal, a second electrode of the second transistor is electrically connected with the second node, and a third electrode of the second transistor is electrically connected with a third node; a first electrode of the third transistor is electrically connected with the second voltage signal terminal, a second electrode of the third transistor is electrically connected with the third node, and a third electrode of the third transistor is electrically connected with the first node; a first electrode of the fourth transistor is electrically connected with the second voltage signal terminal, a second electrode of the fourth transistor is electrically connected with the second node, and a third electrode of the fourth transistor is electrically connected with the first node; and a first electrode of the first capacitor is electrically connected with the first clock signal terminal, and a second electrode of the first capacitor is electrically connected with the third node.

In some possible implementations provided by the present disclosure, the shifting register includes:

a second control sub-circuit, electrically connected with the first node, the second node, the second voltage signal terminal and the first clock signal terminal; and the second control sub-circuit is configured to transmit a signal from the second voltage signal terminal to the first node according to the voltage of the second node and the signal of the first clock signal terminal.

In some possible implementations provided by the present disclosure, the second control sub-circuit includes: a fifth transistor and a sixth transistor;

a first electrode of the fifth transistor is electrically connected with the second voltage signal terminal, a second electrode of the fifth transistor is electrically connected with a first electrode of the sixth transistor, and a third electrode of the fifth transistor is electrically connected with the second node; and a second electrode of the sixth transistor is electrically connected with the first node, and a third electrode of the sixth transistor is electrically connected with the first clock signal terminal.

In some possible implementations provided by the present disclosure, the shifting register includes:

a voltage stabilizing sub-circuit, electrically connected with the first node, a fourth node and the first voltage signal terminal, and the voltage stabilizing sub-circuit is configured to transmit a voltage from the first node to the fourth node according to the signal of the first voltage signal terminal.

In some possible implementations provided by the present disclosure, the voltage stabilizing sub-circuit includes: a seventh transistor; and a first electrode of the seventh transistor is electrically connected with the first node, a second electrode of the seventh transistor is electrically connected with the fourth node, and a third electrode of the seventh transistor is electrically connected with the first voltage signal terminal.

In some possible implementations provided by the present disclosure, the shifting register includes:

a cascaded sub-circuit, electrically connected with the second node, a fourth node, the first clock signal terminal and the second voltage signal terminal, and the cascaded sub-circuit is configured to make the cascaded output terminal output the cascaded signal in response to voltages of the second node and the fourth node.

In some possible implementations provided by the present disclosure, the cascaded sub-circuit includes: an eighth transistor, a ninth transistor and a second capacitor;

a first electrode of the eighth transistor is electrically connected with the first clock signal terminal, a second electrode of the eighth transistor is electrically connected with the cascaded output terminal, and a third electrode of the eighth transistor is electrically connected with the fourth node; a first electrode of the ninth transistor is electrically connected with the second voltage signal terminal, a second electrode of the ninth transistor is electrically connected with the cascaded output terminal, and a third electrode of the ninth transistor is electrically connected with the second node; and a first electrode of the second capacitor is electrically connected with the fourth node, and a second electrode of the second capacitor is electrically connected with the cascaded output terminal.

In some possible implementations provided by the present disclosure, the cascaded sub-circuit includes: a third capacitor; and a first electrode of the third capacitor is electrically connected with the second voltage signal terminal, and a second electrode of the third capacitor is electrically connected with the cascaded output terminal.

In some possible implementations provided by the present disclosure, the shifting register includes: a pull-down sub-circuit, electrically connected with a third voltage signal terminal and the first node, and configured to transmit a signal from the third voltage signal terminal to the first node.

In some possible implementations provided by the present disclosure, an amplitude of a voltage signal of the third voltage signal terminal is greater than an amplitude of a voltage signal of the first voltage signal terminal.

In some possible implementations provided by the present disclosure, the pull-down sub-circuit includes: a twelfth transistor; and a first electrode of the twelfth transistor is electrically connected with the third voltage signal terminal, a second electrode of the twelfth transistor is electrically connected with the first node, and a third electrode of the twelfth transistor is electrically connected with the fourth node.

In some possible implementations provided by the present disclosure, the pull-down sub-circuit includes: a twelfth transistor; and a first electrode of the twelfth transistor is electrically connected with the third voltage signal terminal, a second electrode of the twelfth transistor is electrically connected with the first node, and a third electrode of the twelfth transistor is electrically connected with the first node.

In some possible implementations provided by the present disclosure, the output circuit includes: a tenth transistor and an eleventh transistor;

a first electrode of the tenth transistor is electrically connected with the reference signal terminal, a second electrode of the tenth transistor is electrically connected with the driving output terminal, and a third electrode of the tenth transistor is electrically connected with the first node; and a first electrode of the eleventh transistor is electrically connected with the first voltage signal terminal, a second electrode of the eleventh transistor is electrically connected with the driving output terminal, and a third electrode of the eleventh transistor is electrically connected with the second node.

In some possible implementations provided by the present disclosure, the output circuit includes: a tenth transistor, an eleventh transistor and a thirteenth transistor;

a first electrode of the tenth transistor is electrically connected with the reference signal terminal, a second electrode of the tenth transistor is electrically connected with the driving output terminal, and a third electrode of the tenth transistor is electrically connected with a second electrode of the thirteenth transistor; and a first electrode of the eleventh transistor is electrically connected with the first voltage signal terminal, a second electrode of the eleventh transistor is electrically connected with the driving output terminal, and a third electrode of the eleventh transistor is electrically connected with the second node; a first electrode of the thirteenth transistor is electrically connected with the first node, and a third electrode of the thirteenth transistor is electrically connected with the first voltage signal terminal.

In some possible implementations provided by the present disclosure, the output circuit further includes: a fourth capacitor; and a first electrode of the fourth capacitor is electrically connected with the first voltage signal terminal, and a second electrode of the fourth capacitor is electrically connected with the second node.

In some possible implementations provided by the present disclosure, the signal of the reference signal terminal and the signal of the first clock signal terminal are inversion signals for each other.

In some possible implementations provided by the present disclosure, the signal of the first clock signal terminal and the signal of the second clock signal terminal are not effective level signals at the same time.

A display panel provided by some embodiments of the present disclosure includes:

a base substrate, including a display region and a non-display region; the display region includes: a plurality of sub-pixels; and a plurality of scanning lines, wherein one row of sub-pixels in the plurality of sub-pixels is electrically connected with at least one scanning line in the plurality of scanning lines correspondingly; and the non-display region includes: a gate driving circuit, including a plurality of above shifting register units, wherein a driving output terminal of each shifting register unit in the plurality of shifting register units is electrically connected with at least one scanning line in the plurality of scanning lines correspondingly.

In some possible implementations provided by the present disclosure, the display panel further includes: an input signal line electrically connected with the gate driving circuit and arranged at the non-display region, a first voltage signal line away from the display region, a first clock signal line and a second clock signal line;

any one of the input signal line, the first voltage signal line away from the display region, the first clock signal line and the second clock signal line extends in a first direction, a gate line extends in a second direction, and the first direction and the second direction intersect.

In some possible implementations provided by the present disclosure, orthographic projections of the input signal line, the first clock signal line, the second clock signal line and the first voltage signal line away from the display region on the base substrate are distributed sequentially in a direction close to the display region, and are located on a side of the shifting register units away from the display region.

In some possible implementations provided by the present disclosure, the input signal line, the first clock signal line, the second clock signal line and the first voltage signal line away from the display region are arranged at the same layer.

In some possible implementations provided by the present disclosure, orthographic projections of the input signal line, the first voltage signal line away from the display region, the first clock signal line and the second clock signal line on the base substrate are distributed sequentially in a direction close to the display region, and are located on a side of the shifting register units away from the display region.

In some possible implementations provided by the present disclosure, the input signal line and the first voltage signal line away from the display region are arranged at the same layer, the first clock signal line and the second clock signal line are arranged at the same layer, and the input signal line and the first voltage signal line away from the display region are not arranged at the same layer with the first clock signal line and the second clock signal line.

In some possible implementations provided by the present disclosure, the display panel further includes: a second voltage signal line electrically connected with the gate driving circuit and arranged at the non-display region, wherein the second voltage signal line extends in the first direction.

In some possible implementations provided by the present disclosure, the second voltage signal line is arranged on a side, close to the display region, of the first voltage signal line away from the display region.

In some possible implementations provided by the present disclosure, the display panel further includes: a third voltage signal line electrically connected with the gate driving circuit and arranged at the non-display region, wherein the third voltage signal line extends in the first direction.

In some possible implementations provided by the present disclosure, the third voltage signal line is arranged on a side of the second voltage signal line close to the display region.

In some possible implementations provided by the present disclosure, the display panel further includes: a third clock signal line electrically connected with the gate driving circuit and arranged at the non-display region, a fourth clock signal line and a first voltage signal line close to the display region, wherein the third clock signal line, the fourth clock signal line and the first voltage signal line close to the display region extend in the first direction.

In some possible implementations provided by the present disclosure, any one of the third clock signal line and the fourth clock signal line is arranged on a side of the third voltage signal line close to the display region; and the first voltage signal line close to the display region is located on a side of any one of the third clock signal line and the fourth clock signal line close to the display region.

In some possible implementations provided by the present disclosure, a reference signal terminal of an $i^{th}$ grade shifting register unit is electrically connected with one of the third clock signal line and the fourth clock signal line, and a reference signal terminal of an $(i+1)^{th}$ grade shifting register unit is electrically connected with the other one of the third clock signal line and the fourth clock signal line.

In some possible implementations provided by the present disclosure, a first clock signal terminal of an $i^{th}$ grade shifting register unit is electrically connected with one of the first clock signal line and the second clock signal line, and a second clock signal terminal of the $i^{th}$ grade shifting register unit is electrically connected with the other one of the first clock signal line and the second clock signal line; and the first clock signal terminals of adjacent shifting register units are connected with different signal lines, and the second clock signal terminals of the adjacent shifting register units are connected with different signal lines.

In some possible implementations provided by the present disclosure, a width of any one of the input signal line, the first voltage signal line, the second voltage signal line and the third voltage signal line in the second direction is less than a width of any one of the first clock signal line, the second clock signal line, the third clock signal line and the fourth clock signal line in the second direction.

In some possible implementations provided by the present disclosure, each of the shifting register units includes: a first transistor, a second transistor, a third transistor, a fourth transistor, a seventh transistor and a first capacitor; and at least part of any transistor or capacitor in the first transistor, the second transistor, the third transistor, the fourth transistor, the seventh transistor and the first capacitor is located between the first voltage signal line and the second voltage signal line.

In some possible implementations provided by the present disclosure, each of the shifting register units includes: a fifth transistor, a sixth transistor, an eighth transistor, a ninth transistor, a twelfth transistor and a second capacitor; and at least part of any transistor or capacitor in the fifth transistor, the sixth transistor, the eighth transistor, the ninth transistor, the twelfth transistor and the second capacitor is located between the second voltage signal line and the third voltage signal line.

In some possible implementations provided by the present disclosure, an active layer of the twelfth transistor extends in the first direction, at least part of any one of a first electrode and a second electrode of the twelfth transistor extends in the second direction, and a third electrode of the twelfth transistor extends in the second direction.

In some possible implementations provided by the present disclosure, each of the shifting register units includes: a tenth transistor, an eleventh transistor and a third capacitor;

at least part of any transistor or capacitor in the tenth transistor, the eleventh transistor and the third capacitor is located on a side, close to the display region, of the first voltage signal line close to the display region; and an orthographic projection of the first voltage signal line close to the display region on the base substrate partially overlaps an orthographic projection of the third capacitor on the base substrate.

In some possible implementations provided by the present disclosure, a channel width of an active layer of the tenth transistor is greater than a channel width of an active layer of the eighth transistor.

In some possible implementations provided by the present disclosure, the channel width of the active layer of the tenth transistor is not less than 90 microns.

In some possible implementations provided by the present disclosure, the channel width of the active layer of the eighth transistor is not greater than 50 microns.

In some possible implementations provided by the present disclosure, a channel width of an active layer of the eleventh transistor is greater than a channel width of an active layer of the ninth transistor.

In some possible implementations provided by the present disclosure, the channel width of the active layer of the eleventh transistor is not less than 90 microns.

In some possible implementations provided by the present disclosure, the channel width of the active layer of the ninth transistor is not greater than 50 microns.

A display apparatus provided by some embodiments of the present disclosure includes: the above display panel.

A driving method provided by some embodiments of the present disclosure includes:

providing, by an input sub-circuit, a signal of an input signal terminal to a first node under control of a signal of a second clock signal terminal; controlling, by a first control sub-circuit, a voltage of a second node under control of a voltage of the first node and a signal of a first clock signal terminal; providing, by a second control sub-circuit, a signal of a second voltage signal terminal to the first node under control of the voltage of the second node and the signal of the first clock signal terminal; providing, by a voltage stabilizing sub-circuit, the voltage of the first node to a fourth node under control of a signal of a first voltage signal terminal; providing, by a cascaded sub-circuit, the signal of the second voltage signal terminal or the signal of the first clock signal terminal to a cascaded output terminal under control of voltages of the second node and the fourth node; and providing, by an output circuit, a signal of a reference signal terminal or the signal of the first voltage signal terminal to a driving output terminal under control of the voltages of the first node and the second node.

In some possible implementations provided by the present disclosure, a shifting register unit further includes: a pull-down sub-circuit; and the method further includes: providing, by the pull-down sub-circuit, a signal of a third voltage signal terminal to the first node under control of the voltages of the first node or the fourth node.

BRIEF DESCRIPTION OF FIGURES

The accompanying drawings are intended to provide understanding of the technical solution of the present application, constitute a part of the specification, and are used to explain the technical solution of the present application together with embodiments of the present application, but do not constitute a limitation to the technical solution of the present application.

DETAILED DESCRIPTION

Figure 1:
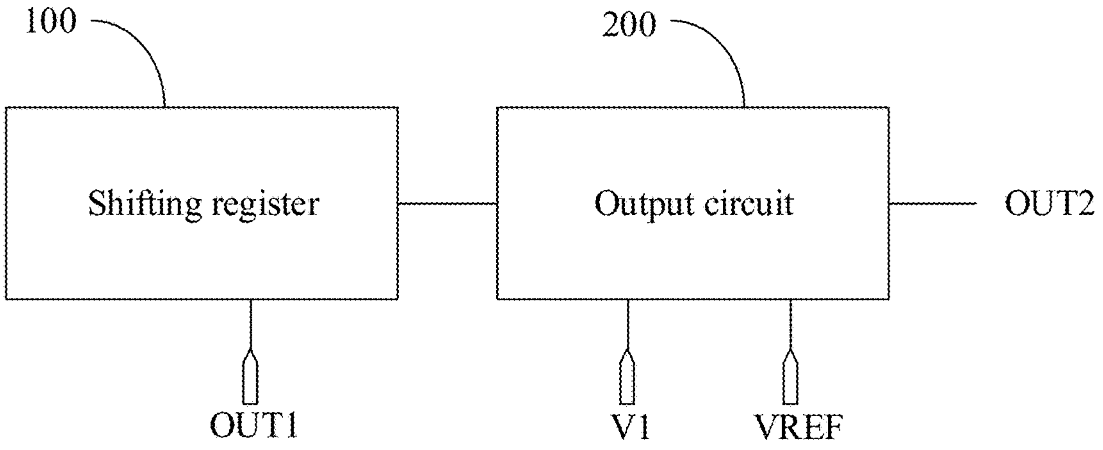
FIG. 1 is some schematic structural diagrams of a shifting register unit provided by an embodiment of the present disclosure.

To make the objectives, technical solutions and advantages of embodiments of the present disclosure clearer, the technical solutions of the embodiments of the present disclosure will be clearly and completely described below in conjunction with the accompanying drawings of the embodiments of the present disclosure. Apparently, the described embodiments are only part of the embodiments of the present disclosure, not all of the embodiments. The embodiments in the present disclosure and features in the embodiments can be combined with each other in the case of not conflicting. Based on the described embodiments of the present disclosure, all other embodiments obtained by those of ordinary skill in the art without creative work shall fall within the protection scope of the present disclosure.

Unless otherwise defined, technical or scientific terms used in the present disclosure shall have the ordinary meanings understood by those ordinarily skilled in the art to which the present disclosure pertains. The words "first", "second" and the like used in the present disclosure do not indicate any order, quantity or importance, but are only used to distinguish different components. The words "comprise" or "include" or the like indicate that an element or item appearing before such words covers listed elements or items appearing after the words and equivalents thereof, and do not exclude other elements or items. The words "electrically connect" or "couple" or the like are not limited to physical or mechanical electric connections, but may include electrical electric connections, whether direct or indirect.

It should be noted that the sizes and shapes of all figures in the accompanying drawings do not reflect true scales, and are only intended to schematically illustrate the content of the present disclosure. The same or similar reference numerals represent the same or similar elements or elements with the same or similar functions throughout.

In the present specification, for the sake of convenience, using "middle", "upper", "lower", "front", "back", "vertical", "horizontal", "top", "bottom", "inner", "outer" and other words and phrases indicating directional or positional relationships to describe the positional relationships between constituting factors with reference to the accompanying drawings is only for the convenience of describing the present specification and simplifying the description, rather than indicating or implying that the apparatus or element must have a specific orientation and be constructed and operated in a specific orientation, and thus cannot be understood as a limitation of the present disclosure. The positional relationships between the constituting factors are properly changed according to directions describing the constituting factors. Therefore, it is not limited to the words and phrases described in the specification, and may be properly replaced according to situations.

In the specification, "arranged in the same layer" adopted refers to a structure formed by patterning two (or more) structures through the same patterning process, and their materials may be the same or different. For example, the materials of precursors used to form the multiple structures arranged in the same layer are the same, and resulting materials may be the same or different.

In the specification, triangles, rectangles, trapezoids, pentagons, or hexagons or the like are not strictly defined, but may be approximated as triangles, rectangles, trapezoids, pentagons, or hexagons or the like, there may be some small deformations caused by tolerances, and there may be leading angles, arc edges, deformations and the like.

A display substrate includes: a pixel driving circuit, a light emitting element and a gate driving circuit, wherein the gate driving circuit is arranged to provide a third electrode signal to the pixel driving circuit so as to make the pixel driving circuit drive the light emitting element to emit light. A low temperature poly-silicon (LTPS) technology is used in the display substrate, and the LTPS technology has the advantages such as high resolution, high reaction speed, high brightness and high aperture ratio. Although welcomed in the market, the LTPS technology also has some defects such as high production cost and large required power consumption, and at this time, a low temperature polycrystalline oxide (LTPO) technical solution emerges. Compared to the LTPS technology in which a pixel driving circuit includes a low temperature poly-silicon transistor, in the LTPO technology, a pixel driving circuit includes a low temperature poly-silicon transistor and a metal oxide transistor, the metal oxide transistor has a smaller leak current, making pixel points faster in reaction, while a layer of oxides is added to the display substrate, which may lower energy consumption required by exciting the pixel points, and then lower power consumption during screen displaying. The development of the LTPO technology requires a gate driving circuit to be able to provide a third electrode signal meeting a potential requirement.

An embodiment of the present disclosure provides a shifting register unit, as shown in FIG. 1, including:

- a shifting register 100, configured to output a cascaded signal through a cascaded output terminal OUT1; and
- an output circuit 200, electrically connected with the shifting register 100, and configured to control a driving output terminal OUT2 to output a gate scanning signal according to a signal of a reference signal terminal VREF and a signal of a first voltage signal terminal V1.

Figure 2:
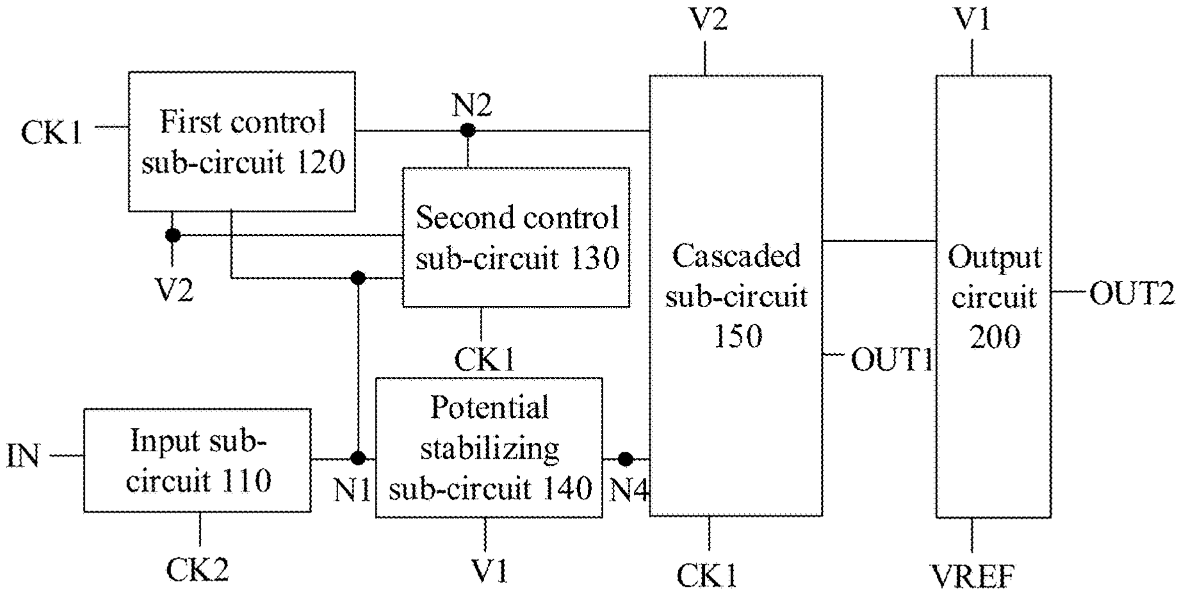
FIG. 2 is some other schematic structural diagrams of a shifting register unit provided by an embodiment of the present disclosure.

In some embodiments of the present disclosure, as shown in FIG. 2, the shifting register 100 includes:

- an input sub-circuit 110, configured to provide a signal from an input signal terminal IN to a first node N1 according to a signal of a second clock signal terminal CK2;
- a first control sub-circuit 120, wherein the first control sub-circuit 120 is electrically connected with a first clock signal terminal CK1, a second voltage signal terminal V2, the first node N1 and a second node N2, and is configured to control a voltage of the second node N2 according to a voltage of the first node N1 and a signal of the first clock signal terminal CK1;
- a second control sub-circuit 130, configured to transmit a signal from the second voltage signal terminal V2 to the first node N1 according to the voltage of the second node N2 and the signal of the first clock signal terminal CK1;
- a potential stabilizing circuit 140, configured to transmit a voltage from the first node N1 to a fourth node N4 according to the signal of the first voltage signal terminal V1; and
- a cascaded sub-circuit 150, configured to control the cascaded output terminal OUT1 to output the cascaded signal according to the voltages of the second node N2 and the fourth node N4.

Figure 3:
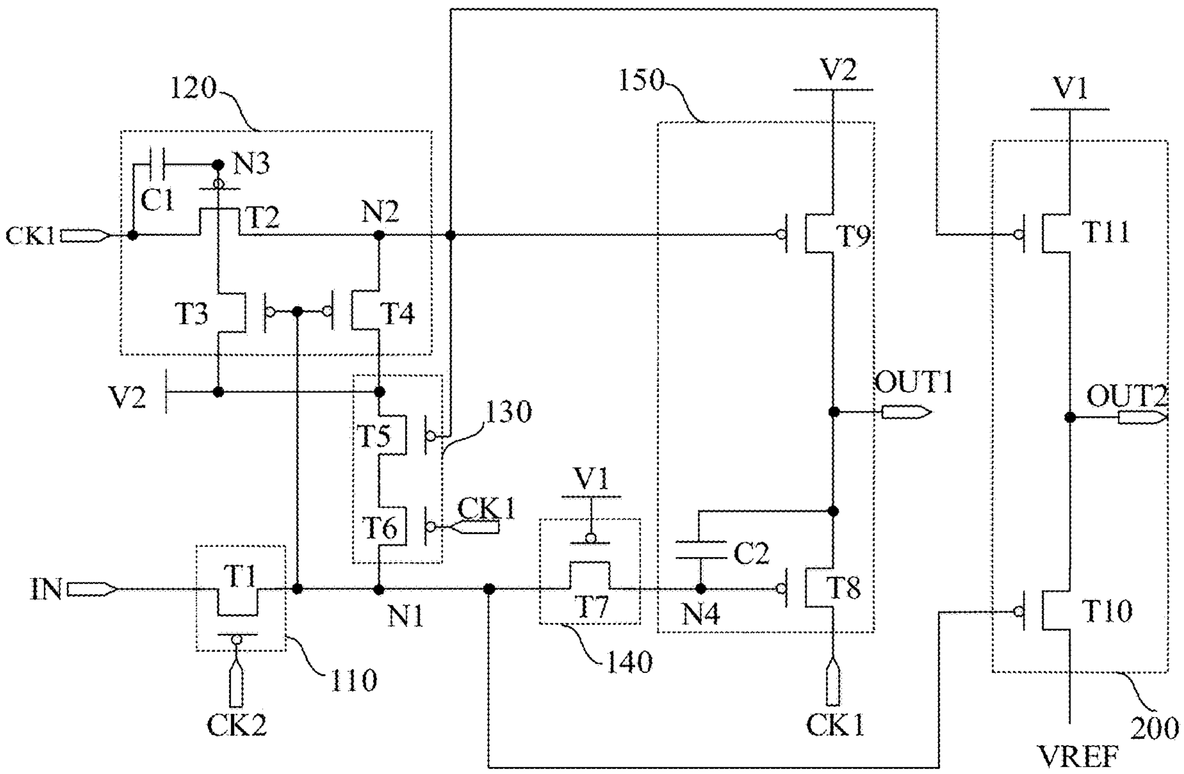
FIG. 3 is a first equivalent circuit diagram of a shifting register unit provided by an embodiment of the present disclosure.

In some embodiments of the present disclosure, as shown in FIG. 3, the input sub-circuit 110 includes: a first transistor T1, wherein a first electrode of the first transistor T1 is electrically connected with the input signal terminal IN, a second electrode of the first transistor T1 is electrically connected with the first node N1, and a third electrode of the first transistor T1 is electrically connected with the second clock signal terminal CK2.

In some embodiments of the present disclosure, as shown in FIG. 3, the first control sub-circuit 120 includes: a second transistor T2, a third transistor T3, a fourth transistor T4 and a first capacitor C1.

A first electrode of the second transistor T2 is electrically connected with the first clock signal terminal CK1, a second electrode of the second transistor T2 is electrically connected with the second node N2, and a third electrode of the second transistor T2 is electrically connected with a third node N3; a first electrode of the third transistor T3 is electrically connected with the second voltage signal terminal V2, a second electrode of the third transistor T3 is electrically connected with the third node N3, and a third electrode of the third transistor T3 is electrically connected with the first node N1; a first electrode of the fourth transistor T4 is electrically connected with the second voltage signal terminal V2, a second electrode of the fourth transistor T4 is electrically connected with the second node N2, and a third electrode of the fourth transistor T4 is electrically connected with the first node N1; and a first electrode of the first capacitor C1 is electrically connected with the third node N3, and a second electrode of the first capacitor C1 is electrically connected with the first clock signal terminal CK1.

In some embodiments of the present disclosure, the first capacitor C1 may couple the signal of the first clock signal terminal to the third node N3.

In some embodiments of the present disclosure, as shown in FIG. 3, the second control sub-circuit 130 includes: a fifth transistor T5 and a sixth transistor T6.

A first electrode of the fifth transistor T5 is electrically connected with the second voltage signal terminal V2, a second electrode of the fifth transistor T5 is electrically connected with a first electrode of the sixth transistor T6, and a third electrode of the fifth transistor T5 is electrically connected with the second node N2; and a second electrode of the sixth transistor T6 is electrically connected with the first node N1, and a third electrode of the sixth transistor T6 is electrically connected with the first clock signal terminal CK1.

In some embodiments of the present disclosure, as shown in FIG. 3, the voltage stabilizing sub-circuit 140 includes: a seventh transistor T7, wherein a first electrode of the seventh transistor T7 is electrically connected with the first node N1, a second electrode of the seventh transistor T7 is electrically connected with the fourth node N4, and a third electrode of the seventh transistor T7 is electrically connected with the first voltage signal terminal V1.

In some embodiments of the present disclosure, as shown in FIG. 3, the cascaded sub-circuit 150 includes: an eighth transistor T8, a ninth transistor T9 and a second capacitor C2.

A first electrode of the eighth transistor T8 is electrically connected with the first clock signal terminal CK1, a second electrode of the eighth transistor T8 is electrically connected with the cascaded output terminal OUT1, and a third electrode of the eighth transistor T8 is electrically connected with the fourth node N4; a first electrode of the ninth transistor T9 is electrically connected with the second voltage signal terminal V2, a second electrode of the ninth transistor T9 is electrically connected with the cascaded output terminal OUT1, and a third electrode of the ninth transistor T9 is electrically connected with the second node N2; and a first electrode of the second capacitor C2 is electrically connected with the fourth node N4, and a second electrode of the second capacitor C2 is electrically connected with the cascaded output terminal OUT1.

In some embodiments of the present disclosure, the second capacitor C2 may maintain a pressure difference between signals of the fourth node N4 and the cascaded output terminal OUT1.

In some embodiments of the present disclosure, as shown in FIG. 3, the output circuit 200 includes: a tenth transistor T10 and an eleventh transistor T11.

A first electrode of the tenth transistor T10 is electrically connected with the reference signal terminal VREF, a second electrode of the tenth transistor T10 is electrically connected with the driving output terminal OUT2, and a third electrode of the tenth transistor T10 is electrically connected with the first node N1; and a first electrode of the eleventh transistor T11 is electrically connected with the first voltage signal terminal V1, a second electrode of the eleventh transistor T11 is electrically connected with the driving output terminal OUT2, and a third electrode of the eleventh transistor T11 is electrically connected with the second node N2.

Figure 4:
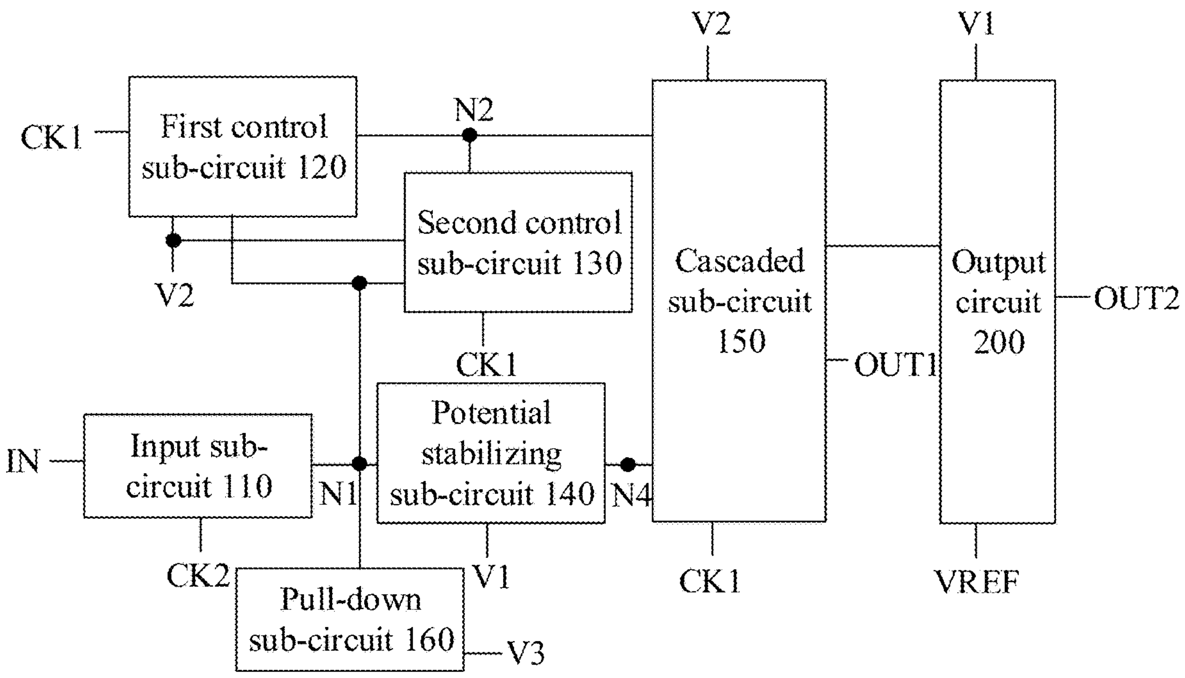
FIG. 4 is yet some schematic structural diagrams of a shifting register unit provided by an embodiment of the present disclosure.

In some embodiments of the present disclosure, as shown in FIG. 4, the shifting register 100 further includes: a pull-down sub-circuit 160, configured to transmit a signal from a third voltage signal terminal V3 to the first node N1. An amplitude of a voltage signal of the third voltage signal terminal V3 is greater than an amplitude of a voltage signal of the first voltage signal terminal V1. That is, an absolute value of a voltage value of the signal of the third voltage signal terminal V3 is greater than an absolute value of a voltage value of the signal of the first voltage signal terminal V1.

Figure 5:
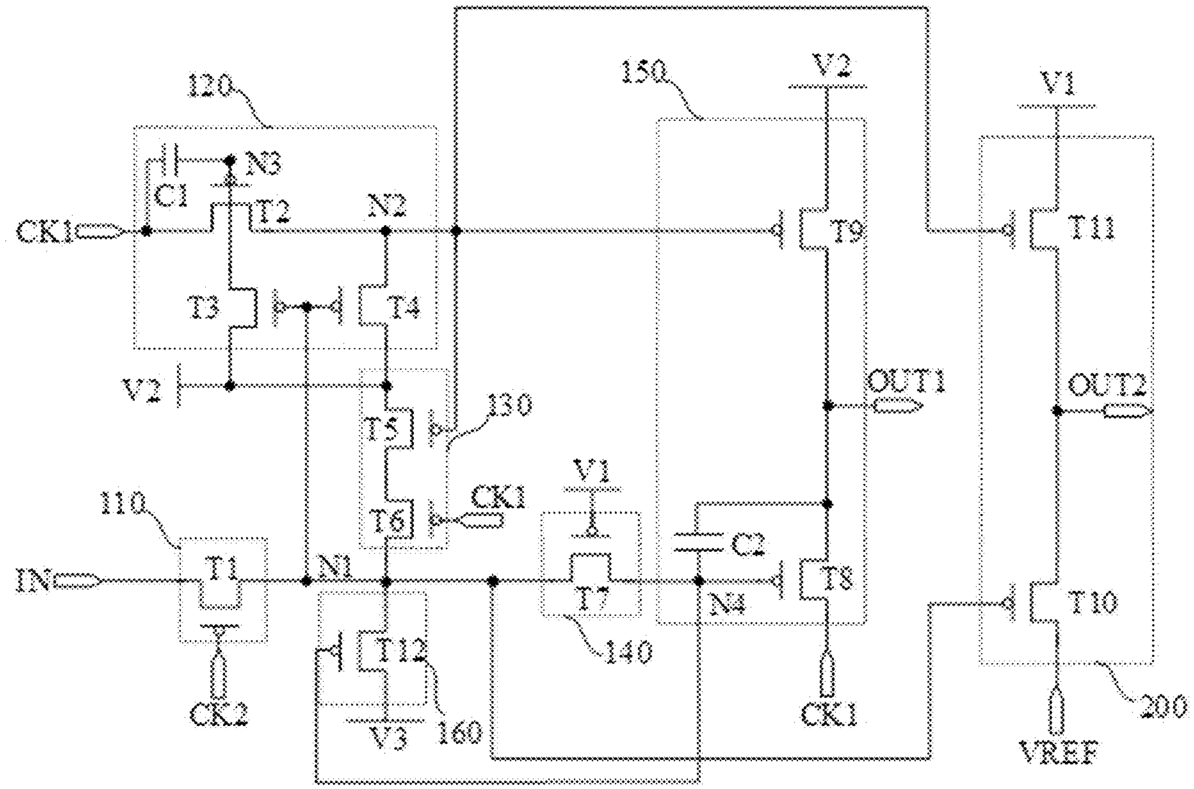
FIG. 5 is the second equivalent circuit diagram of a shifting register unit provided by an embodiment of the present disclosure.

In some embodiments of the present disclosure, as shown in FIG. 5, the pull-down sub-circuit 160 includes: a twelfth transistor T12, wherein a first electrode of the twelfth transistor T12 is electrically connected with the third voltage signal terminal V3, a second electrode of the twelfth transistor T12 is electrically connected with the first node N1, and a third electrode of the twelfth transistor T12 is electrically connected with the fourth node N4.

Figure 6:
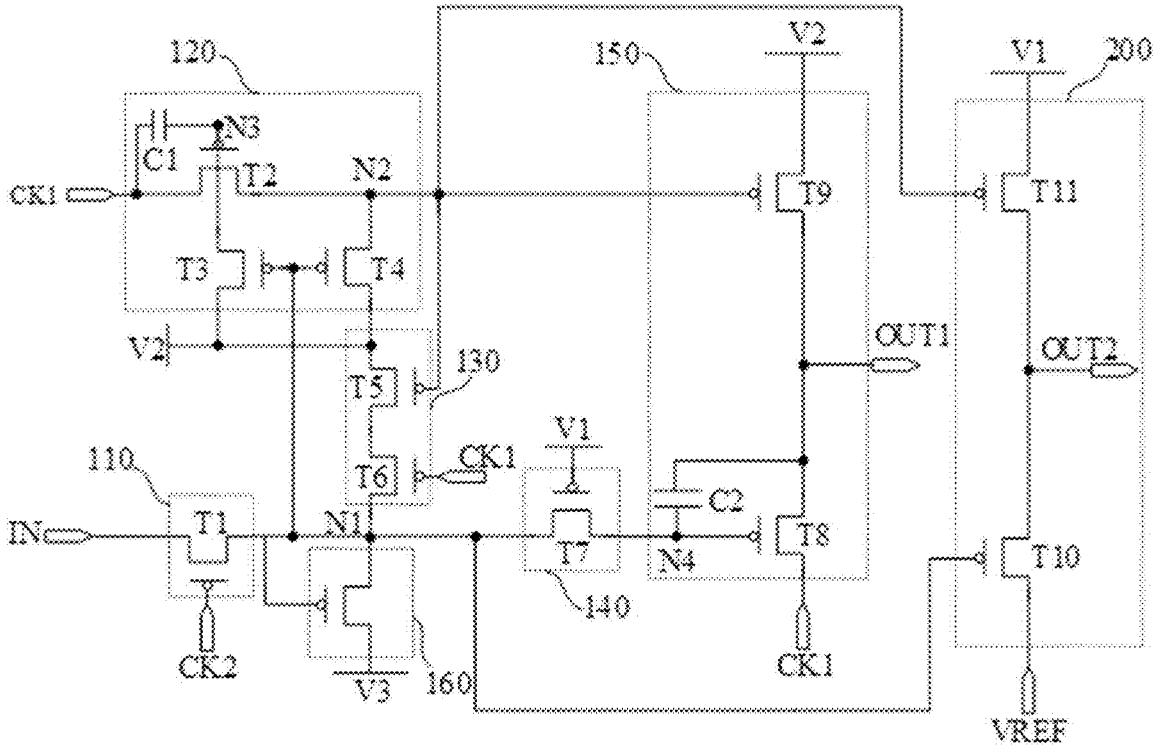
FIG. 6 is the third equivalent circuit diagram of a shifting register unit provided by an embodiment of the present disclosure.

In some embodiments of the present disclosure, as shown in FIG. 6, the pull-down sub-circuit 160 includes: a twelfth transistor T12, wherein a first electrode of the twelfth transistor T12 is electrically connected with the third voltage signal terminal V3, a second electrode of the twelfth transistor T12 is electrically connected with the first node N1, and a third electrode of the twelfth transistor T12 is electrically connected with the first node N1.

According to the shifting register unit provided by the present disclosure, through the arrangement of the pull-down sub-circuit 160, the signal of the first node N1 may be pulled down to a low-level signal with a lower voltage value, so that part of transistors in the shifting register unit may be turned on completely, then a voltage of an output signal of the shifting register unit may be made to reach a predetermined voltage, the driving capability of the shifting register unit is improved, the conduction capability of transistors in a pixel driving circuit may be guaranteed, and then the performance of the pixel driving circuit and the display effect of a display substrate are improved.

Figure 7:
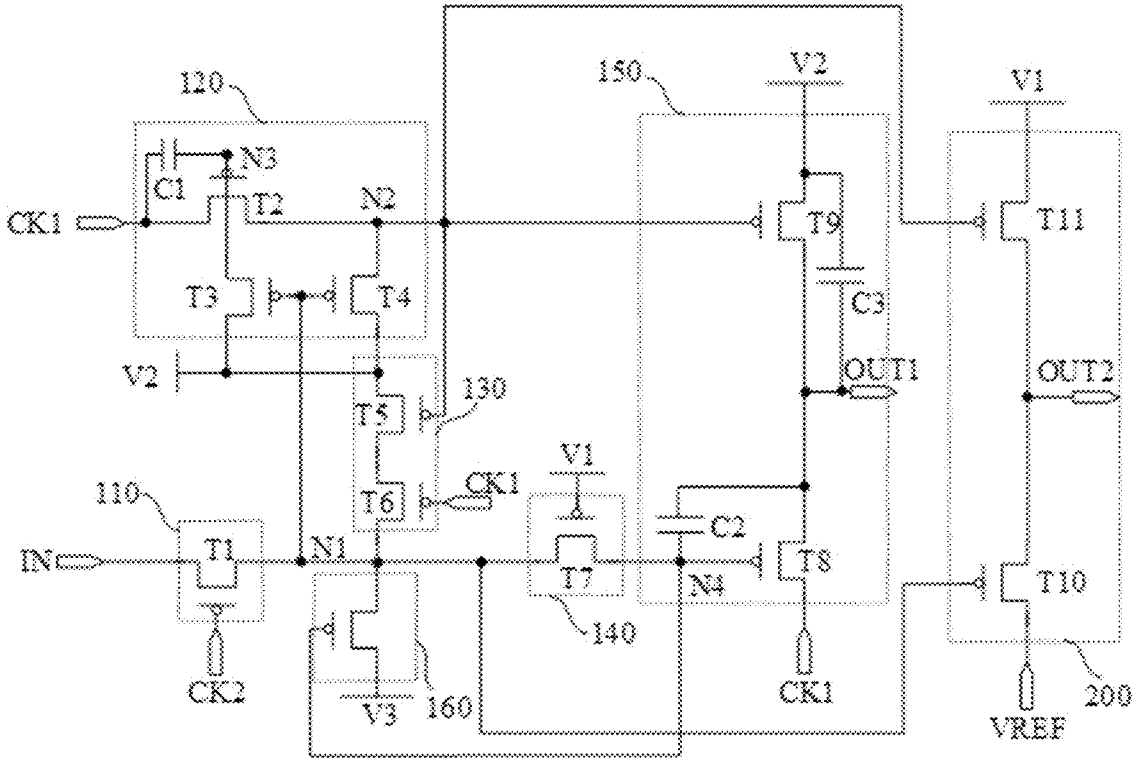
FIG. 7 is the fourth equivalent circuit diagram of a shifting register unit provided by an embodiment of the present disclosure.

In some embodiments of the present disclosure, as shown in FIG. 7, the cascaded sub-circuit 150 further includes: a third capacitor C3, wherein a first electrode of the third capacitor C3 is electrically connected with the second voltage signal terminal V2, and a second electrode of the third capacitor C3 is electrically connected with the cascaded output terminal OUT1.

In the present disclosure, as the signal output by the cascaded output terminal OUT1 is the cascaded signal, that is, a signal line connected with the cascaded output terminal OUT1 will not flow through a display region where the pixel driving circuit is located, that is, a load of the signal line connected with the cascaded output terminal OUT1 is low, and it is vulnerable to the impact of parasitic capacitance of part of transistors in an output circuit, resulting in fluctuations of the signal of the cascaded output terminal OUT1. In the present disclosure, through the arrangement of the third capacitor C3, the signal output by the cascaded output terminal OUT1 may be made relatively stable, and the performance of the shifting register unit is improved.

Figure 8:
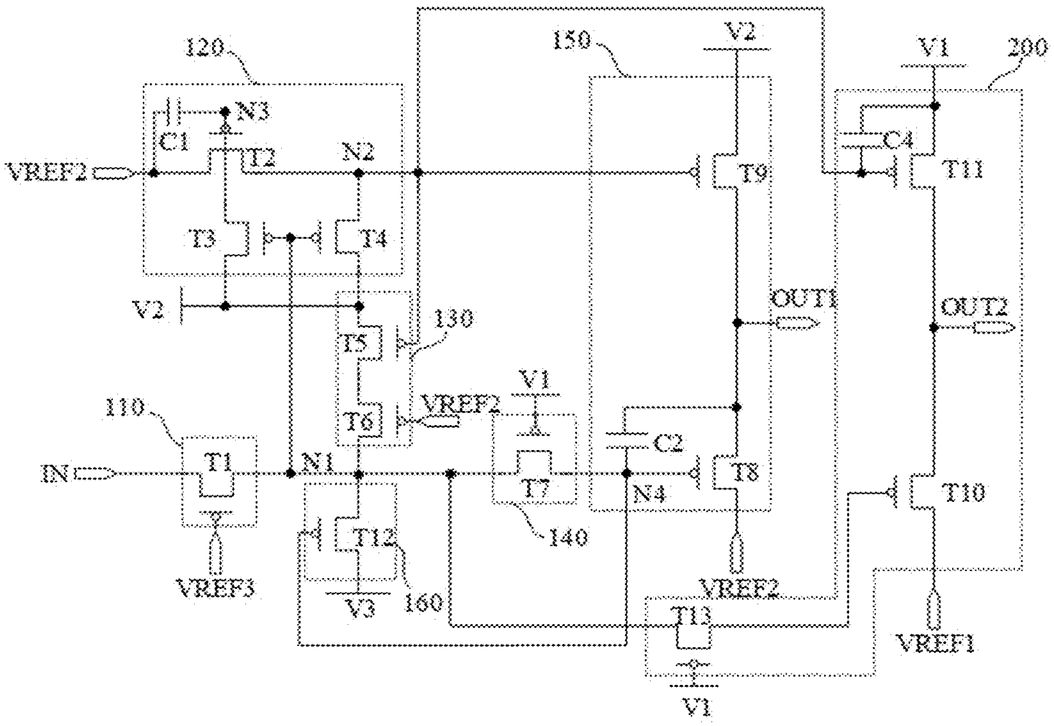
FIG. 8 is the fifth equivalent circuit diagram of a shifting register unit provided by an embodiment of the present disclosure.

In some embodiments of the present disclosure, as shown in FIG. 8, the output circuit 200 may further include: a fourth capacitor C4, wherein a first electrode of the fourth capacitor C4 is electrically connected with the second node N2, and a second electrode of the fourth capacitor C4 is electrically connected with the first voltage signal terminal V1.

In some embodiments of the present disclosure, the fourth capacitor C4 may guarantee the stability of the signal of the second node N2.

Figure 9:
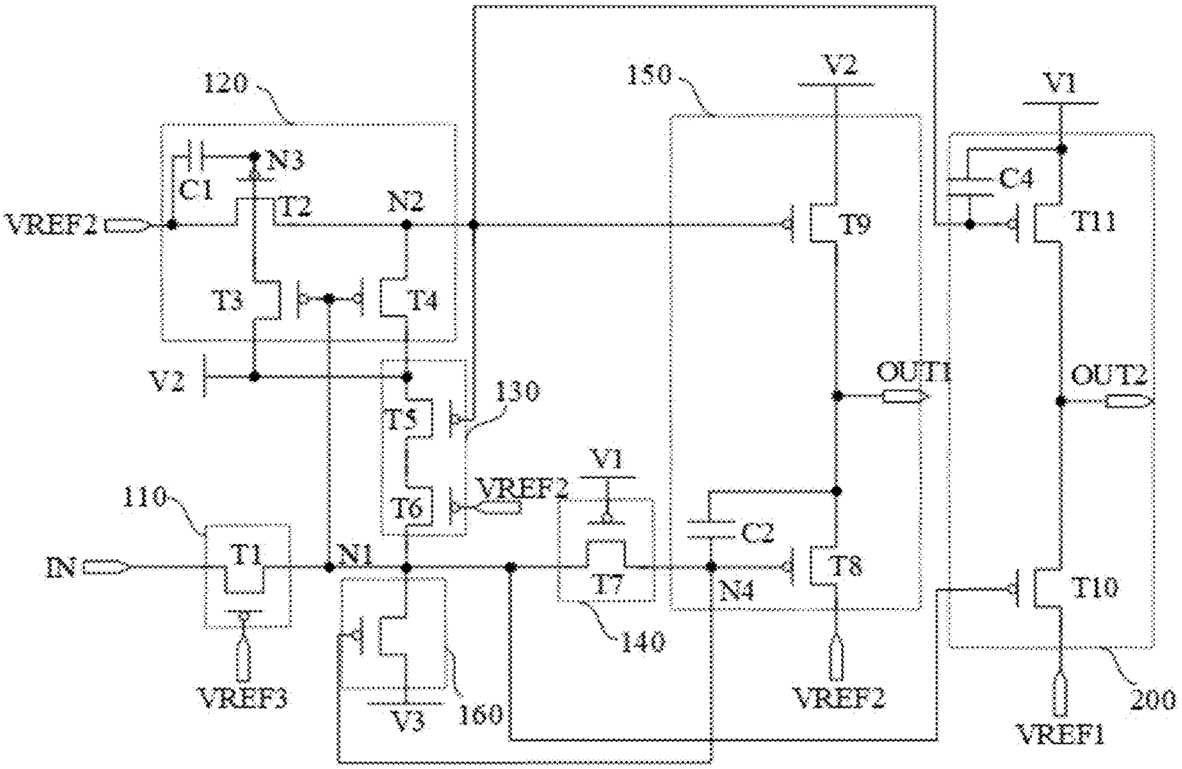
FIG. 9 is the sixth equivalent circuit diagram of a shifting register unit provided by an embodiment of the present disclosure.

In some embodiments of the present disclosure, as shown in FIG. 9, the output circuit 200 further includes: a thirteenth transistor T13, wherein a first electrode of the thirteenth transistor T13 is electrically connected with the first node N1, a second electrode of the thirteenth transistor T13 is electrically connected with the third electrode of the tenth transistor T10, and a third electrode of the thirteenth transistor T13 is electrically connected with the first voltage signal terminal V1.

In some embodiments of the present disclosure, the thirteenth transistor T13 is a constantly-conducted transistor, the stability of a signal of the third electrode of the tenth transistor T10 may be guaranteed, the output signal of the shifting register unit is avoided against large deviations, and the stability of the output signal of the shifting register unit may be guaranteed.

In some embodiments of the present disclosure, the transistors may be divided into N-type transistors and P-type transistors according to characteristic differences of the transistors. When the transistors are P-type transistors, a turn-on voltage is a low-level voltage (e.g., 0 V, −5 V, −10 V or other appropriate voltages), and a turn-off voltage is a high-level voltage (e.g., 5 V, 10 V or other appropriate voltages). When the transistors are N-type transistors, a turn-on voltage is a high-level voltage (e.g., 5 V, 10 V or other appropriate voltages), and a turn-off voltage is a low-level voltage (e.g., 0 V, −5 V, −10 V or other appropriate voltages).

In some embodiments of the present disclosure, the first transistor T1 to the thirteenth transistor T13 may all be P-type transistors.

In some embodiments of the present disclosure, the first voltage signal terminal V1 and the third voltage signal terminal V3 provide a low-level signal continuously, and the second voltage signal terminal V2 provides a high-level signal continuously.

In some embodiments of the present disclosure, an amplitude of a voltage signal of the third voltage signal terminal V3 is greater than an amplitude of a voltage signal of the first voltage signal terminal V1.

In some embodiments of the present disclosure, the signal of any one of the reference signal terminal VREF, the first clock signal terminal CK1 and the second clock signal terminal CK2 may be a periodic pulse signal.

In some embodiments of the present disclosure, the signal of any one of the reference signal terminal VREF, the first clock signal terminal CK1 and the second clock signal terminal CK2 may be a clock signal.

In some embodiments of the present disclosure, the signal of the reference signal terminal VREF and the signal of the first clock signal terminal CK1 are inversion signals for each other, or may not be inversion signals for each other. When the signal of the reference signal terminal VREF and the signal of the first clock signal terminal CK1 are inversion signals for each other, the signal of the first clock signal terminal CK1 is an ineffective level signal when the signal of the reference signal terminal VREF is an effective level signal; and the signal of the first clock signal terminal CK1 is an effective level signal when the signal of the reference signal terminal VREF is an ineffective level signal.

In some embodiments of the present disclosure, the signal of the first clock signal terminal CK1 and the signal of the second clock signal terminal CK2 are not effective level signals at the same time. Exemplarily, the signal of the second clock signal terminal CK2 is an ineffective level signal when the signal of the first clock signal terminal CK1 is an effective level signal, and the signal of the first clock signal terminal CK1 is an ineffective level signal when the signal of the second clock signal terminal CK2 is an effective level signal.

In some embodiments of the present disclosure, the signals of the cascaded output terminal OUT1 and the driving output terminal OUT2 may be single-pulse signals, the signal of the cascaded output terminal OUT1 and the signal of the driving output terminal OUT2 may be inversion signals for each other, that is, the signal of the driving output terminal OUT2 is a low-level signal when the signal of the cascaded output terminal OUT1 is a high-level signal, and the signal of the driving output terminal OUT2 is a high-level signal when the signal of the cascaded output terminal OUT1 is a low-level signal.

In some embodiments of the present disclosure, the cascaded output terminal OUT1 is configured to output the cascaded signal which may be a low-level signal, and the driving output terminal OUT2 is configured to output the gate scanning signal which is a high-level signal.

Figure 10:
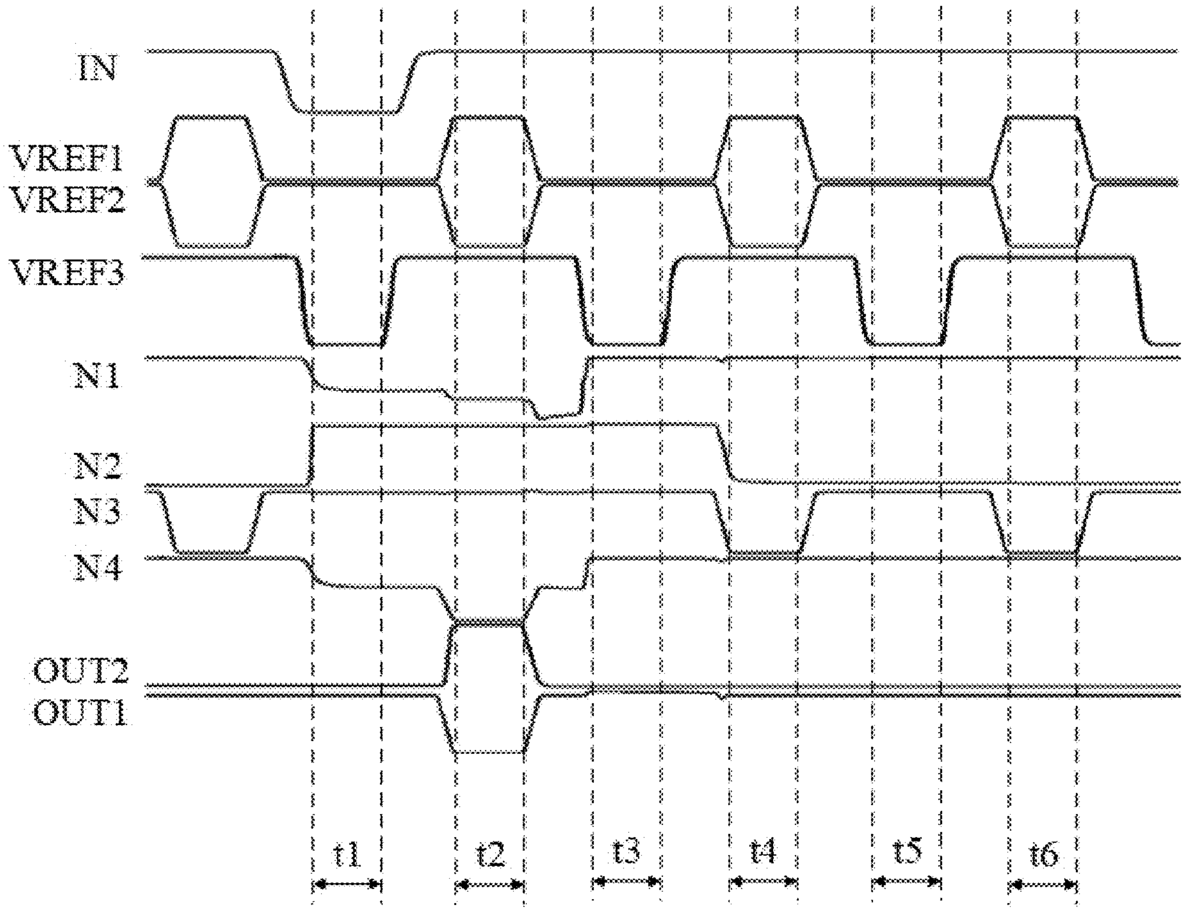
FIG. 10 is a signal time sequence simulation diagram of the shifting register unit provided in FIG. 3 and FIG. 5 to FIG. 9.

FIG. 10 is a signal time sequence simulation diagram of the shifting register unit provided in FIG. 3 and FIG. 5 to FIG. 9. FIG. 10 is illustrated by taking an example that all the transistors in the shifting register unit are P-type transistors. It can be understood that at the moment, the first voltage signal terminal V1 provides a first low-level signal VGL1, the second voltage signal terminal V2 provides a high-level signal VGH, and the third voltage signal terminal V3 provides a second low-level signal VGL2. At the moment, the second low-level signal VGL2 provided by the third voltage signal terminal V3 is lower than the first low-level signal VGL1 provided by the first voltage signal terminal V1.

In some embodiments of the present disclosure, as for the shifting register unit provided in FIG. 3 and FIG. 5 to FIG. 9, as the third electrode of the seventh transistor T7 is electrically connected with a first power source terminal V1, the seventh transistor T7 is conducted continuously.

In conjunction with FIG. 5 and FIG. 10, a working process of controlling the shifting register unit provided in FIG. 5 includes the following stages.

At a first stage t1, namely an input stage, the input signal terminal IN, the reference signal terminal VREF and the second clock signal terminal CK2 provide low-level signals, and the first clock signal terminal CK1 provides a high-level signal. At the moment, the first transistor T1 is conducted, the low-level signal provided by the input signal terminal IN is written into the first node N1, and as the first voltage signal terminal V1 provides the low-level signal VGL1 continuously, the seventh transistor T7 is conducted continuously. At the moment, the low-level signal of the first node N1 is written into the fourth node N4 via the seventh transistor T7, the eighth transistor T8 is conducted, and the high-level signal provided by the first clock signal terminal CK1 is written into the cascaded output terminal OUT1. The low-level signal of the first node N1 is written into the third electrode of the tenth transistor T10 via the thirteenth transistor T13, the tenth transistor T10 is conducted, and the low-level signal provided by the reference signal terminal VREF is written into the driving output terminal OUT2. At the same time, the twelfth transistor T12 is conducted, the second low-level signal VGL2 provided by the third voltage signal terminal V3 is written into the first node N1, and the signal of the first node N1 is maintained as the low-level signal. The third transistor T3 and the fourth transistor T4 are conducted, the high-level signal VGH provided by the second voltage signal terminal V2 is written into the second node N2 and the third node N3 respectively, and at the moment, the second transistor T2, the fifth transistor T5, the ninth transistor T9 and the eleventh transistor T11 are all cut off. The first clock signal terminal CK1 provides a high-level signal, and the sixth transistor T6 is cut off. The first capacitor C1 may couple the high-level signal provided by the first clock signal terminal CK1 to the third node N3, and the second capacitor C2 may maintain a pressure difference between the fourth node N4 and the cascaded output terminal OUT1. At the moment, the cascaded output terminal OUT1 outputs the high-level signal provided by the first clock signal terminal CK1, and the driving output terminal OUT2 outputs the low-level signal provided by the reference signal terminal VREF.

At a second stage t2, namely an output stage, the first clock signal terminal CK1 provides a low-level signal, and the input signal terminal IN, the reference signal terminal VREF and the second clock signal terminal CK2 provide high-level signals. At the moment, the first transistor T1 is cut off, the second capacitor C2 may discharge, and a voltage of the first node N1 is maintained at a low level. As the first voltage signal terminal V1 provides the low-level signal VGL1 continuously, the seventh transistor T7 is conducted continuously. At the moment, the low-level signal of the first node N1 is written into the fourth node N4 via the seventh transistor T7, the eighth transistor T8 is conducted, and the low-level signal provided by the first clock signal terminal CK1 is written into the cascaded output terminal OUT1. The low-level signal of the first node N1 is written into the third electrode of the tenth transistor T10, the tenth transistor T10 is conducted, and the high-level signal provided by the reference signal terminal VREF is written into the driving output terminal OUT2. At the same time, the twelfth transistor T12 is conducted, the second low-level signal VGL2 provided by the third voltage signal terminal V3 is written into the first node N1, and the voltage of the first node N1 is further pulled down, so that the eighth transistor T8 and the tenth transistor T10 are conducted completely. The third transistor T3 and the fourth transistor T4 are conducted, the high-level signal VGH provided by the second voltage signal terminal V2 is written into the second node N2 and the third node N3 respectively, and at the moment, the second transistor T2, the fifth transistor T5, the ninth transistor T9 and the eleventh transistor T11 are all cut off. The third transistor T3 is conducted, the high-level signal VGH provided by the second voltage signal terminal V2 is written into the third node N3, at the moment, the first clock signal terminal CK1 is still coupled to the third node N3 through the first capacitor C1, but at the moment, the voltage of the third node N3 is still controlled by the second voltage signal terminal V2. At the output stage, the cascaded output terminal OUT1 outputs the low-level signal provided by the first clock signal terminal CK1, and the driving output terminal OUT2 outputs the high-level signal provided by the reference signal terminal VREF.

At a third stage t3, the input signal terminal IN and the first clock signal terminal CK1 provide high-level signals, the reference signal terminal VREF provides a low-level signal, and the second clock signal terminal CK2 firstly maintains a high-level signal and then jumps to a low-level signal. At the stage in which the second clock signal terminal CK2 maintains the high-level signal, the first transistor T1 is cut off, the first node N1 is in a floating state, the voltage of the first node N1 at the moment is at a low level, the low-level signal is written into the fourth node N4 via the continuously conducted seventh transistor T7, the eighth transistor T8 and the tenth transistor T10 are conducted, the high-level signal provided by the first clock signal terminal CK1 is written into the cascaded output terminal OUT1, and the low-level signal provided by the reference signal terminal VREF is written into the driving output terminal OUT2. The third transistor T3 and the fourth transistor T4 are conducted, the high-level signal VGH provided by the second voltage signal terminal V2 is written into the second node N2 and the third node N3 respectively, and at the moment, the second transistor T2, the fifth transistor T5, the ninth transistor T9 and the eleventh transistor T11 are all cut off. The first clock signal terminal CK1 provides a high-level signal, and the sixth transistor T6 is cut off. Therefore, at the stage in which the second clock signal terminal CK2 maintains the high-level signal, the cascaded output terminal OUT1 outputs the high-level signal provided by the first clock signal terminal CK1, and the driving output terminal OUT2 outputs the low-level signal provided by the reference signal terminal VREF. When the second clock signal terminal CK2 jumps to the low-level signal, the first transistor T1 is conducted, the high-level signal provided by the input signal terminal IN is written into the first node N1, at the moment, the third transistor T3 and the fourth transistor T4 are cut off, the high-level signal of the first node N1 is written into the fourth node N4 via the continuously conducted seventh transistor T7, and the eighth transistor T8, the tenth transistor T10 and the twelfth transistor T12 are cut off. As the first clock signal terminal CK1 jumps to the high-level signal from the low-level signal, and due to the coupling action of the first capacitor C1, the voltage of the third node N3 is still maintained as the high-level signal, and the second transistor T2 is cut off. The second node N2 is in a floating state, the voltage of the second node N2 at the moment is at a high level, and the fifth transistor T5, the ninth transistor T9 and the eleventh transistor T11 are cut off. Therefore, at the stage in which the second clock signal terminal CK2 jumps to the low-level signal, the cascaded output terminal OUT1 and the driving output terminal OUT2 are both in a floating state, at the moment, the cascaded output terminal OUT1 outputs the high-level signal, and the driving output terminal OUT2 outputs the low-level signal.

At a fourth stage t4, the input signal terminal IN, the reference signal terminal VREF and the second clock signal terminal CK2 provide high-level signals, and the first clock signal terminal CK1 provides a low-level signal. At the moment, the first transistor T1 is cut off, the first node N1 is in a floating state, the voltage of the first node N1 at the moment is at a high level, and the third transistor T3 and the fourth transistor T4 are cut off. The high-level signal of the first node N1 is written into the fourth node N4 via the continuously conducted seventh transistor T7, and the eighth transistor T8, the tenth transistor T10 and the twelfth transistor T12 are cut off. As the first clock signal terminal CK1 jumps to a low level from a high level, and due to the coupling action of the first capacitor C1, at the moment, the voltage of the third node N3 is at the low level, and the second transistor T2 is conducted. The low-level signal provided by the first clock signal terminal CK1 is written into the second node N2 via the second transistor T2, the fifth transistor T5, the ninth transistor T9 and the eleventh transistor T11 are conducted, and at the moment, the sixth transistor T6 is also conducted. The high-level signal VGH provided by the second voltage signal terminal V2 is written into the first node N1 via the fifth transistor T5 and the sixth transistor T6, and written into the cascaded output terminal OUT1 via the ninth transistor T9. The low-level signal VGL1 provided by the first voltage signal terminal V1 is written into the driving output terminal OUT2 via the eleventh transistor T11. At this stage, the cascaded output terminal OUT1 outputs the high-level signal provided by the second voltage signal terminal V2, and the driving output terminal OUT2 outputs the low-level signal provided by the first voltage signal terminal V1.

The working process of the shifting register unit includes: a plurality of third stages t3 and fourth stages t4, and the third stages t3 and the fourth stages t4 work alternately.

The difference between the shifting register unit provided in FIG. 3 and the shifting register unit provided in FIG. 5 is that, the shifting register unit provided in FIG. 5 includes the twelfth transistor T12, while the shifting register unit provided in FIG. 3 has no twelfth transistor T12. In addition, the working process of the shifting register unit provided in FIG. 3 is the same as that of the shifting register unit provided in FIG. 5.

The arrangement of the twelfth transistor T12 in the present disclosure may enable the first node N1 to be pulled down to the signal of the third voltage signal terminal V3 with a lower voltage value, and thus the conducting degree of the eighth transistor T8 and the tenth transistor T10 is improved, and the eighth transistor T8 and the tenth transistor T10 are made to be able to conduct completely.

The difference between the shifting register unit provided in FIG. 6 and the shifting register unit provided in FIG. 5 is that, the third electrodes of the twelfth transistors T12 are connected with different nodes, in FIG. 5, the third electrode of the twelfth transistor T12 is connected with the fourth node N4, and in FIG. 6, the third electrode of the twelfth transistor T12 is connected with the first node N1. As the signals of the first node N1 and the fourth node N4 are the high-level signals at the same time, or the low-level signals at the same time, that is, the twelfth transistors T12 in the shifting register units provided in FIG. 5 and FIG. 6 are conducted at the same time or disconnected at the same time. Therefore, the working process of the shifting register unit provided in FIG. 5 is the same as that of the shifting register unit provided in FIG. 6.

The difference between the shifting register unit provided in FIG. 7 and the shifting register unit provided in FIG. 5 is that, the shifting register unit provided in FIG. 7 further includes: the third capacitor C3, and the third capacitor C3 may be used for maintaining the stability of the signal of the cascaded output terminal OUT1, without other impacts on the working process of the shifting register unit. Therefore, the working process of the shifting register unit provided in FIG. 5 is the same as that of the shifting register unit provided in FIG. 7.

The difference between the shifting register unit provided in FIG. 8 and the shifting register unit provided in FIG. 5 is that, the shifting register unit provided in FIG. 8 further includes: the fourth capacitor C4, and the fourth capacitor C4 may be used for maintaining the stability of the voltage of the second node N2, without other impacts on the working process of the shifting register unit. Therefore, the working process of the shifting register unit provided in FIG. 8 is the same as that of the shifting register unit provided in FIG. 7.

The difference between the shifting register unit provided in FIG. 9 and the shifting register unit provided in FIG. 8 is that, the shifting register unit provided in FIG. 9 further includes: the thirteenth transistor T13, and as the third electrode of the thirteenth transistor T13 is electrically connected with the first voltage signal terminal V1, the thirteenth transistor T13 is conducted continuously. Therefore, the thirteenth transistor T13 may be equivalent to a section of wire, and will not affect the working process of other transistors of the shifting register unit. Therefore, the working process of the shifting register unit provided in FIG. 9 is the same as that of the shifting register unit provided in FIG. 5.

It can be understood that, in some embodiments of the present disclosure, the shifting register unit may include: the first capacitor C1, the second capacitor C2, the third capacitor C3 and the fourth capacitor C4; or may include: the first capacitor C1 and the second capacitor C2; or may include: the first capacitor C1, the second capacitor C2 and the third capacitor C3; or may include: the first capacitor C1, the second capacitor C2 and the fourth capacitor C4. It may be set by those skilled in the art according to actual needs.

Figure 11:
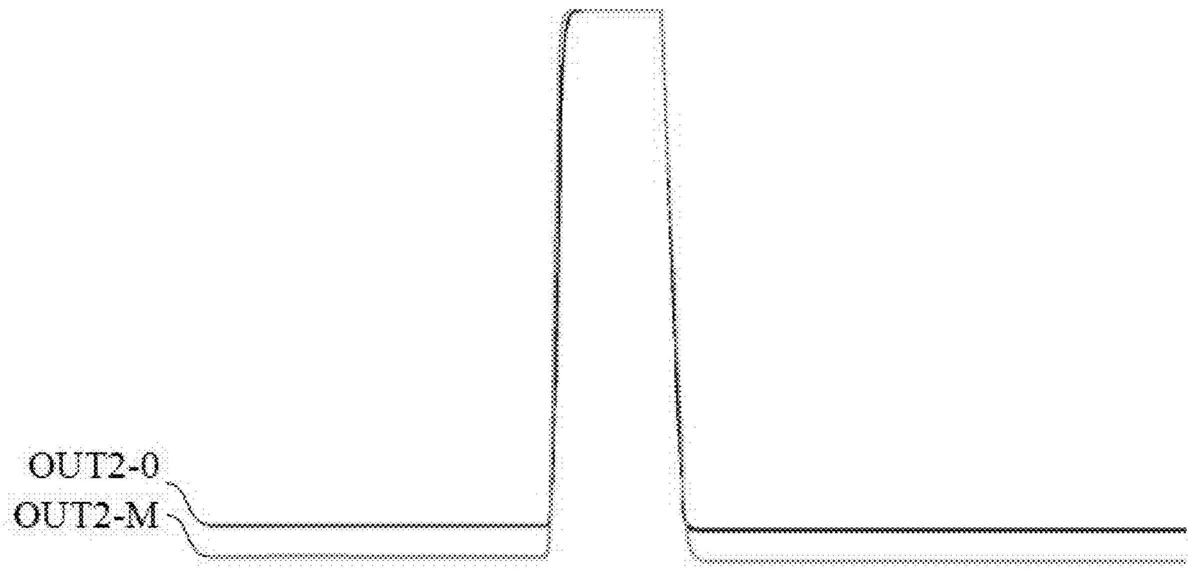
FIG. 11 is a comparison diagram of signals of driving output terminals of different shifting register units.

In FIG. 11, OUT2-0 refers to a signal output by the driving output terminal in the shifting register unit provided in FIG. 3 provided by the present application, and OUT2-M refers to a signal output by the driving output terminal in any shifting register unit in FIG. 5 to FIG. 9 provided by the present application. As shown in FIG. 11, at other working stages except the output stage, a voltage value of the signal OUT2-M is lower than a voltage value of the signal OUT2-0, at the output stage, a duration of a rising edge of the signal OUT2-M is less than a duration of a rising edge of the signal OUT2-0, that is, the shifting register unit provided by part of the embodiments of the present disclosure may pull-down the voltage value of the signal output by the driving output terminal, and the performance of the shifting register unit is improved.

An embodiment of the present disclosure further provides a driving method of a shifting register unit, and the driving method of the shifting register unit is configured to drive the shifting register unit and may include the following steps.

Step 100, an input sub-circuit provides a signal of an input signal terminal to a first node under control of a signal of a second clock signal terminal.

Step 200, a first control sub-circuit controls a voltage of a second node under control of a voltage of the first node and a signal of a first clock signal terminal.

Step 300, a second control sub-circuit provides a signal of a second voltage signal terminal to the first node under control of the voltage of the second node and the signal of the first clock signal terminal.

Step 400, a voltage stabilizing sub-circuit provides the voltage of the first node to a fourth node under control of a signal of a first voltage signal terminal.

Step 500, a cascaded sub-circuit provides the signal of the second voltage signal terminal or the signal of the first clock signal terminal to a cascaded output terminal under control of voltages of the second node and the fourth node.

Step 600, an output circuit provides a signal of a reference signal terminal or the signal of the first voltage signal terminal to a driving output terminal under control of the voltages of the first node and the second node.

The shifting register unit is the shifting register unit provided by any aforementioned embodiment, with the similar implementing principles and implementing effects, which is not repeated here.

In some embodiments of the present disclosure, the shifting register unit may further include a pull-down sub-circuit. The driving method of the shifting register unit may further include: providing, by the pull-down sub-circuit, a signal of a third voltage signal terminal to the first node under control of the voltage of the first node or the fourth node.

Figure 12:
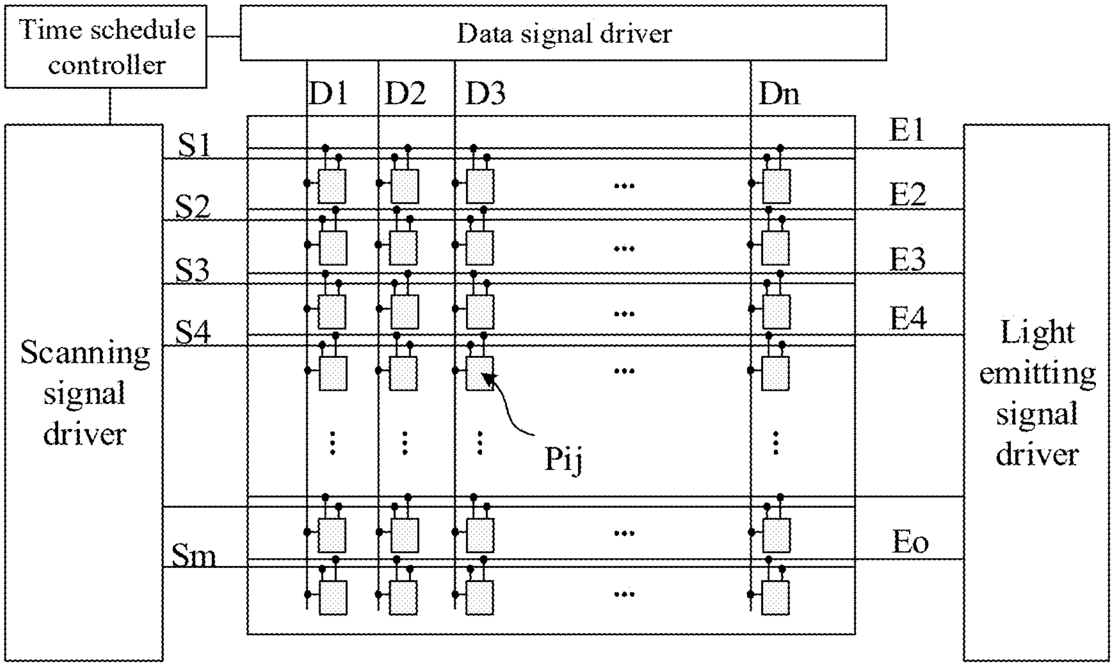
FIG. 12 is a schematic structural diagram of a display apparatus.

An embodiment of the present disclosure further provides a display apparatus. FIG. 12 is a schematic structural diagram of the display apparatus. As shown in FIG. 12, the display apparatus may include a time schedule controller, a data signal driver, a scanning signal driver, a light emitting signal driver and a display substrate. The display substrate includes: pixels distributed in an array. The time schedule controller is connected with the data signal driver, the scanning signal driver and the light emitting signal driver. The data signal driver is connected with a plurality of data signal lines (D1 to Dn). The scanning signal driver is connected with a plurality of scanning signal lines (S1 to Sm). The light emitting signal driver is connected with a plurality of light emitting signal lines (E1 to Eo). The pixel array may include a plurality of sub-pixels Pij, i and j may be natural numbers, at least one sub-pixel Pij may include a circuit unit and a light emitting device connected with the circuit unit, the circuit unit may include a pixel driving circuit, and the pixel driving circuit may be electrically connected with the scanning signal lines, the light emitting signal lines and the data signal lines. In some embodiments of the present disclosure, the time schedule controller may provide gray values and control signals suitable for the specification of the data signal driver to the data signal driver, may provide clock signals, scanning start signals and the like suitable for the specification of the scanning signal driver to the scanning signal driver, and may provide clock signals, emitting stop signals and the like suitable for the specification of the light emitting signal driver to the light emitting signal driver. The data signal driver may produce a data voltage to be provided to the data signal lines D1, D2, D3, . . . and Dn by using the gray values and control signals received from the time schedule controller. For example, the data signal driver may sample the gray values by using clock signals, and apply the data voltage corresponding to the gray values to the data signal lines D1 to Dn with a pixel row as a unit, where n may be a natural number. The scanning signal driver may produce a scanning signal to be provided to the scanning signal lines S1, S2, S3, . . . and Sm through the clock signals, the scanning start signals and the like received from the time schedule controller. For example, the scanning signal driver may provide scanning signals having conducting level pulses to the scanning signal lines S1 to Sm in sequence. For example, the scanning signal driver may be constructed in the form of the shifting register unit, and may transmit the scanning start signals provided in the form of conducting level pulses to the next grade of circuit in sequence under the control of the clock signals, so as to produce the scanning signals, where m may be a natural number. The light emitting signal driver may produce an emitting signal to be provided to the light emitting signal lines E1, E2, E3, . . . and Eo through the clock signals, the emitting stop signals and the like received from the time schedule controller. For example, the light emitting signal driver may provide emitting signals having cut-off level pulses to the light emitting signal lines E1 to Eo in sequence. For example, the light emitting signal driver may be constructed in the form of the shifting register unit, and may transmit the emitting stop signals provided in the form of cut-off level pulses to the next grade of circuit in sequence under the control of the clock signals, so as to produce the emitting signals, where o may be a natural number.

In some embodiments of the present disclosure, the display apparatus may be a liquid crystal display (LCD) or an organic light emitting diode (OLED) display apparatus. The display apparatus may be: a liquid crystal panel, electronic paper, an OLED panel, an active-matrix organic light emitting diode (AMOLED) panel, a mobile phone, a tablet computer, a television, a display, a laptop, a digital photo frame, a navigator and any product or component with a display function.

Figure 13:
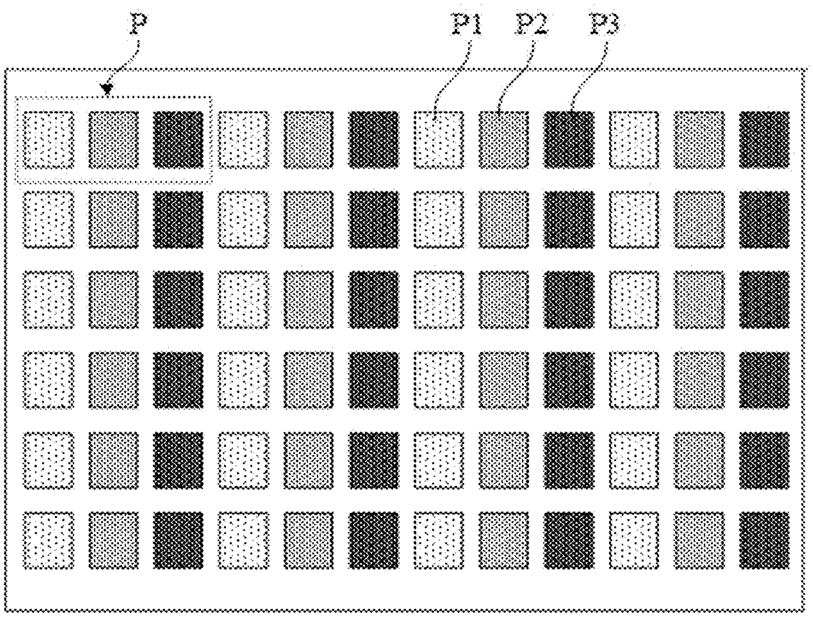
FIG. 13 is a schematic planar structural diagram of a display substrate.

FIG. 13 is a schematic planar structural diagram of a display substrate. As shown in FIG. 13, the display substrate may include a plurality of pixel units P distributed in a matrix, the plurality of pixel units P include first sub-pixels P1 emitting light rays of a first color, second sub-pixels P2 emitting light rays of a second color and at least one third sub-pixel P3 emitting light rays of a third color, and the first sub-pixels P1, the second sub-pixels P2 and the third sub-pixels P3 each include a pixel driving circuit and a light emitting device. The pixel driving circuits in the first sub-pixels P1, the second sub-pixels P2 and the third sub-pixels P3 are electrically connected with the scanning signal lines, the data signal lines and the light emitting signal lines respectively, and the pixel driving circuits are configured to, under the control of the scanning signal lines and the light emitting signal lines, receive the data voltage transmitted by the data signal lines so as to be controlled to output corresponding currents. The light emitting devices in the first sub-pixels P1, the second sub-pixels P2 and the third sub-pixels P3 are electrically connected with the pixel driving circuits of the respective sub-pixels respectively, and the light emitting devices are configured to emit light with corresponding brightness in response to the currents output by the pixel driving circuits of the respective sub-pixels.

In some embodiments of the present disclosure, the first sub-pixels P1 may be red sub-pixels (R) emitting red light rays, the second sub-pixels P2 may be blue sub-pixels (B) emitting blue light rays, and the third sub-pixels P3 may be green sub-pixels (G) emitting green light rays. In some embodiments of the present disclosure, the shapes of the sub-pixels may be rectangles, diamonds, pentagons or hexagons, and three sub-pixels may be arranged in a manner of horizontal side-by-side, vertical side-by-side or a triple, which are not limited here in the present disclosure.

In some embodiments of the present disclosure, one pixel unit may include three sub-pixels, and the three sub-pixels may be arranged in a manner of horizontal side-by-side, vertical side-by-side or a triple, which is not limited here in the present disclosure. FIG. 13 is illustrated by taking an example of the horizontal side-by-side manner.

In some embodiments of the present disclosure, one pixel unit may further include four sub-pixels, and the four sub-pixels may be one first sub-pixel, one second sub-pixel and two third sub-pixels. The four sub-pixels may be arranged in a manner of horizontal side-by-side, vertical side-by-side or a square, which is not limited here in the present disclosure.

In some embodiments of the present disclosure, each light emitting device may be an organic light emitting diode (OLED), including a first electrode (anode), an organic light emitting layer and a second electrode (cathode) arranged in a stacked mode.

In some embodiments of the present disclosure, each organic light emitting layer may include a hole injection layer (HIL), a hole transport layer (HTL), an electron block layer (EBL), an emitting layer (EML), a hole block layer (HBL), an electron transport layer (ETL) and an electron injection layer (EIL) arranged in a stacked mode. In some embodiments of the present disclosure, the hole injection layers of all the sub-pixels may be connected together as a common layer, the electron injection layers of all the sub-pixels may be connected together as a common layer, the hole transport layers of all the sub-pixels may be connected together as a common layer, the electron transport layers of all the sub-pixels may be connected together as a common layer, the hole block layers of all the sub-pixels may be connected together as a common layer, the emitting layers of adjacent sub-pixels may overlap a little, or may be isolated, and the electron block layers of adjacent sub-pixels may overlap a little, or may be isolated.

In some embodiments of the present disclosure, the display substrate is an LTPO display substrate.

Figure 14:
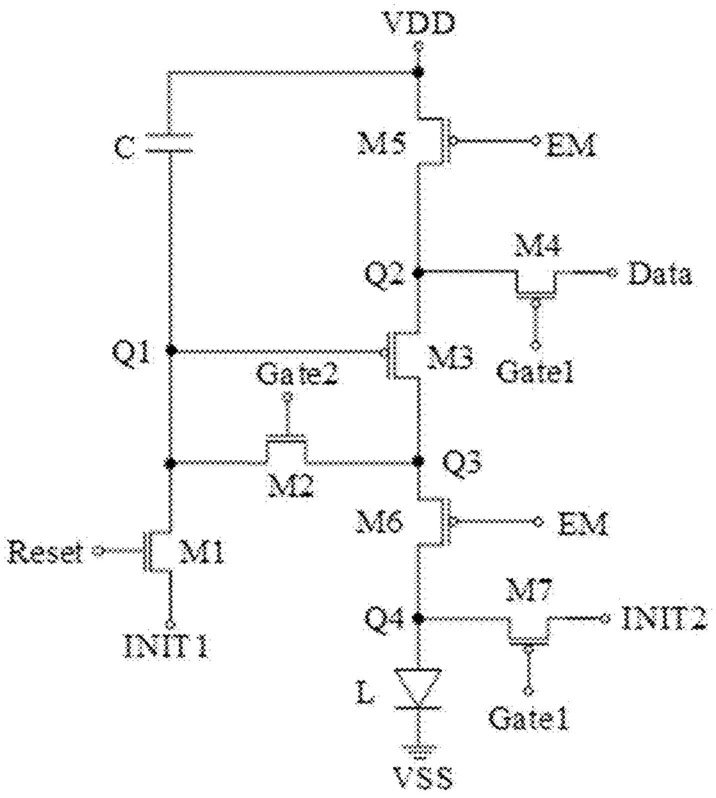
FIG. 14 is a schematic diagram of an equivalent circuit of a pixel driving circuit.

FIG. 14 is a schematic diagram of an equivalent circuit of a pixel driving circuit. In some embodiments of the present disclosure, the pixel driving circuit may be of a structure of 3T1C, 4T1C, 5T1C, 5T2C, 6T1C, 7T1C or 8T1C. As shown in FIG. 14, the pixel driving circuit may include seven transistors (a first transistor M1 to a seventh transistor M7) and one capacitor C.

As shown in FIG. 14, a first electrode of the first transistor M1 is electrically connected with a first initial signal line INIT1, a second electrode of the first transistor M1 is electrically connected with a first node Q1, and a third electrode of the first transistor M1 is electrically connected with a reset signal line Reset. A first electrode of the second transistor M2 is electrically connected with the first node Q1, a second electrode of the second transistor M2 is electrically connected with a third node Q3, and a third electrode of the second transistor M2 is electrically connected with a second scanning signal line Gate2. A first electrode of the third transistor M3 is electrically connected with a second node Q2, a second electrode of the third transistor M3 is electrically connected with the third node Q3, and a third electrode of the third transistor M3 is electrically connected with the first node Q1. A first electrode of the fourth transistor M4 is electrically connected with a data signal line Data, a second electrode of the fourth transistor M4 is electrically connected with the second node Q2, and a third electrode of the fourth transistor M4 is electrically connected with a first scanning signal line Gate1. A first electrode of the fifth transistor M5 is electrically connected with a high-level power line VDD, a second electrode of the fifth transistor M5 is electrically connected with the second node Q2, and a third electrode of the fifth transistor M5 is electrically connected with a light emitting signal line EM. A first electrode of the sixth transistor M6 is electrically connected with the third node Q3, a second electrode of the sixth transistor M6 is electrically connected with a fourth node Q4, and a third electrode of the sixth transistor M6 is electrically connected with the light emitting signal line EM. A first electrode of the seventh transistor M7 is electrically connected with a second initial signal line INIT2, a second electrode of the seventh transistor M7 is electrically connected with the fourth node Q4, and a third electrode of the seventh transistor M7 is electrically connected with the first scanning signal line Gate1. A first electrode plate of the capacitor C is electrically connected with the first node Q1, and a second electrode plate of the capacitor C is electrically connected with the high-level power line VDD.

In some embodiments of the present disclosure, the first transistor M1 to the seventh transistor M7 in the pixel driving circuit may be low temperature poly-silicon thin film transistors, or oxide thin film transistors, or low temperature poly-silicon thin film transistors and oxide thin film transistors at the same time. Active layers of the low temperature poly-silicon thin film transistors adopt low temperature poly-silicon (LTPS), and active layers of the oxide thin film transistors adopt oxide semiconductors. The low temperature poly-silicon thin film transistors have the advantages of high migration rate, fast charging and the like, the oxide thin film transistors have the advantages of low leak current and the like, and by integrating the low temperature poly-silicon thin film transistors and the oxide thin film transistors on one display substrate to form an LTPO display substrate, the advantages of the two may be utilized to achieve low-frequency driving, lower the power consumption and improve the display quality.

In some embodiments of the present disclosure, the first transistor M1 and the second transistor M2 have opposite transistor types to the third transistor M3 to the seventh transistor M7. Exemplarily, the first transistor M1 and the second transistor M2 may be N-type transistors, and the third transistor M3 to the seventh transistor M7 may be P-type transistors.

In some embodiments of the present disclosure, the first transistor M1 and the second transistor M2 may be oxide transistors, and the third transistor M3 to the seventh transistor M7 may be low temperature poly-silicon transistors.

In some embodiments of the present disclosure, a signal of the first initial signal line INIT1 has a constant voltage value and is a direct current signal, and the voltage value of the signal of the first initial signal line INIT1 may be −3 V.

In some embodiments of the present disclosure, a signal of the second initial signal line INIT2 has a constant voltage value and is a direct current signal, and the voltage value of the signal of the second initial signal line INIT2 may be 0 V.

In some embodiments of the present disclosure, a light emitting device L may be electrically connected with the fourth node Q4 and a low-level power line VSS.

In some embodiments of the present disclosure, the high-level power line VDD provides a high-level signal continuously, and the low-level power line VSS provides a low-level signal continuously.

Figure 15:
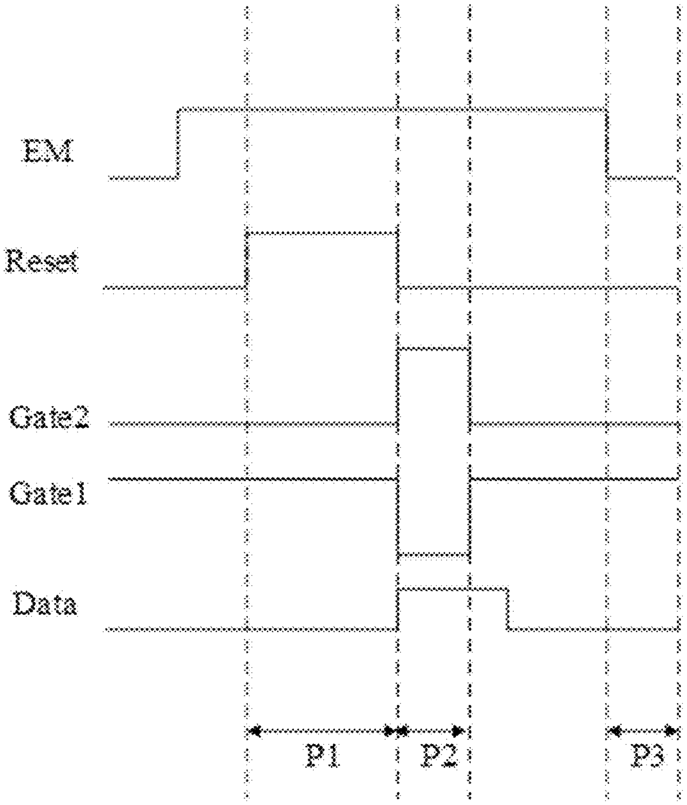
FIG. 15 is a working sequence diagram of the pixel driving circuit corresponding to FIG. 14.

FIG. 15 is a working sequence diagram of the pixel driving circuit corresponding to FIG. 14. An exemplary embodiment of the present disclosure is illustrated below through a working process of the pixel driving circuit exemplified in FIG. 14 at a display stage. FIG. 15 is illustrated by taking an example that the first transistor M1 and the second transistor M2 are N-type transistors and the third transistor M3 to the seventh transistor M7 are P-type transistors. A pixel driving circuit in FIG. 26 includes the first transistor M1 to the seventh transistor M7, one capacitor C and eight signal lines (the data signal line Data, the first scanning signal line Gate1, the second scanning signal line Gate2, the reset signal line Reset, the first initial signal line INIT1, the second initial signal line INIT2, the light emitting signal line EM and the high-level power line VDD).

In conjunction with FIG. 14 and FIG. 15, a working process of the pixel driving circuit may include followings.

A first stage P1, called an initialization stage, a signal of the reset signal line Reset is a high-level signal, the first transistor M1 is conducted, a signal of the first initial signal line INIT1 is written into the first node Q1 through the conducted first transistor M1, the first node Q1 is initialized (i.e., reset), a pre-stored voltage inside the first node is cleared, and then initialization is completed.

A second stage P2, called a data writing stage or a threshold compensation stage, the first scanning signal line Gate1 is a low-level signal, the second scanning signal line Gate2 is a high-level signal, and the data signal line Data outputs a data voltage. At this stage, as the first node Q1 is a low-level signal, the third transistor M3 is conducted. A signal of the first scanning signal line Gate1 is a low-level signal, the fourth transistor M4 is conducted, and the seventh transistor M7 is conducted. A signal of the second scanning signal line Gate2 is a high-level signal, and the second transistor M2 is conducted. The data voltage output by the data signal line Data is provided to the first node Q1 via the conducted fourth transistor M4, the second node Q2, the conducted third transistor M3, the third node Q3 and the conducted second transistor M2, and a difference between the data voltage output by the data signal line Data and a threshold voltage of the third transistor M3 is charged into the capacitor C until a voltage of the first node Q1 is Vd-|Vth|, where Vd is the data voltage output by the data signal line Data, and Vth is the threshold voltage of the third transistor M3. The seventh transistor M7 is conducted, a signal of the second initial signal line INIT2 is written into the fourth node Q4 through the conducted seventh transistor M7, a first electrode of the light emitting device L is initialized (i.e., reset), a pre-stored voltage inside the first electrode is cleared, and then initialization is completed.

A third stage P3, called a light emitting stage, a signal of the light emitting signal line EM is a low-level signal, the fifth transistor M5 and the sixth transistor M6 are conducted, and a power voltage output by the high-level power line VDD provides a driving voltage to the first electrode of the light emitting device L through the conducted fifth transistor M5, third transistor M3 and sixth transistor M6, so as to drive the light emitting device L to emit light.

In a driving process of the pixel driving circuit, a driving current flowing through the third transistor M3 (a driving transistor) is determined by a voltage difference between the third electrode and the first electrode of the third transistor M3. As the voltage of the first node Q1 is Vd−|Vth|, the driving current of the third transistor M3 is:

$$I = K*(Vgs - Vth)2 = K*[(Vdd - Vd + |Vth|) - Vth]2 = K*(Vdd - Vd)2.$$

In the formula, I is the driving current flowing through the third transistor M3, namely a driving current for driving the light emitting device L, K is a constant, Vgs is the voltage difference between the third electrode and the first electrode of the third transistor M3, Vth is the threshold voltage of the third transistor M3, Vd is the data voltage output by the data signal line Data, and Vdd is the power voltage output by the high-level power line VDD.

The display substrate provided by the embodiment of the present disclosure may include: a base substrate as well as sub-pixels, a gate line and a gate driving circuit arranged on the base substrate. A display region and a non-display region are arranged on the base substrate, the gate driving circuit is located at the non-display region, the sub-pixels and the gate line are located at the display region, and the gate line is electrically connected with the sub-pixels and the gate driving circuit.

In some embodiments of the present disclosure, the sub-pixels include: a pixel driving circuit and a light emitting device. When the pixel driving circuit is the pixel driving circuit provided in FIG. 14, the gate line may include: at least one of a reset signal line, a first scanning signal line, a second scanning signal line and a light emitting signal line.

Figure 16:
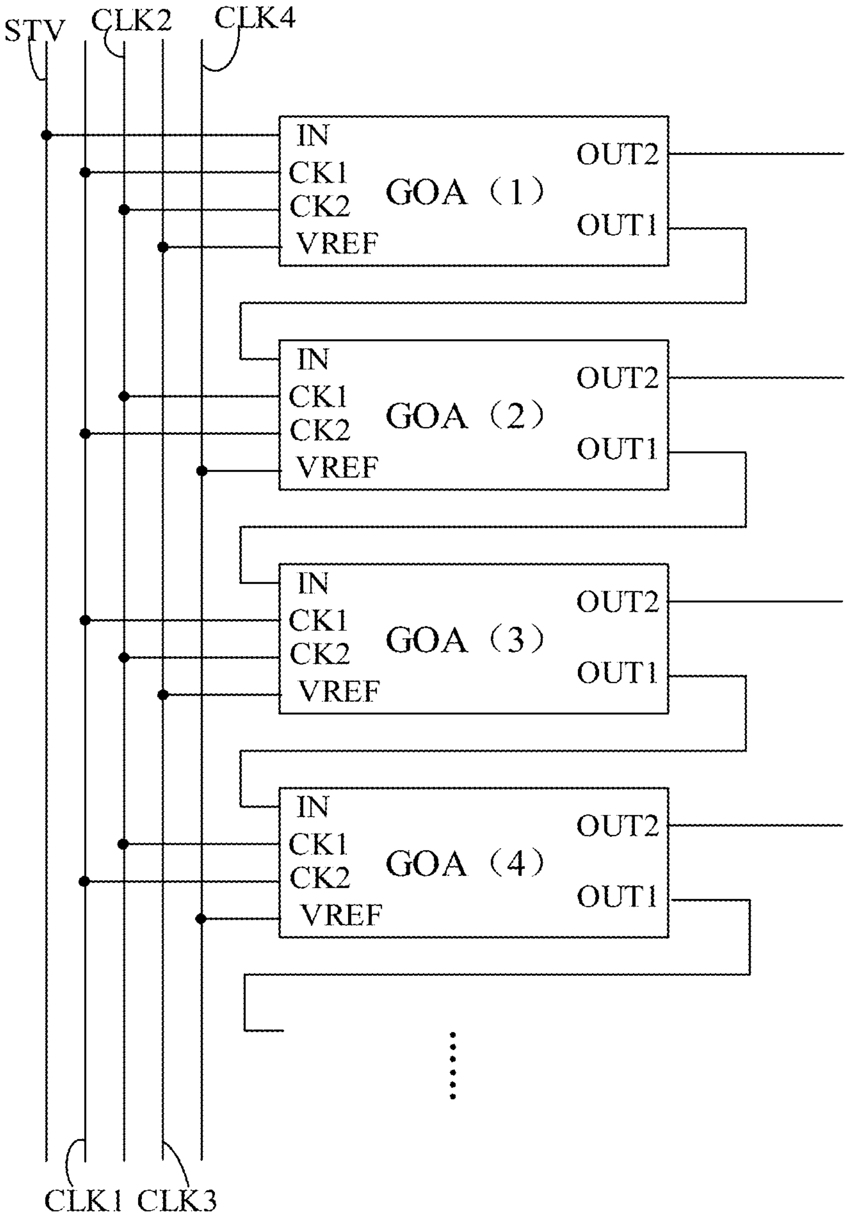
FIG. 16 is a schematic cascade diagram of a gate driving circuit of a display apparatus.

FIG. 16 is a schematic cascade diagram of the gate driving circuit. As shown in FIG. 16, a cascaded output terminal OUT1 of an $i^{th}$ grade shifting register unit GOA(i) is connected with a signal input terminal IN of an $(i+1)^{th}$ grade shifting register unit GOA(i+1), 1≤i<N, and N is a total grade number of shifting register units.

In some embodiments of the present disclosure, as shown in FIG. 16, clock signals are input into second clock signal terminals CK2 and first clock signal terminals CK1 of a plurality of shifting register units respectively through a first clock signal line CLK1 and a second clock signal line CLK2.

In some embodiments of the present disclosure, as shown in FIG. 16, clock signals are input into reference signal terminals VREF of the plurality of shifting register units respectively through a third clock signal line CLK3 and a fourth clock signal line CLK4.

In some embodiments of the present disclosure, as shown in FIG. 16, driving output terminals OUT2 of the shifting register units may be electrically connected with gate lines.

In some embodiments of the present disclosure, as shown in FIG. 16, a second clock signal terminal CK2 of the $i^{th}$ grade shifting register unit is electrically connected with one of the first clock signal line CLK1 and the second clock signal line CLK2, and a first clock signal terminal CK1 of the $i^{th}$ grade shifting register unit is electrically connected with the other one of the first clock signal line CLK1 and the second clock signal line CLK2; and the second clock signal terminals of adjacent shifting register units are connected with different signal lines, and the first clock signal terminals of the adjacent shifting register units are connected with different signal lines. Exemplarily, the second clock signal terminals CK2 of the shifting register units of odd grades may be electrically connected with the first clock signal line CLK1, the first clock signal terminals CK1 of the shifting register units of odd grades may be electrically connected with the second clock signal line CLK2, the second clock signal terminals CK2 of the shifting register units of even grades may be electrically connected with the second clock signal line CLK2, and the first clock signal terminals CK1 of the shifting register units of even grades may be electrically connected with the first clock signal line CLK1; or, the second clock signal terminals CK2 of the shifting register units of odd grades may be electrically connected with the second clock signal line CLK2, the first clock signal terminals CK1 of the shifting register units of odd grades may be electrically connected with the first clock signal line CLK1, the second clock signal terminals CK2 of the shifting register units of even grades may be electrically connected with the first clock signal line CLK1, and the first clock signal terminals CK1 of the shifting register units of even grades may be electrically connected with the second clock signal line CLK2. FIG. 16 is illustrated by taking an example that the second clock signal terminals CK2 of the shifting register units of odd grades are electrically connected with the first clock signal line CLK1, the first clock signal terminals CK1 of the shifting register units of odd grades are electrically connected with the second clock signal line CLK2, the second clock signal terminals CK2 of the shifting register units of even grades are electrically connected with the second clock signal line CLK2, and the first clock signal terminals CK1 of the shifting register units of even grades are electrically connected with the first clock signal line CLK1.

In some embodiments of the present disclosure, as shown in FIG. 16, a reference signal terminal VREF of the $i^{th}$ grade shifting register unit is electrically connected with one of the third clock signal line CLK3 and the fourth clock signal line CLK4, and a reference signal terminal VREF of the $(i+1)^{th}$ grade shifting register unit is electrically connected with the other one of the third clock signal line CLK3 and the fourth clock signal line CLK4. Exemplarily, the reference signal terminals VREF of the shifting register units of odd grades are electrically connected with the third clock signal line CLK3, and the reference signal terminals VREF of the shifting register units of even grades are electrically connected with the fourth clock signal line CLK4; or, the reference signal terminals VREF of the shifting register units of odd grades are electrically connected with the fourth clock signal line CLK4, and the reference signal terminals VREF of the shifting register units of even grades are electrically connected with the third clock signal line CLK3. FIG. 16 is illustrated by taking an example that the reference signal terminals VREF of the shifting register units of odd grades are electrically connected with the third clock signal line CLK3, and the reference signal terminals VREF of the shifting register units of even grades are electrically connected with the fourth clock signal line CLK4.

In some embodiments of the present disclosure, the base substrate may be a rigid base substrate or a flexible base substrate, wherein the rigid base substrate may be, but not limited to, one or more of glass and conductive foil; and the flexible base substrate may be, but not limited to, one or more of polyethylene terephthalate, ethylene terephthalate, polyether ether ketone, polystyrene, polycarbonate, polyarylate, polyaryl ester, polyimide, polyvinyl chloride, polyethylene, and textile fibers.

In some embodiments of the present disclosure, the flexible base substrate may include a first flexible material layer, a first inorganic material layer, a semiconductor layer, a second flexible material layer and a second inorganic material layer arranged in a stacked mode. The first and second flexible material layers may be made of materials such as polyimide (PI), polyethylene terephthalate (PET), or surface-treated polymer soft films, the first and second inorganic material layers may be made of silicon nitride (SiNx) or silicon oxide (SiOx), and thus the water and oxygen resistance of the base substrate is improved. The first and second inorganic material layers are also known as barrier layers, and the semiconductor layer may be made of amorphous silicon (a-si). In some embodiments of the present disclosure, taking a stacked structure PI1/Barrier1/a-si/PI2/Barrier2 as an example, a preparation process may include: first coating a glass carrier plate with a layer of polyimide, and forming a first flexible (PI1) layer after curing to form a film; subsequently, depositing a barrier thin film on the first flexible layer to form a first barrier (Barrier1) layer covering the first flexible layer; then depositing a layer of amorphous silicon thin film on the first barrier layer to form an amorphous silicon (a-si) layer covering the first barrier layer; then coating the amorphous silicon layer with another layer of polyimide, and forming a second flexible (PI2) layer after curing to form a film; and then depositing a layer of barrier thin film on the second flexible layer to form a second barrier (Barrier2) layer covering the second flexible layer, thereby completing the preparation of the base substrate.

Figure 17:
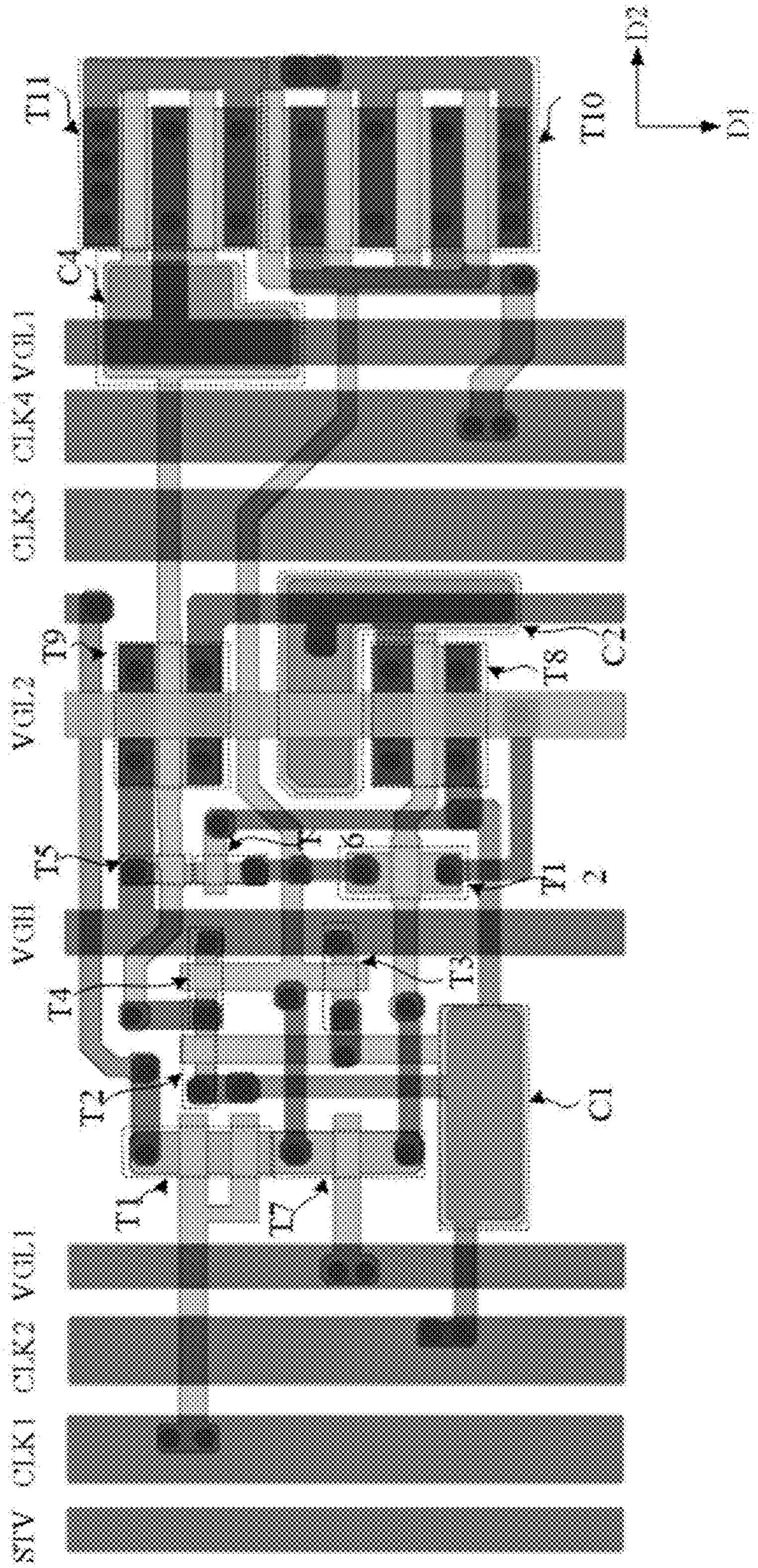
FIG. 17 is a schematic layout structure diagram of a shifting register unit provided by an embodiment of the present disclosure.

In some embodiments of the present disclosure, FIG. 17 is a schematic structural diagram of a display substrate. FIG. 17 is illustrated by taking the shifting register unit provided in FIG. 8 as an example. As shown in FIG. 16 to FIG. 17, the display substrate may further include: an input signal line STV, a first clock signal line CLK1, a second clock signal line CLK2, a first voltage signal line VGL1, a second voltage signal line VGH and a third voltage signal line VGL2, which are arranged on the base substrate and located at a non-display region. At least one first voltage signal line VGL1 is provided.

In some embodiments of the present disclosure, an input signal terminal IN of a first grade shifting register unit GOA(1) is electrically connected with the input signal line STV, a first voltage signal terminal V1 of an $i^{th}$ grade shifting register unit is electrically connected with the first voltage signal line VGL1, a second voltage signal terminal V2 of the $i^{th}$ grade shifting register unit is electrically connected with the second voltage signal line VGH, and a third voltage signal terminal V3 of the $i^{th}$ grade shifting register unit is electrically connected with the third voltage signal line VGL2.

In some embodiments of the present disclosure, any one of the input signal line STV, the first clock signal line CLK1, the second clock signal line CLK2, the first voltage signal line VGL1, the second voltage signal line VGH and the third voltage signal line VGL2 extends in a first direction D1, gate lines extend in a second direction D2, and the first direction D1 and the second direction D2 intersect.

In some embodiments of the present disclosure, as shown in FIG. 17, the input signal line STV, the first clock signal line CLK1, the second clock signal line CLK2 and the first voltage signal line VGL1 are distributed sequentially in a direction close to a display region, and are located on a side of the shifting register units away from the display region.

In some embodiments of the present disclosure, as shown in FIG. 17, the shifting register unit includes: a plurality of transistors, and the second voltage signal line VGH is located on a side of the first voltage signal line VGL1 close to the display region, and is located among the plurality of transistors of the shifting register unit.

In some embodiments of the present disclosure, as shown in FIG. 17, the third voltage signal line VGL2 is located on a side of the second voltage signal line VGH close to the display region, and its orthographic projection on the base substrate partially overlaps an orthographic projection of the shifting register unit on the base substrate.

In some embodiments of the present disclosure, as shown in FIG. 17, the shifting register unit includes: a first transistor T1, a second transistor T2, a third transistor T3, a fourth transistor T4, a seventh transistor T7 and a first capacitor C1. At least part of any transistor or capacitor in the first transistor T1, the second transistor T2, the third transistor T3, the fourth transistor T4, the seventh transistor T7 and the first capacitor C1 is located between the first voltage signal line VGL1 and the second voltage signal line VGH.

In some embodiments of the present disclosure, as shown in FIG. 17, the shifting register unit includes: a fifth transistor T5, a sixth transistor T6, an eighth transistor T8, a ninth transistor T9, a twelfth transistor T12 and a second capacitor C2. At least part of any transistor or capacitor in the fifth transistor T5, the sixth transistor T6, the eighth transistor T8, the ninth transistor T9, the twelfth transistor T12 and the second capacitor C2 is located on a side of the second voltage signal line VGH close to the display region.

In some embodiments of the present disclosure, as shown in FIG. 17, an orthographic projection of the third voltage signal line VGL2 on the base substrate partially overlaps orthographic projections of the eighth transistor T8, the ninth transistor T9 and the second capacitor C2 on the base substrate.

In some embodiments of the present disclosure, as shown in FIG. 17, the display substrate may further include: a third clock signal line CLK3 and a fourth clock signal line CLK4, which are arranged on the base substrate and located at the non-display region, and any one of the third clock signal line CLK3 and the fourth clock signal line CLK4 extends in the first direction D1.

In some embodiments of the present disclosure, as shown in FIG. 17, the number of the first voltage signal lines VGL1 is two, the first voltage signal line VGL1 close to the display region is located on a side of any one of the third clock signal line CLK3 and the fourth clock signal line CLK4 close to the display region, and the first voltage signal line VGL1 away from the display region is located on a side of any one of the first clock signal line CLK1 and the second clock signal line CLK2 close to the display region, and is located on a side of the second voltage signal line VGH away from the display region.

In some embodiments of the present disclosure, as shown in FIG. 17, the shifting register unit further includes: a tenth transistor T10, an eleventh transistor T11 and a fourth capacitor C4. At least part of any transistor or capacitor in the tenth transistor T10, the eleventh transistor T11 and the fourth capacitor C4 is located on a side, close to the display region, of the first voltage signal line VGL1 close to the display region.

In some embodiments of the present disclosure, as shown in FIG. 17, an orthographic projection of the first voltage signal line VGL1 close to the display region on the base substrate partially overlaps an orthographic projection of the fourth capacitor C4 on the base substrate.

In some embodiments of the present disclosure, as shown in FIG. 17, an active layer T121 of the twelfth transistor T12 extends in the first direction D1, any one of a first electrode and a second electrode of the twelfth transistor T12 extends in the second direction D2, and a third electrode T82 of the twelfth transistor T12 at least partially extends in the second direction D2.

In some embodiments of the present disclosure, as shown in FIG. 17, a width of any one of the two first voltage signal lines VGL1, the second voltage signal line VGH and the third voltage signal line VGL2 in the second direction D2 is less than a width of any one of the first clock signal line CLK1, the second clock signal line CLK2, the third clock signal line CLK3 and the fourth clock signal line CLK4 in the second direction D2.

In some embodiments of the present disclosure, as signals of the clock signal lines are alternating current signals, a greater width of any one of the first clock signal line CLK1, the second clock signal line CLK2, the third clock signal line CLK3 and the fourth clock signal line CLK4 in the second direction D2 may effectively lower loads on the signal lines.

In some embodiments of the present disclosure, a channel width of an active layer of the tenth transistor T10 is greater than a channel width of an active layer of the eighth transistor T8.

In some embodiments of the present disclosure, the channel width of the active layer of the tenth transistor T10 is not less than 90 microns. Exemplarily, the channel width of the active layer of the tenth transistor T10 may be about 100 microns.

In some embodiments of the present disclosure, the channel length of the active layer of the tenth transistor T10 may be about 3.5 microns, and a width to length ratio of channels of the active layer of the tenth transistor T10 may be about 100/3.5.

In some embodiments of the present disclosure, the channel width of the active layer of the eighth transistor T8 is not greater than 50 microns. Exemplarily, the channel width of the active layer of the eighth transistor T8 may be about 25 microns.

In some embodiments of the present disclosure, the channel length of the active layer of the eighth transistor T8 may be about 3.5 microns, and a width to length ratio of channels of the active layer of the eighth transistor T8 may be about 25/3.5.

In some embodiments of the present disclosure, a channel width of an active layer of the eleventh transistor T11 is greater than a channel width of an active layer of the fifth transistor.

In some embodiments of the present disclosure, the channel width of the active layer of the eleventh transistor T11 is not less than 90 microns. Exemplarily, the channel width of the active layer of the eleventh transistor T11 may be about 100 microns.

In some embodiments of the present disclosure, the channel length of the active layer of the eleventh transistor T11 may be about 3.5 microns, and a width to length ratio of channels of the active layer of the eleventh transistor T11 may be about 100/3.5.

In some embodiments of the present disclosure, a channel width of an active layer of the ninth transistor T9 is not greater than 50 microns. Exemplarily, the channel width of the active layer of the ninth transistor T9 may be about 25 microns.

In some embodiments of the present disclosure, the channel length of the active layer of the ninth transistor T9 may be about 3.5 microns, and a width to length ratio of channels of the active layer of the ninth transistor T9 may be about 25/3.5.

In some embodiments of the present disclosure, the display substrate may further include: a driving structure layer arranged on the base substrate. The driving structure layer includes: a semiconductor layer, a first conductive layer, a second conductive layer, a third conductive layer and a fourth conductive layer sequentially arranged on the base substrate in a stacked mode. Each shifting register unit includes: a plurality of transistors and a plurality of capacitors, and any of the capacitors includes: a first electrode plate and a second electrode plate.

The semiconductor layer at least includes: active layers of the plurality of transistors located on at least one shifting register unit.

The first conductive layer at least includes: third electrodes of the plurality of transistors and the first electrode plates of the plurality of capacitors located on at least one shifting register unit.

The second conductive layer at least includes: the second electrode plates of the plurality of capacitors located on at least one shifting register unit.

The third conductive layer at least includes: an initial signal line, a first clock signal line, a second clock signal line, a first power line, a second power line, a third clock signal line, a fourth clock signal line as well as first electrodes and second electrodes of the plurality of transistors located on at least one shifting register unit.

The fourth conductive layer at least includes: a third power line.

In some embodiments of the present disclosure, the driving structure layer may further include: a first insulating layer, a second insulating layer, a third insulating layer, a fourth insulating layer, a fifth insulating layer and a flat layer, wherein the first insulating layer is located between the semiconductor layer and the first conductive layer, the second insulating layer is located between the first conductive layer and the second conductive layer, the third insulating layer is located between the second conductive layer and the third conductive layer, the fourth insulating layer is located between the third conductive layer and the fourth conductive layer, the fifth insulating layer is located on a side of the fourth conductive layer away from the base substrate, and the flat layer is located on a side of the fifth insulating layer away from the base substrate.

Exemplary illustration is performed below through a preparation process of the display substrate. A "patterning process" referred to in the present disclosure includes treatments such as photoresist coating, mask exposure, development, etching, and photoresist stripping for metal materials, inorganic materials, or transparent conductive materials, and treatments such as coating of organic materials, mask exposure, and development for organic materials. Deposition may adopt any one or more of sputtering, evaporation, and chemical vapor deposition, coating may adopt any one or more of spraying, spin coating, and ink-jet printing, and etching may adopt any one or more of dry etching and wet etching, which are not limited in the present disclosure. A "thin film" refers to a layer of thin film made by depositing, coating, or other processes for a certain material on a base substrate. If the "thin film" does not require the patterning process throughout the entire manufacturing procedure, it may also be referred to as a "layer". If the "thin film" requires the patterning process throughout the entire manufacturing procedure, it is called a "thin film" before the patterning process and a "layer" after the patterning process. The layer subjected to the patterning process contains at least one "pattern". "Arranging A and B at the same layer" referred to in the present disclosure refers to the simultaneous formation of A and B through the same patterning process, and a "thickness" of a film layer is a dimension of the film layer in a direction perpendicular to the display substrate. In an exemplary embodiment of the present disclosure, "an orthographic projection of B being located within a range of an orthographic projection of A" or "an orthographic projection of A containing an orthographic projection of B" refers to that a boundary of the orthographic projection of B falls into a boundary range of the orthographic projection of A, or a boundary of the orthographic projection of A overlaps the boundary of the orthographic projection of B.

Figure 18:
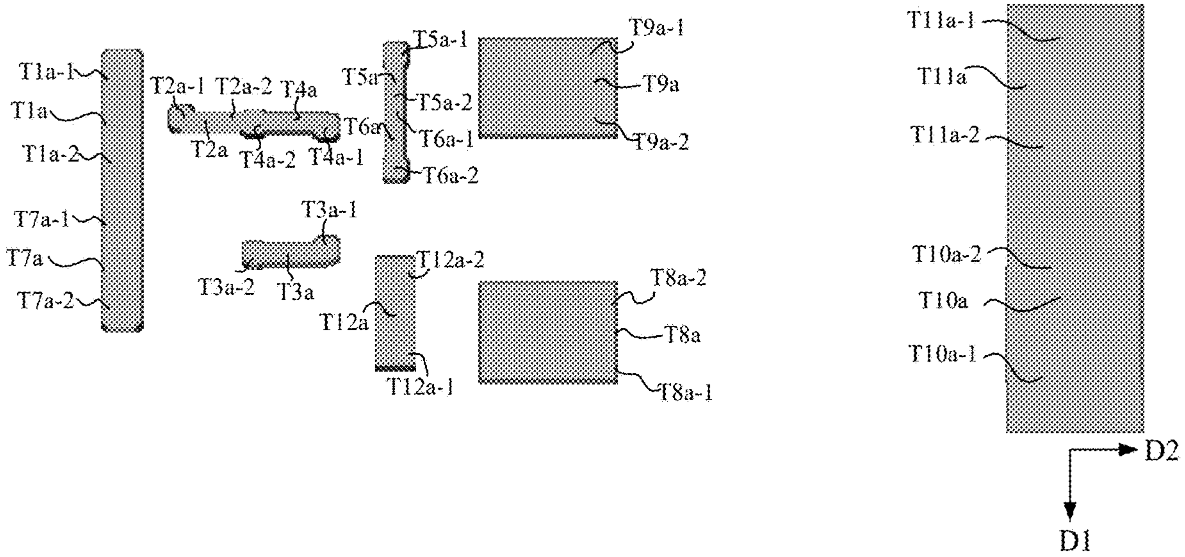
FIG. 18 is a schematic structural diagram of FIG. 17 after a semiconductor layer pattern is formed.

A first step, a semiconductor layer pattern is formed on a base substrate, including: depositing a semiconductor thin film on the base substrate, and patterning the semiconductor thin film through a patterning process to form the semiconductor layer pattern. As shown in FIG. 18, FIG. 18 is a schematic diagram of FIG. 17 after the semiconductor layer pattern is formed.

In some embodiments of the present disclosure, as shown in FIG. 18, the semiconductor layer may include: an active layer T1*a* of a first transistor to an active layer T12*a* of a twelfth transistor located on at least one shifting register unit.

In some embodiments of the present disclosure, as shown in FIG. 18, the active layer T1*a* of the first transistor and an active layer T7*a* of a seventh transistor are of an integrally formed structure; an active layer T2*a* of a second transistor and an active layer T4*a* of a fourth transistor are of an integrally formed structure; an active layer T5*a* of a fifth transistor and an active layer T6*a* of a sixth transistor are of an integrally formed structure; and an active layer T10*a* of a tenth transistor and an active layer T11*a* of an eleventh transistor are of an integrally formed structure. An active layer T3*a* of a third transistor, an active layer T8*a* of an eighth transistor, an active layer T9*a* of a ninth transistor and the active layer T12*a* of the twelfth transistor may be arranged separately.

In some embodiments of the present disclosure, as shown in FIG. 18, the active layer T1*a* of the first transistor (also the active layer T7*a* of the seventh transistor) is located on a side away from the display region, the active layer T2*a* of the second transistor (also the active layer T4*a* of the fourth transistor) is located on a side of the active layer T1*a* of the first transistor close to the display region, the active layer T3*a* of the third transistor is located on the side of the active layer T1*a* of the first transistor close to the display region, and the active layer T3*a* of the third transistor is located on a side of the active layer T2*a* of the second transistor (also the active layer T4*a* of the fourth transistor) of the present grade shifting register unit close to the next grade shifting register unit. The active layer T5*a* of the fifth transistor (also the active layer T6*a* of the sixth transistor) and the active layer T12*a* of the twelfth transistor are distributed in the first direction D1, and are located on a side of the active layer T2*a* of the second transistor (also the active layer T4*a* of the fourth transistor) close to the display region. The active layer T9*a* of the ninth transistor and the active layer T8*a* of the eighth transistor are distributed in the first direction D1, and are located on a side of the active layer T5*a* of the fifth transistor (also the active layer T6*a* of the sixth transistor) close to the display region. The active layer T9*a* of the ninth transistor of the present grade shifting register unit is located on a side of the active layer T8*a* of the eighth transistor of the present grade shifting register unit close to the last grade shifting register unit. The active layer T10*a* of the tenth transistor (also the active layer T11*a* of the eleventh transistor) is located on a side of the active layer T8*a* of the eighth transistor close to the display region.

In some embodiments of the present disclosure, as shown in FIG. 18, the active layer T1*a* of the first transistor (also the active layer T7*a* of the seventh transistor), the active layer T5*a* of the fifth transistor (also the active layer T6*a* of the sixth transistor), the active layer T12*a* of the twelfth transistor, the active layer T8*a* of the eighth transistor, the active layer T9*a* of the ninth transistor and the active layer T10*a* of the tenth transistor (also the active layer T11*a* of the eleventh transistor) are all in a strip shape and extend in the first direction D1. The active layer T2*a* of the second transistor (also the active layer T4*a* of the fourth transistor) and the active layer T3*a* of the third transistor are both in a strip shape and extend in the second direction D2.

In some embodiments of the present disclosure, as shown in FIG. 18, the active layer of each transistor may include a first region, a second region, and a channel region located between the first region and the second region. The first regions and the second regions will become conductors after the first conductive layer is formed subsequently, so they are also referred to as conductive regions. In some embodiments of the present disclosure, a second region T1*a*-2 of the active layer T1*a* of the first transistor may be used as a first region T7a-1 of the active layer T7a of the seventh transistor at the same time, a second region T2a-2 of the active layer T2a of the second transistor may be used as a second region T4a-2 of the active layer T4a of the fourth transistor at the same time, a second region T5a-2 of the active layer T5a of the fifth transistor may be used as a first region T6a-1 of the active layer T6a of the sixth transistor at the same time, and a second region T10a-2 of the active layer T10a of the tenth transistor may be used as a second region T11a-2 of the active layer T11a of the eleventh transistor at the same time. A first region T1a-1 of the active layer T1a of the first transistor, a first region T2a-1 of the active layer T2a of the second transistor, a first region T3a-1 of the active layer T3a of the third transistor, a second region T3a-2 of the active layer T3a of the third transistor, a first region T4a-1 of the active layer T4a of the fourth transistor, a first region T5a-1 of the active layer T5a of the fifth transistor, a second region T6a-2 of the active layer T6a of the sixth transistor, a second region T7a-2 of the active layer T7a of the seventh transistor, a first region T8a-1 of the active layer T8a of the eighth transistor, a second region T8a-2 of the active layer T8a of the eighth transistor, a first region T9a-1 of the active layer T9a of the ninth transistor, a second region T9a-2 of the active layer T9a of the ninth transistor, a first region T10a-1 of the active layer T10a of the tenth transistor, and a first region T11a-1 of the active layer T11a of the eleventh transistor may be arranged separately.

Figure 19:
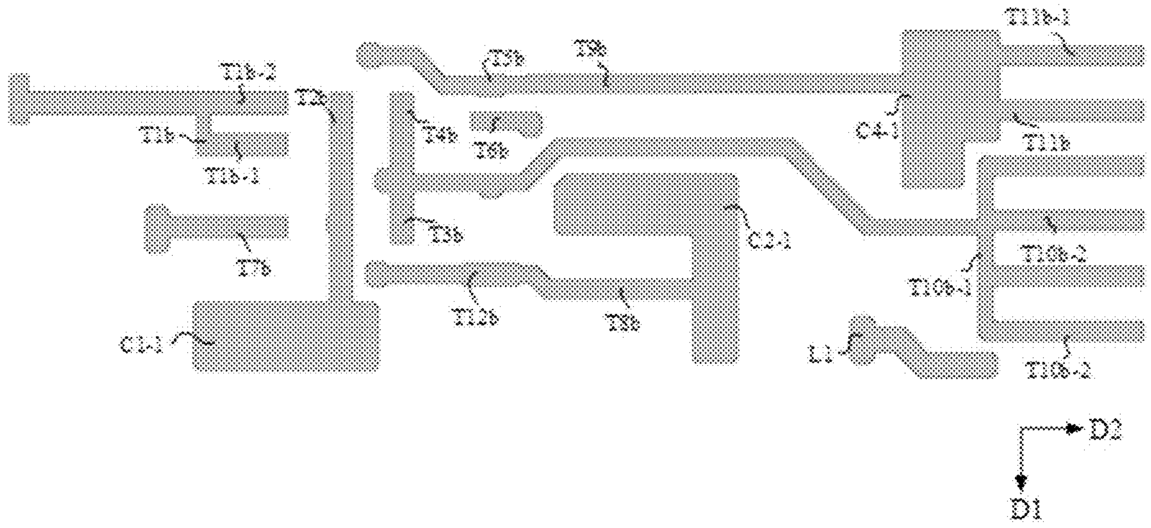
FIG. 19 is a schematic structural diagram of a first conductive layer pattern in FIG. 17.
Figure 20:
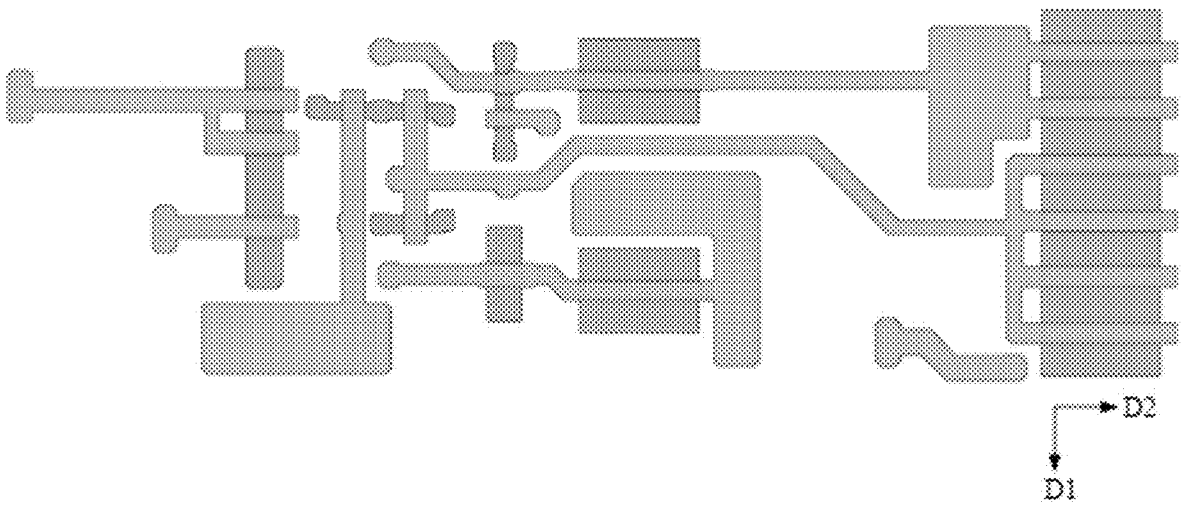
FIG. 20 is a schematic structural diagram of FIG. 17 after the first conductive layer pattern is formed.

A second step, a first conductive layer pattern is formed, including: depositing a first insulating thin film and a first conductive thin film on the base substrate where the aforementioned pattern is formed, and patterning the first insulating thin film and the first conductive thin film through a patterning process to form a first insulating layer pattern and the first conductive pattern arranged on the first insulating layer pattern. As shown in FIG. 19 and FIG. 20, FIG. 19 is a schematic diagram of the first conductive layer pattern in FIG. 17, and FIG. 20 is a schematic diagram of FIG. 17 after the first conductive layer pattern is formed. In some embodiments of the present disclosure, the first conductive layer may be referred to as a first gate metal (GATE1) layer.

In some embodiments of the present disclosure, as shown in FIG. 19 and FIG. 20, the first conductive layer pattern may include: a third electrode T1b of the first transistor to a third electrode T12b of the twelfth transistor, a first electrode plate C1-1 of a first capacitor, a first electrode plate C2-1 of a second capacitor, a first electrode plate C4-1 of a fourth capacitor and a first connecting part L1, which are located on at least one grade of shifting register unit.

In some embodiments of the present disclosure, as shown in FIG. 19 and FIG. 20, a third electrode T2b of the second transistor and the first electrode plate C1-1 of the first capacitor are of an integrally formed structure. A third electrode T3b of the third transistor, a third electrode T4b of the fourth transistor and a third electrode T10b of the tenth transistor are of an integrally formed structure. A third electrode T5b of the fifth transistor, a third electrode T9b of the ninth transistor, a third electrode T11b of the eleventh transistor and the first electrode plate C4-1 of the fourth capacitor are of an integrally formed structure. A third electrode T8b of the eighth transistor, the third electrode T12b of the twelfth transistor and the first electrode plate C2-1 of the second capacitor are of an integrally formed structure. The third electrode T1b of the first transistor, a third electrode T6b of the sixth transistor, a third electrode T7b of the seventh transistor and the first connecting part L1 may be arranged separately.

In some embodiments of the present disclosure, as shown in FIG. 19 and FIG. 20, the third electrode T1b of the first transistor includes: a first third-electrode part T1b-1 and a second third-electrode part T1b-2. The first third-electrode part T1b-1 of the first transistor is in an "L" shape, the second third-electrode part T1b-2 of the first transistor extends in the second direction D2, and the first third-electrode part T1b-1 of the first transistor is connected with the middle of the second third-electrode part T1b-2 of the first transistor.

In some embodiments of the present disclosure, as shown in FIG. 19 and FIG. 20, the first electrode plate C1-1 of the first capacitor may be in a square shape, and the third electrode T2b of the second transistor may be in a strip shape and extends in the first direction D1. The third electrode T2b of the second transistor is located on a side of the first electrode plate C1-1 of the first capacitor close to the last grade shifting register unit.

In some embodiments of the present disclosure, as shown in FIG. 19 and FIG. 20, the first electrode plate C2-1 of the second capacitor may be in a "˥" shape, the third electrode T8b of the eighth transistor and the third electrode T12b of the twelfth transistor may be in a strip shape and extend in the second direction D2, an end part of the third electrode T8b of the eighth transistor is connected with the middle of the first electrode plate C2-1 of the second capacitor extending in the first direction D1, and the third electrode T12b of the twelfth transistor is located on a side of the third electrode T8b of the eighth transistor away from the display region.

In some embodiments of the present disclosure, as shown in FIG. 19 and FIG. 20, the first electrode plate C4-1 of the fourth capacitor may be in a square shape and extends in the first direction D1, the third electrode T11b of the eleventh transistor includes: a plurality of first branch sections T11b-1, and the plurality of first branch sections T11b-1 extend in the second direction D2 and are distributed in the first direction D1. The third electrode T9b of the ninth transistor is located on a side of the first electrode plate C4-1 of the fourth capacitor away from the display region, and the third electrode T5b of the fifth transistor is located on a side of the third electrode T9b of the ninth transistor away from the display region. FIG. 19 and FIG. 20 are illustrated by taking an example that the third electrode T11b of the eleventh transistor contains two first branch sections T11b-1.

In some embodiments of the present disclosure, as shown in FIG. 19 and FIG. 20, the third electrode T10b of the tenth transistor includes: a first connection section T10b-1 and a plurality of second branch sections T10b-2. The first connection section T10b-1 extends in the first direction D1, and the plurality of second branch sections T10b-2 extend in the second direction D2 and are distributed in the first direction D1. The first connection section T10b-1 is equivalent to a "comb back", and the plurality of second branch sections T10b-2 are equivalent to "comb teeth". FIG. 19 and FIG. 20 are illustrated by taking an example that the third electrode T10b of the tenth transistor contains four second branch sections T10b-2. The third electrode T3b of the third transistor and the third electrode T4b of the fourth transistor are located on a side of the third electrode T10b of the tenth transistor away from the display region, the third electrode T3b of the third transistor is located on a side of the third electrode T4b of the fourth transistor close to the next grade shifting register unit, and the third electrode T3b of the third transistor and the third electrode T4b of the fourth transistor at least partially extend in the first direction D1.

In some embodiments of the present disclosure, as shown in FIG. 19 and FIG. 20, the third electrode T6*b* of the sixth transistor, the third electrode T7*b* of the seventh transistor and the first connecting part L1 may be in a strip shape and at least partially extend in the second direction D2.

In some embodiments of the present disclosure, as shown in FIG. 19 and FIG. 20, the first third-electrode part T1*b*-1 and the second third-electrode part T1*b*-2 of the third electrode T1*b* of the first transistor are arranged across the active layer T1*a* of the first transistor; the third electrode T2*b* of the second transistor is arranged across the active layer T2*a* of the second transistor; the third electrode T3*b* of the third transistor is arranged across the active layer T3*a* of the third transistor; the third electrode T4*b* of the fourth transistor is arranged across the active layer T4*a* of the fourth transistor; the third electrode T5*b* of the fifth transistor is arranged across the active layer T5*a* of the fifth transistor; the third electrode T6*b* of the sixth transistor is arranged across the active layer T6*a* of the sixth transistor; the third electrode T7*b* of the seventh transistor is arranged across the active layer T7*a* of the seventh transistor; the third electrode T8*b* of the eighth transistor is arranged across the active layer T8*a* of the eighth transistor; the third electrode T9*b* of the ninth transistor is arranged across the active layer T9*a* of the ninth transistor; a plurality of second branch sections T10*b*-2 of the third electrode T10*b* of the tenth transistor is arranged across the active layer T10*a* of the tenth transistor; and a plurality of first branch sections T11*b*-1 of the third electrode T11*b* of the eleventh transistor is arranged across the active layer T11*a* of the eleventh transistor. That is to say, the extending direction of the third electrode of at least one transistor intersects with (is perpendicular to) the extending direction of the active layer thereof.

In some embodiments of the present disclosure, this process further includes conductor treatment. The conductor treatment is that, after the first conductive layer is formed, semiconductor layers corresponding to regions shielded by the third electrodes of the plurality of transistors (i.e., regions where the semiconductor layers and the third electrodes overlap) are used as channel regions of the transistors, a semiconductor layer not shielded by the first conductive layer is treated to be a conductor layer, and electrode connecting parts of the transistors are formed.

Figure 21:
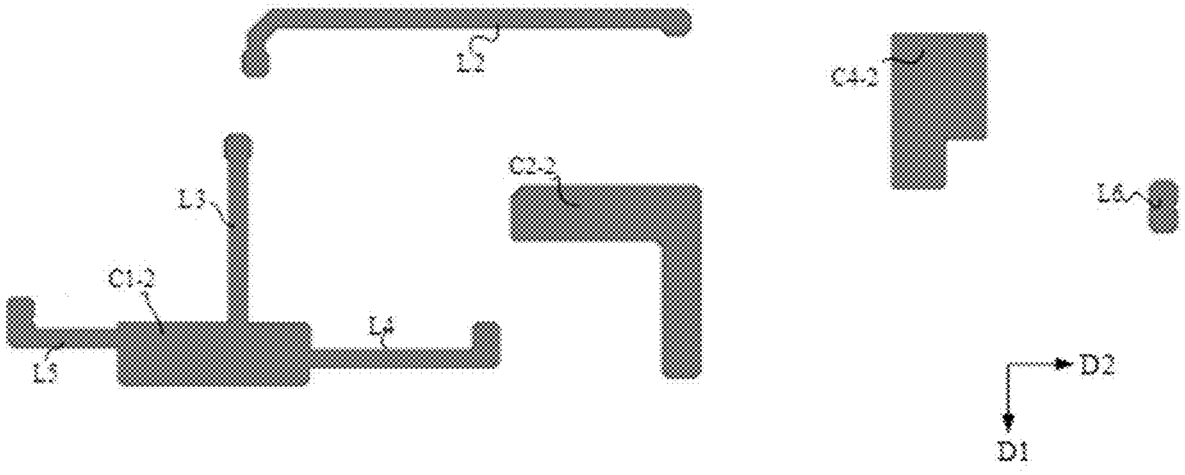
FIG. 21 is a schematic structural diagram of a second conductive layer pattern in FIG. 17.
Figure 22:
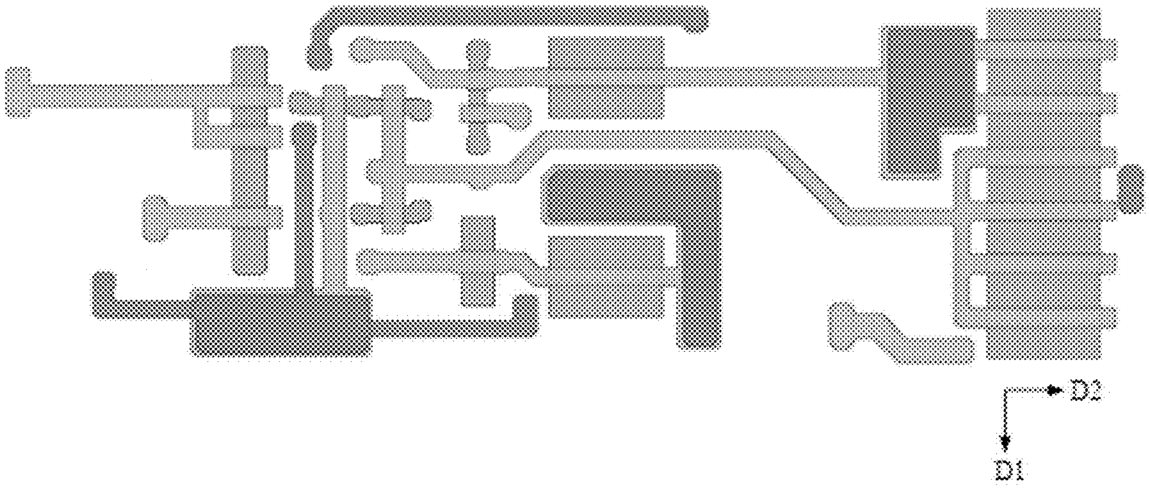
FIG. 22 is a schematic structural diagram of FIG. 17 after the second conductive layer pattern is formed.

A third step, a second conductive layer pattern is formed, including: depositing a second insulating thin film and a second conductive thin film on the base substrate where the aforementioned patterns are formed, and patterning the second insulating thin film and the second conductive thin film through a patterning process to form a second insulating layer pattern and the second conductive layer pattern located on the second insulating layer pattern. As shown in FIG. 21 and FIG. 22, FIG. 21 is a schematic diagram of the second conductive layer pattern in FIG. 17, and FIG. 22 is a schematic diagram of FIG. 17 after the second conductive layer pattern is formed. In some embodiments of the present disclosure, the second conductive layer may be referred to as a second gate metal (GATE2) layer.

In some embodiments of the present disclosure, as shown in FIG. 21 and FIG. 22, the second conductive layer pattern may include: a second electrode plate C1-2 of the first capacitor, a second electrode plate C2-2 of the second capacitor, a second electrode plate C4-2 of the fourth capacitor, a second connecting part L2, a third connecting part L3, a fourth connecting part L4, a fifth connecting part L5 and a sixth connecting part L6, which are located on at least one grade of shifting register unit.

In some embodiments of the present disclosure, as shown in FIG. 21 and FIG. 22, the second electrode plate C1-2 of the first capacitor, the third connecting part L3, the fourth connecting part L4 and the fifth connecting part L5 may be of an integrally formed structure. The second electrode plate C2-2 of the second capacitor, the second electrode plate C4-2 of the fourth capacitor, the second connecting part L2 and the sixth connecting part L6 may be arranged separately.

In some embodiments of the present disclosure, as shown in FIG. 21 and FIG. 22, the second electrode plate C1-2 of the first capacitor may be in a square shape, and its orthographic projection on the base substrate at least partially overlaps the orthographic projection of the first electrode plate C1-1 of the first capacitor on the base substrate.

In some embodiments of the present disclosure, as shown in FIG. 21 and FIG. 22, the second electrode plate C2-2 of the second capacitor may be in a "⅂" shape, and its orthographic projection on the base substrate at least partially overlaps the orthographic projection of the first electrode plate C2-1 of the second capacitor on the base substrate.

In some embodiments of the present disclosure, as shown in FIG. 21 and FIG. 22, the second electrode plate C4-2 of the fourth capacitor may be in a square shape, and its orthographic projection on the base substrate at least partially overlaps the orthographic projection of the first electrode plate C4-1 of the fourth capacitor on the base substrate.

In some embodiments of the present disclosure, as shown in FIG. 21 and FIG. 22, the second connecting part L2, the fourth connecting part L4 and the fifth connecting part L5 may be in a strip shape and at least partially extend in the second direction D2. The third connecting part L3 and the sixth connecting part L6 may be in a strip shape and at least partially extend in the first direction D1.

A fourth step, a third insulating layer pattern is formed, including: depositing a third insulating thin film on the base substrate where the aforementioned patterns are formed, and performing composition on the third insulating thin film through a patterning process to form the third insulating layer pattern covering the aforementioned structure. A plurality of via hole patterns are formed in the third insulating layer, as shown in FIG. 23 and FIG. 24, FIG. 23 is a schematic diagram of a first via hole pattern in FIG. 17, and FIG. 24 is a schematic diagram of FIG. 17 after the third insulating layer pattern is formed.

Figure 23:
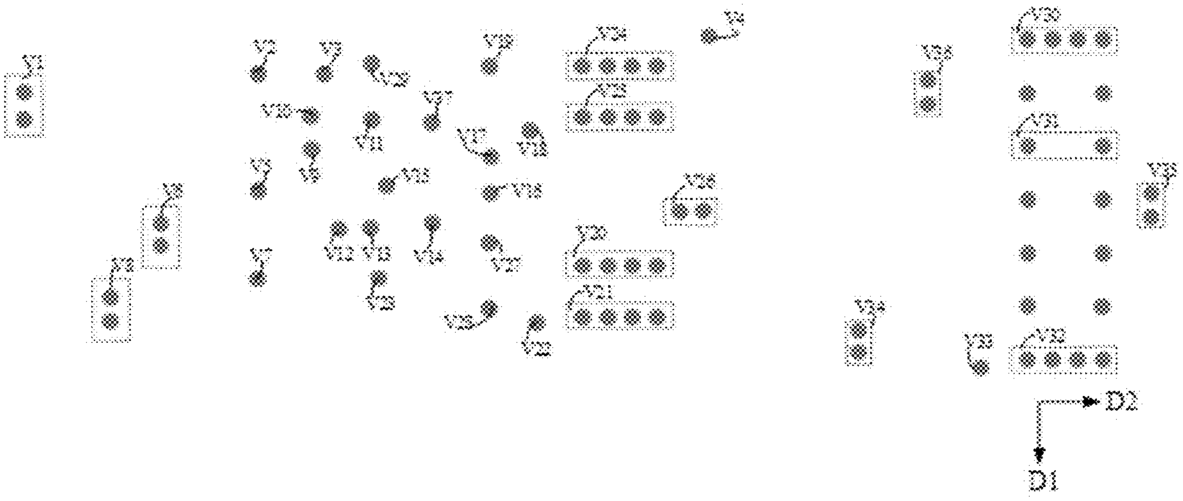
FIG. 23 is a schematic structural diagram of a third insulating layer pattern in FIG. 17.
Figure 24:
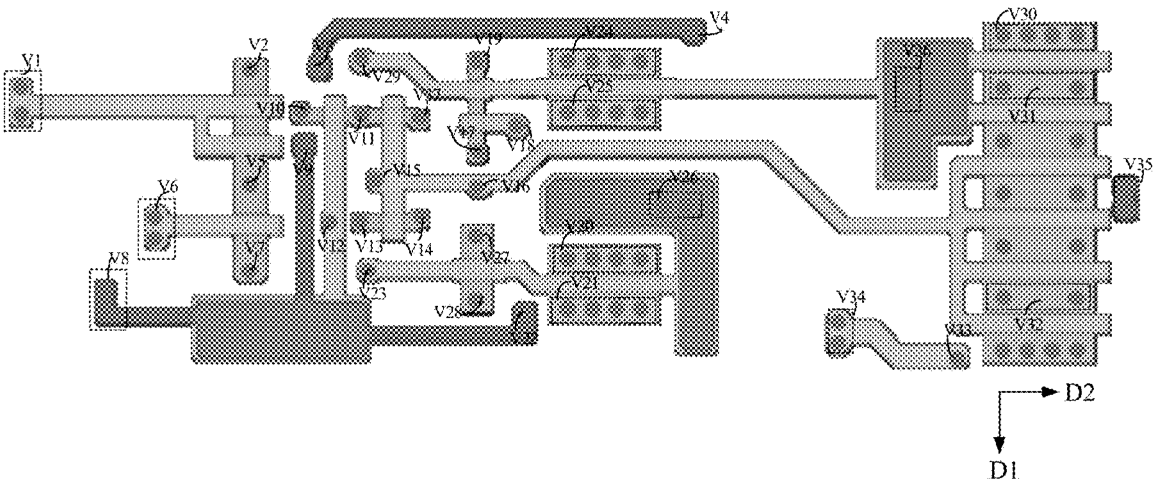
FIG. 24 is a schematic structural diagram of FIG. 17 after the third insulating layer pattern is formed.

In some embodiments of the present disclosure, as shown in FIG. 23 and FIG. 24, the plurality of via hole patterns may include: a first via hole V1 to a thirty-seventh via hole V37.

In some embodiments of the present disclosure, as shown in FIG. 23 and FIG. 24, an orthographic projection of the first via hole V1 on the base substrate is located within a range of the orthographic projection of the third electrode of the first transistor on the base substrate, and the second insulating layer below the first via hole V1 is etched to expose a surface of the third electrode of the first transistor. The first via hole V1 is configured to make one of the first clock signal line and the second clock signal line formed by a subsequent process electrically connected with the third electrode of the first transistor.

In some embodiments of the present disclosure, as shown in FIG. 23 and FIG. 24, an orthographic projection of the second via hole V2 on the base substrate is located within a range of an orthographic projection of the first region of the active layer of the first transistor on the base substrate, and the first insulating layer and the second insulating layer below the second via hole V2 are etched to expose a surface of the first region of the active layer of the first transistor. The second via hole V2 is configured to make the first electrode of the first transistor formed by a subsequent process electrically connected with the first region of the active layer of the first transistor through the via hole.

In some embodiments of the present disclosure, as shown in FIG. 23 and FIG. 24, an orthographic projection of the third via hole V3 on the base substrate is located within a range of an orthographic projection of the second connecting part L2 on the base substrate, and the third via hole V3 exposes a surface of the second connecting part L2. The third via hole V3 is configured to make the first electrode of the first transistor of the present grade shifting register unit formed by a subsequent process electrically connected with the second connecting part L2.

In some embodiments of the present disclosure, as shown in FIG. 23 and FIG. 24, an orthographic projection of the fourth via hole V4 on the base substrate is located within the range of the orthographic projection of the second connecting part L2 on the base substrate, and the fourth via hole V4 exposes the surface of the second connecting part L2. The fourth via hole V4 is configured to make the second electrode of the eighth transistor (also the second electrode of the ninth transistor) of the last grade shifting register unit formed by a subsequent process electrically connected with the second connecting part L2 through the via hole.

In some embodiments of the present disclosure, as shown in FIG. 23 and FIG. 24, an orthographic projection of the fifth via hole V5 on the base substrate is located within a range of an orthographic projection of the second region of the active layer of the first transistor on the base substrate, and the first insulating layer and the second insulating layer below the fifth via hole V5 are etched to expose a surface of the second region of the active layer of the first transistor. The fifth via hole V5 is configured to make the second electrode of the first transistor (also the first electrode of the seventh transistor) formed by a subsequent process electrically connected with the second region of the active layer of the first transistor through the via hole.

In some embodiments of the present disclosure, as shown in FIG. 23 and FIG. 24, an orthographic projection of the sixth via hole V6 on the base substrate is located within a range of an orthographic projection of the third electrode of the seventh transistor on the base substrate, and the second insulating layer below the sixth via hole V6 is etched to expose a surface of the third electrode of the seventh transistor. The sixth via hole V6 is configured to make the first voltage signal line formed by a subsequent process electrically connected with the third electrode of the seventh transistor.

In some embodiments of the present disclosure, as shown in FIG. 23 and FIG. 24, an orthographic projection of the seventh via hole V7 on the base substrate is located within a range of an orthographic projection of the second region of the active layer of the seventh transistor on the base substrate, and the first insulating layer and the second insulating layer below the seventh via hole V7 are etched to expose a surface of the second region of the active layer of the seventh transistor. The seventh via hole V7 is configured to make the second electrode of the seventh transistor formed by a subsequent process electrically connected with the second region of the active layer of the seventh transistor through the via hole.

In some embodiments of the present disclosure, as shown in FIG. 23 and FIG. 24, an orthographic projection of the eighth via hole V8 on the base substrate is located within a range of an orthographic projection of the fifth connecting part L5 on the base substrate, and the eighth via hole V8 exposes a surface of the fifth connecting part L5. The eighth via hole V8 is configured to make the other one of the first clock signal line and the second clock signal line formed by the subsequent process electrically connected with the second electrode plate of the first capacitor.

In some embodiments of the present disclosure, as shown in FIG. 23 and FIG. 24, an orthographic projection of the ninth via hole V9 on the base substrate is located within a range of an orthographic projection of the third connecting part L3 on the base substrate, and the ninth via hole V9 exposes a surface of the third connecting part L3. The ninth via hole V9 is configured to make the first electrode of the second transistor formed by a subsequent process electrically connected with the second electrode plate of the first capacitor.

In some embodiments of the present disclosure, as shown in FIG. 23 and FIG. 24, an orthographic projection of the tenth via hole V10 on the base substrate is located within a range of an orthographic projection of the first region of the active layer of the second transistor on the base substrate, and the first insulating layer and the second insulating layer below the tenth via hole V10 are etched to expose a surface of the first region of the active layer of the second transistor. The tenth via hole V10 is configured to make the first electrode of the second transistor formed by a subsequent process electrically connected with the first region of the active layer of the second transistor through the via hole.

In some embodiments of the present disclosure, as shown in FIG. 23 and FIG. 24, an orthographic projection of the eleventh via hole V11 on the base substrate is located within a range of an orthographic projection of the second region of the active layer of the second transistor on the base substrate, and the first insulating layer and the second insulating layer below the eleventh via hole V11 are etched to expose a surface of the second region of the active layer of the second transistor. The eleventh via hole V11 is configured to make the second electrode of the second transistor (also the second electrode of the fourth transistor) formed by a subsequent process electrically connected with the second region of the active layer of the second transistor through the via hole.

In some embodiments of the present disclosure, as shown in FIG. 23 and FIG. 24, an orthographic projection of the twelfth via hole V12 on the base substrate is located within a range of an orthographic projection of the third electrode of the second transistor on the base substrate, and the second insulating layer below the twelfth via hole V12 is etched to expose a surface of the third electrode of the second transistor. The twelfth via hole V12 is configured to make the second electrode of the third transistor formed by a subsequent process electrically connected with the third electrode of the second transistor (also the first electrode plate of the first capacitor).

In some embodiments of the present disclosure, as shown in FIG. 23 and FIG. 24, an orthographic projection of the thirteenth via hole V13 on the base substrate is located within a range of an orthographic projection of the second region of the active layer of the third transistor on the base substrate, and the first insulating layer and the second insulating layer below the thirteenth via hole V13 are etched to expose a surface of the second region of the active layer of the third transistor. The thirteenth via hole V13 is configured to make the second electrode of the third transistor formed by a subsequent process electrically connected with the second region of the active layer of the third transistor through the via hole.

In some embodiments of the present disclosure, as shown in FIG. 23 and FIG. 24, an orthographic projection of the fourteenth via hole V14 on the base substrate is located within a range of an orthographic projection of the first region of the active layer of the third transistor on the base substrate, and the first insulating layer and the second insulating layer below the fourteenth via hole V14 are etched to expose a surface of the first region of the active layer of the third transistor. The fourteenth via hole V14 is configured to make the first electrode of the third transistor formed by a subsequent process electrically connected with the first region of the active layer of the third transistor through the via hole.

In some embodiments of the present disclosure, as shown in FIG. 23 and FIG. 24, an orthographic projection of the fifteenth via hole V15 on the base substrate is located within a range of an orthographic projection of the third electrode of the third transistor on the base substrate, and the second insulating layer below the fifteenth via hole V15 is etched to expose a surface of the third electrode of the third transistor. The fifteenth via hole V15 is configured to make the first electrode of the seventh transistor formed by a subsequent process electrically connected with the third electrode of the third transistor (also the third electrode of the fourth transistor) through the via hole.

In some embodiments of the present disclosure, as shown in FIG. 23 and FIG. 24, an orthographic projection of the sixteenth via hole V16 on the base substrate is located within the range of the orthographic projection of the third electrode of the third transistor on the base substrate, and the second insulating layer below the sixteenth via hole V16 is etched to expose the surface of the third electrode of the third transistor. The sixteenth via hole V16 is configured to make the second electrode of the sixth transistor formed by a subsequent process electrically connected with the third electrode of the third transistor (also the third electrode of the fourth transistor) through the via hole. At the same time, the sixteenth via hole V16 is further configured to make the second electrode of the twelfth transistor formed by a subsequent process electrically connected with the third electrode of the third transistor (also the third electrode of the fourth transistor) through the via hole.

In some embodiments of the present disclosure, as shown in FIG. 23 and FIG. 24, an orthographic projection of the seventeenth via hole V17 on the base substrate is located within a range of an orthographic projection of the second region of the active layer of the sixth transistor on the base substrate, and the first insulating layer and the second insulating layer below the seventeenth via hole V17 are etched to expose a surface of the second region of the active layer of the sixth transistor. The seventeenth via hole V17 is configured to make the second electrode of the sixth transistor formed by a subsequent process electrically connected with the second region of the active layer of the sixth transistor through the via hole.

In some embodiments of the present disclosure, as shown in FIG. 23 and FIG. 24, an orthographic projection of the eighteenth via hole V18 on the base substrate is located within a range of an orthographic projection of the third electrode of the sixth transistor on the base substrate, and the second insulating layer below the eighteenth via hole V18 is etched to expose a surface of the third electrode of the sixth transistor. The eighteenth via hole V18 is configured to make the first electrode of the eighth transistor formed by a subsequent process electrically connected with the third electrode of the sixth transistor.

In some embodiments of the present disclosure, as shown in FIG. 23 and FIG. 24, an orthographic projection of the nineteenth via hole V19 on the base substrate is located within a range of an orthographic projection of the first region of the active layer of the fifth transistor on the base substrate, and the first insulating layer and the second insulating layer below the nineteenth via hole V19 are etched to expose a surface of the first region of the active layer of the fifth transistor. The nineteenth via hole V19 is configured to make the first electrode of the fifth transistor formed by a subsequent process electrically connected with the first region of the active layer of the fifth transistor through the via hole.

In some embodiments of the present disclosure, as shown in FIG. 23 and FIG. 24, an orthographic projection of the twentieth via hole V20 on the base substrate is located within a range of an orthographic projection of the second region of the active layer of the eighth transistor on the base substrate, and the first insulating layer and the second insulating layer below the twentieth via hole V20 are etched to expose a surface of the second region of the active layer of the eighth transistor. The twentieth via hole V20 is configured to make the second electrode of the eighth transistor formed by a subsequent process electrically connected with the second region of the active layer of the eighth transistor through the via hole.

In some embodiments of the present disclosure, as shown in FIG. 23 and FIG. 24, an orthographic projection of the twenty-first via hole V21 on the base substrate is located within a range of an orthographic projection of the first region of the active layer of the eighth transistor on the base substrate, and the first insulating layer and the second insulating layer below the twenty-first via hole V21 are etched to expose a surface of the first region of the active layer of the eighth transistor. The twenty-first via hole V21 is configured to make the first electrode of the eighth transistor formed by a subsequent process electrically connected with the first region of the active layer of the eighth transistor through the via hole.

In some embodiments of the present disclosure, as shown in FIG. 23 and FIG. 24, an orthographic projection of the twenty-second via hole V22 on the base substrate is located within a range of an orthographic projection of the fourth connecting part L4 on the base substrate, and the twenty-second via hole V22 exposes a surface of the fourth connecting part L4. The twenty-second via hole V22 is configured to make the first electrode of the eighth transistor formed by a subsequent process electrically connected with the second electrode plate of the first capacitor through the via hole.

In some embodiments of the present disclosure, as shown in FIG. 23 and FIG. 24, an orthographic projection of the twenty-third via hole V23 on the base substrate is located within a range of an orthographic projection of the third electrode of the twelfth transistor on the base substrate, and the second insulating layer below the twenty-third via hole V23 is etched to expose a surface of the third electrode of the twelfth transistor. The twenty-third via hole V23 is configured to make the second electrode of the seventh transistor formed by a subsequent process electrically connected with the third electrode of the twelfth transistor through the via hole.

In some embodiments of the present disclosure, as shown in FIG. 23 and FIG. 24, an orthographic projection of the twenty-fourth via hole V24 on the base substrate is located within a range of an orthographic projection of the first region of the active layer of the ninth transistor on the base substrate, and the first insulating layer and the second insulating layer below the twenty-fourth via hole V24 are etched to expose a surface of the first region of the active layer of the ninth transistor. The twenty-fourth via hole V24 is configured to make the first electrode of the ninth transistor formed by a subsequent process electrically connected with the first region of the active layer of the ninth transistor through the via hole.

In some embodiments of the present disclosure, as shown in FIG. 23 and FIG. 24, an orthographic projection of the twenty-fifth via hole V25 on the base substrate is located within a range of an orthographic projection of the second region of the active layer of the ninth transistor on the base substrate, and the first insulating layer and the second insulating layer below the twenty-fifth via hole V25 are etched to expose a surface of the second region of the active layer of the ninth transistor. The twenty-fifth via hole V25 is configured to make the second electrode of the ninth transistor formed by a subsequent process electrically connected with the second region of the active layer of the ninth transistor through the via hole.

In some embodiments of the present disclosure, as shown in FIG. 23 and FIG. 24, an orthographic projection of the twenty-sixth via hole V26 on the base substrate is located within a range of an orthographic projection of the second electrode plate of the second capacitor on the base substrate, and the twenty-sixth via hole V26 exposes a surface of the second electrode plate of the second capacitor. The twenty-sixth via hole V26 is configured to make the second electrode of the eighth transistor (also the second electrode of the ninth transistor) formed by a subsequent process electrically connected with the second electrode plate of the second capacitor.

In some embodiments of the present disclosure, as shown in FIG. 23 and FIG. 24, an orthographic projection of the twenty-seventh via hole V27 on the base substrate is located within a range of an orthographic projection of the second region of the active layer of the twelfth transistor on the base substrate, and the first insulating layer and the second insulating layer below the twenty-seventh via hole V27 are etched to expose a surface of the second region of the active layer of the twelfth transistor. The twenty-seventh via hole V27 is configured to make the second electrode of the active layer of the twelfth transistor formed by a subsequent process electrically connected with the second region of the active layer of the twelfth transistor through the via hole.

In some embodiments of the present disclosure, as shown in FIG. 23 and FIG. 24, an orthographic projection of the twenty-eighth via hole V28 on the base substrate is located within a range of an orthographic projection of the first region of the active layer of the twelfth transistor on the base substrate, and the first insulating layer and the second insulating layer below the twenty-eighth via hole V28 are etched to expose a surface of the first region of the active layer of the twelfth transistor. The twenty-eighth via hole V28 is configured to make the first electrode of the twelfth transistor formed by a subsequent process electrically connected with the first region of the active layer of the twelfth transistor through the via hole.

In some embodiments of the present disclosure, as shown in FIG. 23 and FIG. 24, an orthographic projection of the twenty-ninth via hole V29 on the base substrate is located within a range of an orthographic projection of the third electrode of the fifth transistor on the base substrate, and the second insulating layer below the twenty-ninth via hole V29 is etched to expose a surface of the third electrode of the fifth transistor. The twenty-ninth via hole V29 is configured to make the second electrode of the second transistor (also the second electrode of the fourth transistor) formed by a subsequent process electrically connected with the third electrode of the fifth transistor through the via hole.

In some embodiments of the present disclosure, as shown in FIG. 23 and FIG. 24, an orthographic projection of the thirtieth via hole V30 on the base substrate is located within a range of an orthographic projection of the first region of the active layer of the eleventh transistor on the base substrate, and the first insulating layer and the second insulating layer below the thirtieth via hole V30 are etched to expose a surface of the first region of the active layer of the eleventh transistor. The thirtieth via hole V30 is configured to make the first electrode of the eleventh transistor formed by a subsequent process electrically connected with the first region of the active layer of the eleventh transistor through the via hole.

In some embodiments of the present disclosure, as shown in FIG. 23 and FIG. 24, an orthographic projection of the thirty-first via hole V31 on the base substrate is located within a range of an orthographic projection of the second region of the active layer of the eleventh transistor on the base substrate, and the first insulating layer and the second insulating layer below the thirty-first via hole V31 are etched to expose a surface of the second region of the active layer of the eleventh transistor. The thirty-first via hole V31 is configured to make the second electrode of the eleventh transistor (also the second electrode of the tenth transistor) formed by a subsequent process electrically connected with the second region of the active layer of the eleventh transistor (also the second region of the active layer of the tenth transistor) through the via hole.

In some embodiments of the present disclosure, as shown in FIG. 23 and FIG. 24, an orthographic projection of the thirty-second via hole V32 on the base substrate is located within a range of an orthographic projection of the first region of the active layer of the tenth transistor on the base substrate, and the first insulating layer and the second insulating layer below the thirty-second via hole V32 are etched to expose a surface of the first region of the active layer of the tenth transistor. The thirty-second via hole V32 is configured to make the first electrode of the tenth transistor formed by a subsequent process electrically connected with the first region of the active layer of the tenth transistor through the via hole.

In some embodiments of the present disclosure, as shown in FIG. 23 and FIG. 24, an orthographic projection of the thirty-third via hole V33 on the base substrate is located within a range of an orthographic projection of the first connecting part L1 on the base substrate, and the second insulating layer below the thirty-third via hole V33 is etched to expose a surface of the first connecting part L1. The thirty-third via hole V33 is configured to make one of the third clock signal line and the fourth clock signal line formed by a subsequent process electrically connected with the first connecting part L1.

In some embodiments of the present disclosure, as shown in FIG. 23 and FIG. 24, an orthographic projection of the thirty-fourth via hole V34 on the base substrate is located within the range of the orthographic projection of the first connecting part L1 on the base substrate, and the second insulating layer below the thirty-fourth via hole V34 is etched to expose the surface of the first connecting part L1. The thirty-fourth via hole V34 is configured to make the first electrode of the tenth transistor formed by a subsequent process electrically connected with the first connecting part L1.

In some embodiments of the present disclosure, as shown in FIG. 23 and FIG. 24, an orthographic projection of the thirty-fifth via hole V35 on the base substrate is located within a range of an orthographic projection of the sixth connecting part L6 on the base substrate, and the thirty-fifth via hole V35 exposes a surface of the sixth connecting part L6. The thirty-fifth via hole V35 is configured to make the second electrode of the tenth transistor (also the second electrode of the eleventh transistor) formed by a subsequent process electrically connected with the sixth connecting part L6.

In some embodiments of the present disclosure, as shown in FIG. 23 and FIG. 24, an orthographic projection of the thirty-sixth via hole V36 on the base substrate is located within a range of an orthographic projection of the second electrode plate of the fourth capacitor on the base substrate, and the thirty-sixth via hole V36 exposes a surface of the second electrode plate of the fourth capacitor. The thirty-sixth via hole V36 is configured to make the first voltage signal line formed by a subsequent process electrically connected with the second electrode plate of the fourth capacitor.

In some embodiments of the present disclosure, as shown in FIG. 23 and FIG. 24, an orthographic projection of the thirty-seventh via hole V37 on the base substrate is located within a range of an orthographic projection of the first region of the active layer of the fourth transistor on the base substrate, and the first insulating layer and the second insulating layer below the thirty-seventh via hole V37 are etched to expose a surface of the first region of the fourth transistor. The thirty-seventh via hole V37 is configured to make the first electrode of the fourth transistor formed by a subsequent process electrically connected with the first region of the active layer of the fourth transistor through the via hole.

Figure 25:
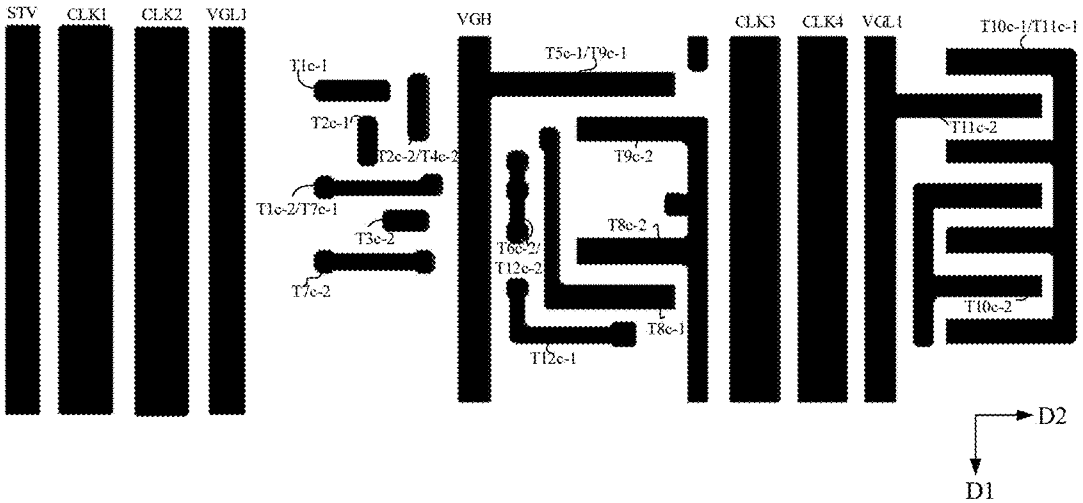
FIG. 25 is a schematic structural diagram of a third conductive layer pattern in FIG. 17.
Figure 26:
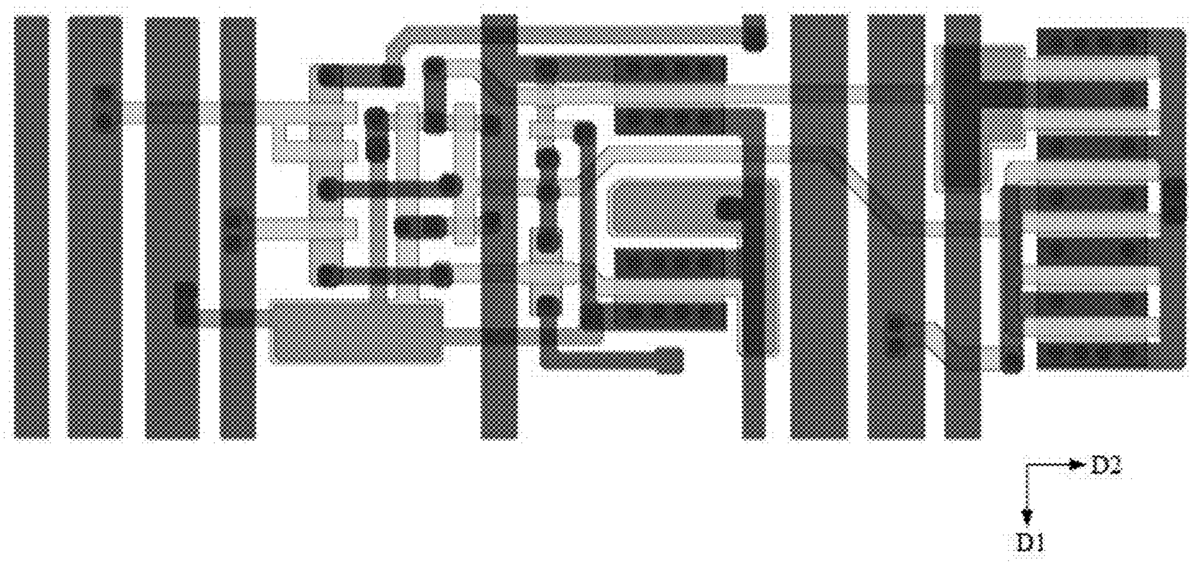
FIG. 26 is a schematic structural diagram of FIG. 17 after the third conductive layer pattern is formed.

A fifth step, a third conductive layer pattern is formed, including: depositing a third conductive thin film on the base substrate where the aforementioned patterns are formed, and performing composition on the third conductive thin film through a patterning process to form the third conductive layer pattern. As shown in FIG. 25 and FIG. 26, FIG. 25 is a schematic diagram of the third conductive layer pattern in FIG. 17, and FIG. 26 is a schematic diagram of FIG. 17 after the third conductive pattern is formed. In some embodiments of the present disclosure, the third conductive layer may be referred to as a first source-drain metal (SD1) layer.

In some embodiments of the present disclosure, as shown in FIG. 25 and FIG. 26, the third conductive layer pattern may include: an input signal line STV, a first clock signal line CLK1, a second clock signal line CLK2, two first voltage signal lines VGL1, a second voltage signal line VGH, a third clock signal line CLK3, a fourth clock signal line CLK4 as well as a first electrode T1c-1 and a second electrode T1c-2 of the first transistor to a first electrode T12c-1 and a second electrode T12c-2 of the twelfth transistor located at the present grade shifting register unit.

In some embodiments of the present disclosure, as shown in FIG. 25 and FIG. 26, the input signal line, the first clock signal line, the second clock signal line and the first voltage signal line away from a display region are arranged at the same layer.

In some embodiments of the present disclosure, as shown in FIG. 25 and FIG. 26, the second electrode T1c-2 of the first transistor and a first electrode T7c-1 of the seventh transistor are of an integrally formed structure; a second electrode T2c-2 of the second transistor and a second electrode T4c-2 of the fourth transistor are of an integrally formed structure; the second voltage signal line VGH, a first electrode T5c-1 of the fifth transistor and a first electrode T9c-1 of the ninth transistor are of an integrally formed structure; a second electrode T6c-2 of the sixth transistor and the second electrode T12c-2 of the twelfth transistor are of an integrally formed structure; a second electrode T8c-2 of the eighth transistor and a second electrode T9c-2 of the ninth transistor are of an integrally formed structure; a first electrode T10c-1 of the tenth transistor and a first electrode T11c-1 of the eleventh transistor are of an integrally formed structure; and the first voltage signal line VGL1 close to the display region and a second electrode T11c-2 of the eleventh transistor are of an integrally formed structure. The first electrode T1c-1 of the first transistor, a first electrode T2c-1 of the second transistor, a second electrode T3c-2 of the third transistor, a second electrode T7c-2 of the seventh transistor, a first electrode T8c-1 of the eighth transistor, the first electrode T12c-1 of the twelfth transistor and a second electrode T10c-2 of the tenth transistor may be arranged separately.

In some embodiments of the present disclosure, as shown in FIG. 25 and FIG. 26, the input signal line STV, the first clock signal line CLK1, the second clock signal line CLK2, the first voltage signal line VGL1 away from the display region, the second voltage signal line VGH, the third clock signal line CLK3, the fourth clock signal line CLK4 and the first voltage signal line VGL1 close to the display region are distributed sequentially along a side close to the display region. Any one of the input signal line STV, the first clock signal line CLK1, the second clock signal line CLK2, the first voltage signal line VGL1 away from the display region, the second voltage signal line VGH, the third clock signal line CLK3, the fourth clock signal line CLK4 and the first voltage signal line VGL1 close to the display region extends in the first direction D1.

In some embodiments of the present disclosure, as shown in FIG. 25 and FIG. 26, the first electrode T1c-1 of the first transistor may be in a strip shape, and extends in the second direction D2. The first electrode T1c-1 of the first transistor is located between the first voltage signal line VGL1 away from the display region and the second voltage signal line VGH. The first electrode T1c-1 of the first transistor is electrically connected with the first region T1a-1 of the active layer of the first transistor through the second via hole V2, and electrically connected with the second connecting part L2 located at the present grade shifting register unit through the third via hole V3.

In some embodiments of the present disclosure, as shown in FIG. 25 and FIG. 26, the second electrode T1c-2 of the first transistor (also the first electrode T7c-1 of the seventh transistor) may be in a strip shape, and extends in the second direction D2. The second electrode T1c-2 of the first transistor (also the first electrode T7c-1 of the seventh transistor) is located between the first voltage signal line VGL1 away from the display region and the second voltage signal line VGH. The second electrode T1c-2 of the first transistor (also the first electrode T7c-1 of the seventh transistor) is electrically connected with the second region T1a-2 of the active layer of the first transistor (also the first region T7a-1 of the active layer of the seventh transistor) through the fifth via hole V5, and electrically connected with the third electrode T3b of the third transistor (also the third electrode T4b of the fourth transistor) through the fifteenth via hole V15.

In some embodiments of the present disclosure, as shown in FIG. 25 and FIG. 26, the first electrode T2c-1 of the second transistor may be in a strip shape, and extends in the first direction D1. The first electrode T2c-1 of the second transistor is located between the first voltage signal line VGL1 away from the display region and the second voltage signal line VGH. The first electrode T2c-1 of the second transistor is electrically connected with the first region T2a-1 of the active layer of the second transistor through the tenth via hole V10, and electrically connected with the second electrode plate C1-2 of the first capacitor through the ninth via hole V9.

In some embodiments of the present disclosure, as shown in FIG. 25 and FIG. 26, the second electrode T2c-2 of the second transistor (also the second electrode T4c-2 of the fourth transistor) may be in a strip shape, and extends in the first direction D1. The second electrode T2c-2 of the second transistor (also the second electrode T4c-2 of the fourth transistor) is located between the first voltage signal line VGL1 away from the display region and the second voltage signal line VGH. The second electrode T2c-2 of the second transistor (also the second electrode T4c-2 of the fourth transistor) is electrically connected with the second region T2a-2 of the active layer of the second transistor (also the second region T4a-2 of the active layer of the fourth transistor) through the eleventh via hole V11, and electrically connected with the third electrode T5b of the fifth transistor through the twenty-ninth via hole V29.

In some embodiments of the present disclosure, as shown in FIG. 25 and FIG. 26, the second electrode T3c-2 of the third transistor may be in a strip shape, and extends in the second direction D2. The second electrode T3c-2 of the third transistor is located between the first voltage signal line VGL1 away from the display region and the second voltage signal line VGH. The second electrode T3c-2 of the third transistor is electrically connected with the second region T3a-2 of the active layer of the third transistor through the thirteenth via hole V13, and electrically connected with the third electrode T2b of the second transistor (also the first electrode plate C1-1 of the first capacitor) through the twelfth via hole V12.

In some embodiments of the present disclosure, as shown in FIG. 25 and FIG. 26, the second electrode T7c-2 of the seventh transistor may be in a strip shape, and extends in the second direction D2. The second electrode T7c-2 of the seventh transistor is located between the first voltage signal line VGL1 away from the display region and the second voltage signal line VGH. The second electrode T7c-2 of the seventh transistor is electrically connected with the second region T7a-2 of the active layer of the seventh transistor through the seventh via hole V7, and electrically connected with the third electrode T12b of the twelfth transistor through the twenty-third via hole V23.

In some embodiments of the present disclosure, as shown in FIG. 25 and FIG. 26, the first electrode T5c-1 of the fifth transistor (also the first electrode T9c-1 of the ninth transistor) may be in a strip shape, and extends in the second direction D2. The first electrode T5c-1 of the fifth transistor (also the first electrode T9c-1 of the ninth transistor) is located between the second voltage signal line VGH and the third clock signal line CLK3. The first electrode T5c-1 of the fifth transistor is electrically connected with the first electrode T5a-1 of the active layer of the fifth transistor through the nineteenth via hole V19, and the first electrode T9c-1 of the ninth transistor is electrically connected with the first electrode T9a-1 of the active layer of the ninth transistor through the twenty-fourth via hole V24.

In some embodiments of the present disclosure, as shown in FIG. 25 and FIG. 26, the second electrode T6c-2 of the sixth transistor (also the second electrode T12c-2 of the twelfth transistor) may be in a strip shape, and extends in the first direction D1. The second electrode T6c-2 of the sixth transistor (also the second electrode T12c-2 of the twelfth transistor) is located between the second voltage signal line VGH and the third clock signal line CLK3. The second electrode T6c-2 of the sixth transistor is electrically connected with the second electrode T6a-2 of the active layer of the sixth transistor through the seventeenth via hole V17, and electrically connected with the third electrode T3b of the third transistor (also the third electrode T4b of the fourth transistor) through the sixteenth via hole V16. The second electrode T12c-2 of the twelfth transistor is electrically connected with the second electrode T12a-2 of the active layer of the twelfth transistor through the twenty-seventh via hole V27.

In some embodiments of the present disclosure, as shown in FIG. 25 and FIG. 26, the first electrode T12c-1 of the twelfth transistor may be in an "L" shape. The first electrode T12c-1 of the twelfth transistor is located between the second voltage signal line VGH and the third clock signal line CLK3. The first electrode T12c-1 of the twelfth transistor is electrically connected with the first electrode T12a-1 of the active layer of the twelfth transistor through the twenty-eighth via hole V28.

In some embodiments of the present disclosure, as shown in FIG. 25 and FIG. 26, the first electrode T8c-1 of the eighth transistor may be in an "L" shape. The first electrode T8c-1 of the eighth transistor is located between the second voltage signal line VGH and the third clock signal line CLK3. The first electrode T8c-1 of the eighth transistor is electrically connected with the first region T8a-1 of the active layer of the eighth transistor through the twenty-first via hole V21, electrically connected with the fourth connecting part L4 through the twenty-second via hole V22, and electrically connected with the third electrode T6b of the sixth transistor through the eighteenth via hole V18.

In some embodiments of the present disclosure, as shown in FIG. 25 and FIG. 26, the second electrode T8c-2 of the eighth transistor (also the second electrode T9c-2 of the ninth transistor) may be in an "F" shape. The second electrode T8c-2 of the eighth transistor (also the second electrode T9c-2 of the ninth transistor) is located between the second voltage signal line VGH and the third clock signal line CLK3. The second electrode T8c-2 of the eighth transistor may be electrically connected with the second region T8a-2 of the active layer of the eighth transistor through the twentieth via hole V20, the second electrode T9c-2 of the ninth transistor may be electrically connected with the second region T9a-2 of the active layer of the ninth transistor through the twenty-fifth via hole V25, and the second electrode T8c-2 of the eighth transistor (also the second electrode T9c-2 of the ninth transistor) is electrically connected with the second electrode plate C2-2 of the second capacitor through the twenty-sixth via hole V26.

In some embodiments of the present disclosure, as shown in FIG. 25 and FIG. 26, the second electrode T11c-2 of the eleventh transistor may be in a strip shape, and extends in the second direction D2. The second electrode T11c-2 of the eleventh transistor is located on a side, close to the display region, of the first voltage signal line VGL1 close to the display region. The second electrode T11c-2 of the eleventh transistor may be electrically connected with the second region T11a-2 of the active layer of the eleventh transistor through the thirty-first via hole V31.

In some embodiments of the present disclosure, as shown in FIG. 25 and FIG. 26, the second electrode T10c-2 of the tenth transistor may be in an "F" shape. The second electrode T10c-2 of the tenth transistor is located on a side, close to the display region, of the first voltage signal line VGL1 close to the display region. The second electrode T10c-2 of the tenth transistor may be electrically connected with the second region T10a-2 of the active layer of the tenth transistor through the thirty-second via hole V32.

In some embodiments of the present disclosure, as shown in FIG. 25 and FIG. 26, the first electrode T10c-1 of the tenth transistor (also the first electrode T11c-1 of the eleventh transistor) may be in a comb shape, where "comb teeth" are located on a side of a "comb back" away from the display region. The first electrode T10c-1 of the tenth transistor (also the first electrode T11c-1 of the eleventh transistor) is located on a side, close to the display region, of the first voltage signal line VGL1 close to the display region. The first electrode T10c-1 of the tenth transistor is electrically connected with the first region T10a-1 of the active layer of the tenth transistor through the thirty-second via hole V32, and the first electrode T11c-1 of the eleventh transistor is electrically connected with the first region T11a-1 of the active layer of the eleventh transistor through the thirtieth via hole V30. The first electrode T10c-1 of the tenth transistor (also the first electrode T11c-1 of the eleventh transistor) is electrically connected with the sixth connecting part L6 through the thirty-fifth via hole V35.

In some embodiments of the present disclosure, as shown in FIG. 26, an orthographic projection of the first voltage signal line VGL1 close to the display region on the base substrate partially overlaps an orthographic projection of the fourth capacitor on the base substrate.

Figure 27:
FIG. 27 is a schematic structural diagram of a fourth insulating layer pattern in FIG. 17.
Figure 28:
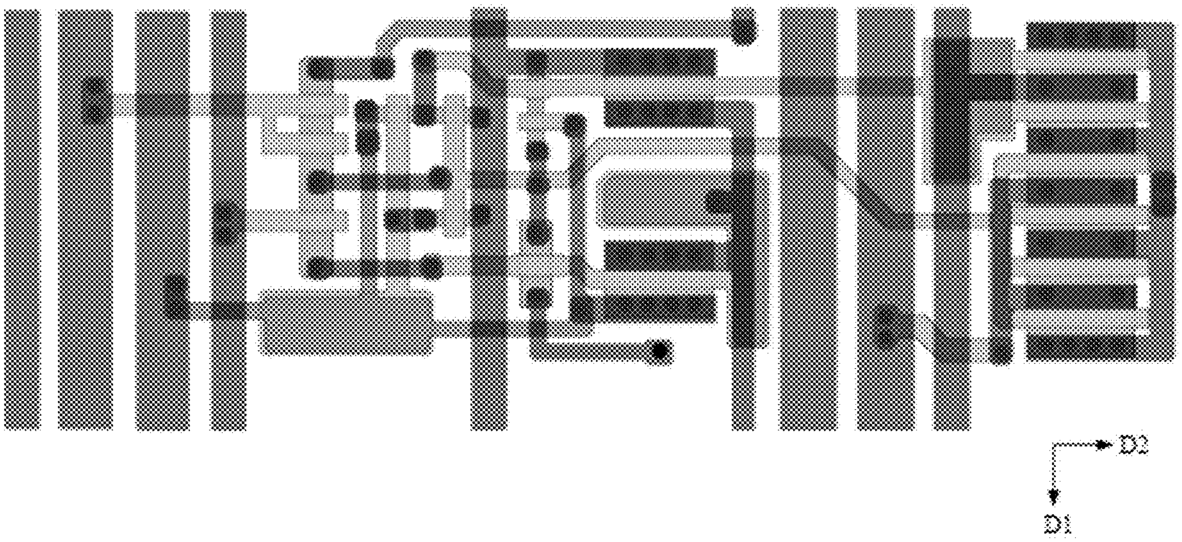
FIG. 28 is a schematic structural diagram of FIG. 17 after the fourth insulating layer pattern is formed.

A sixth step, a fourth insulating layer pattern is formed, including: depositing a fourth insulating thin film on the base substrate where the aforementioned patterns are formed, and performing composition on the fourth insulating thin film through a patterning process to form the fourth insulating layer pattern covering the aforementioned structure. A via hole pattern is formed in the fourth insulating layer. As shown in FIG. 27 and FIG. 28, FIG. 27 is a schematic diagram of a second via hole pattern in FIG. 17, and FIG. 28 is a schematic diagram of FIG. 17 after the fourth insulating layer pattern is formed.

In some embodiments of the present disclosure, as shown in FIG. 27 and FIG. 28, the via hole pattern may include: a thirty-eighth via hole V38.

In some embodiments of the present disclosure, as shown in FIG. 27 and FIG. 28, an orthographic projection of the thirty-eighth via hole V38 on the base substrate is located within a range of an orthographic projection of the first electrode T12c-1 of the twelfth transistor on the base substrate, and the thirty-eighth via hole V38 exposes a surface of the first electrode T12c-1 of the twelfth transistor. The thirty-eighth via hole V38 is configured to make the third voltage signal line VGL2 formed by a subsequent process electrically connected with the first electrode T12c-1 of the twelfth transistor through the via hole.

Figure 29:
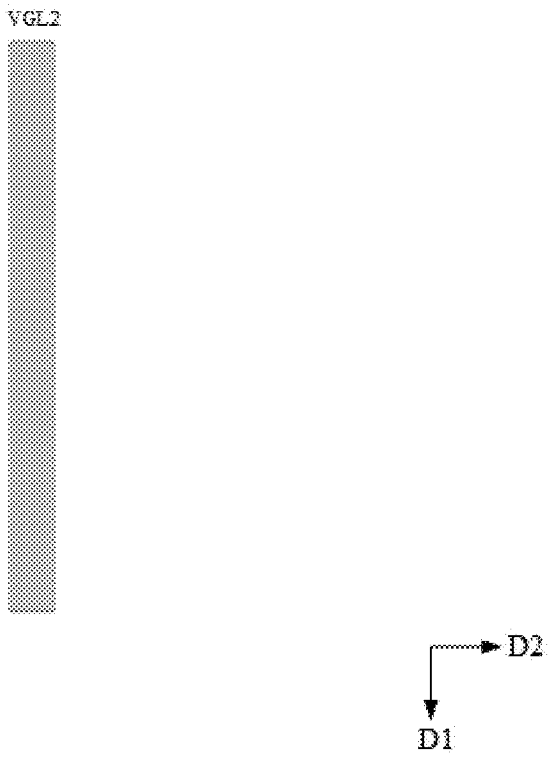
FIG. 29 is a schematic structural diagram of a fourth conductive layer pattern in FIG. 17.
Figure 30:
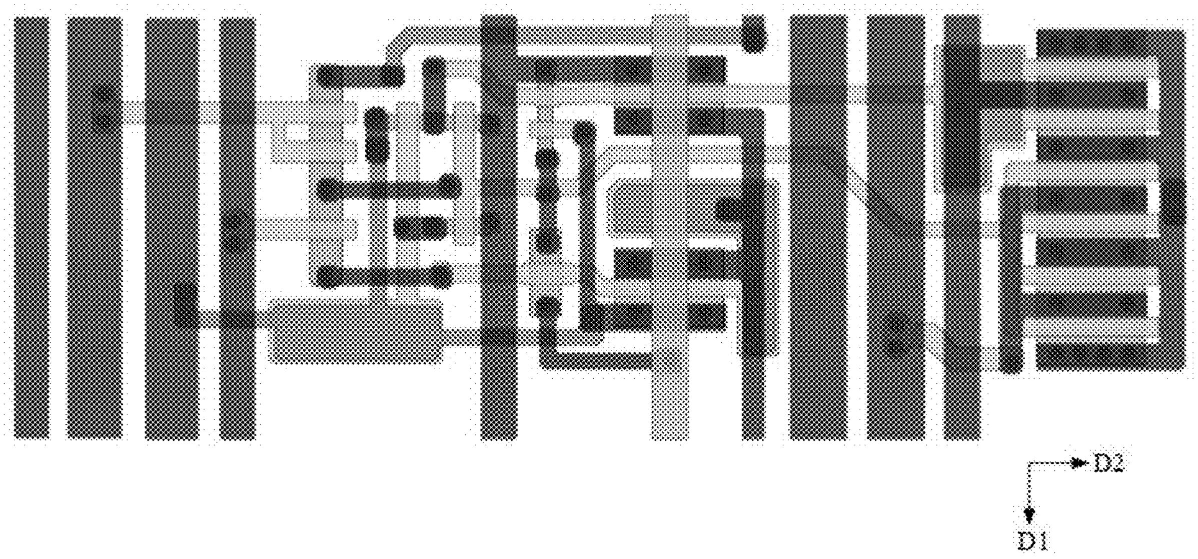
FIG. 30 is a schematic structural diagram of FIG. 17 after the fourth conductive layer pattern is formed.

A seventh step, a fourth conductive layer pattern is formed, including: depositing a fourth conductive thin film on the base substrate where the aforementioned patterns are formed, and performing composition on the fourth conductive thin film through a patterning process to form the fourth conductive layer pattern. As shown in FIG. 29 and FIG. 30, FIG. 29 is a schematic diagram of the fourth conductive layer pattern in FIG. 17, and FIG. 30 is a schematic diagram of FIG. 17 after the fourth conductive layer pattern is formed. In some embodiments of the present disclosure, the fourth conductive layer may be referred to as a second source-drain metal (SD2) layer.

In some embodiments of the present disclosure, as shown in FIG. 29 and FIG. 30, the fourth conductive layer pattern may include: the third voltage signal line VGL2.

In some embodiments of the present disclosure, as shown in FIG. 29 and FIG. 30, the third voltage signal line VGL2 may be in a line shape, and extends in the first direction D1. An orthographic projection of the third voltage signal line VGL2 on the base substrate is located between the second voltage signal line VGH and the third clock signal line CLK3, and the orthographic projection on the base substrate partially overlaps orthographic projections of the eighth transistor, the ninth transistor and the second capacitor on the base substrate.

In some embodiments of the present disclosure, as shown in FIG. 29 and FIG. 30, the third voltage signal line VGL2 is electrically connected with the first electrode T12c-1 of the twelfth transistor through the thirty-eighth via hole V38.

An eighth step, a flat layer pattern is formed, including: depositing a fifth insulating thin film on the base substrate where the aforementioned patterns are formed, coating with a flat thin film, and patterning the fifth insulating thin film and the flat thin film through a patterning process to form a fifth insulating layer pattern and the flat layer pattern covering the aforementioned patterns.

So far, the driving structure layer is prepared on the base substrate. Within a plane parallel to the display substrate, the driving structure layer may include a plurality of shifting register units, and the driving structure layer may be arranged on the base substrate. The driving structure layer may include the semiconductor layer, the first insulating layer, the first conductive layer, the second insulating layer, the second conductive layer, the third insulating layer, the third conductive layer, the fourth insulating layer, the fourth conductive layer, the fifth insulating layer and the flat layer which are sequentially arranged on the base substrate.

Figure 31:
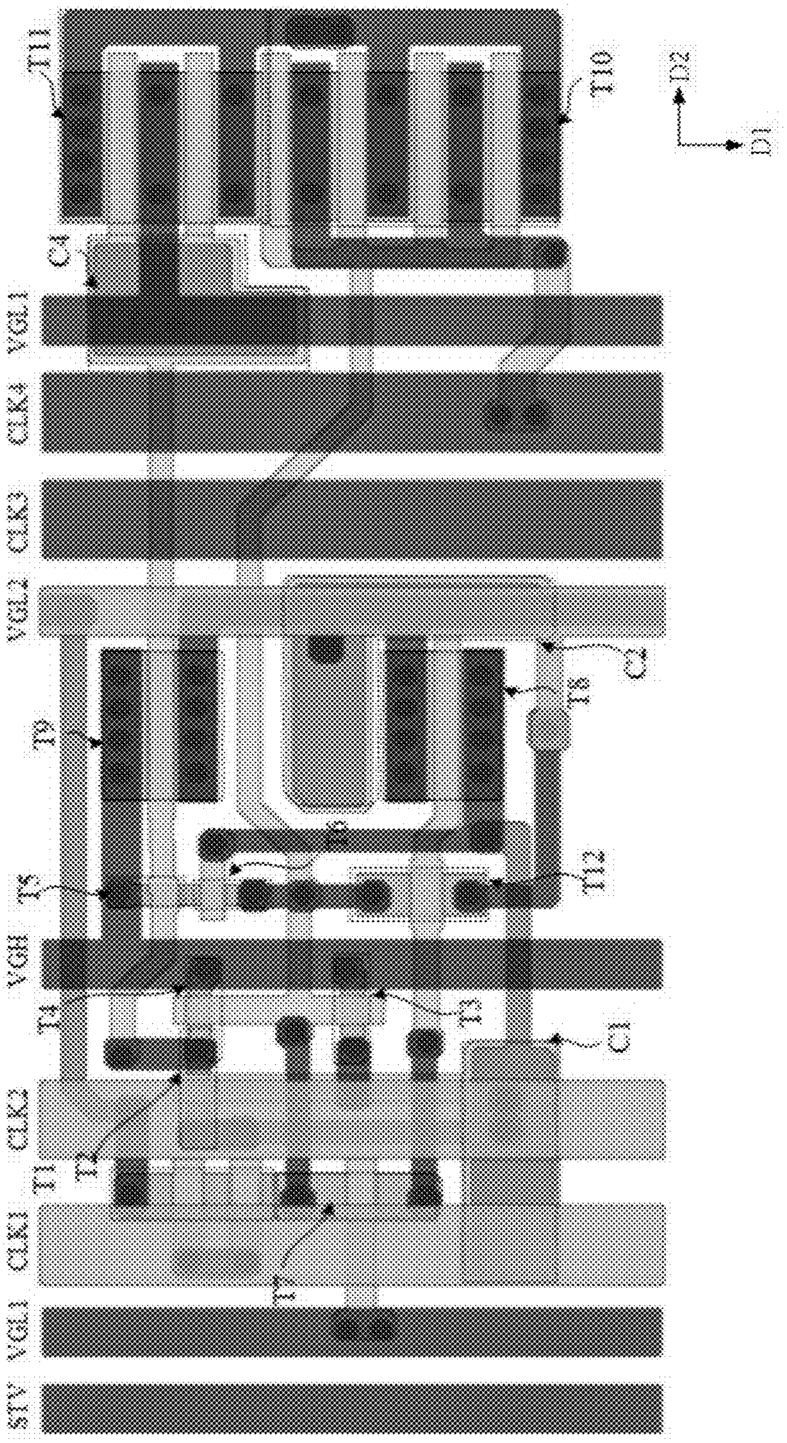
FIG. 31 is a schematic layout structure diagram of another shifting register unit provided by an embodiment of the present disclosure.

In some embodiments of the present disclosure, as shown in FIG. 31, the first clock signal line CLK1 and the second clock signal line CLK2 may be arranged at the same layer with the third voltage signal line VGL2. At the moment, the input signal line and the first voltage signal line away from the display region are not arranged at the same layer with the first clock signal line and the second clock signal line. In some embodiments of the present disclosure, the driving structure layer arranged on the base substrate includes: the semiconductor layer, the first insulating layer, the first conductive layer, the second insulating layer, the second conductive layer, the third insulating layer, the third conductive layer, the fourth insulating layer, the fourth conductive layer, the fifth insulating layer and the flat layer which are sequentially stacked on the base substrate. Exemplary illustration is performed below through a preparation process of the display substrate.

A first step, a semiconductor layer pattern is formed on the base substrate. This process is similar to the aforementioned preparation process, which is not repeated here.

Figure 32:
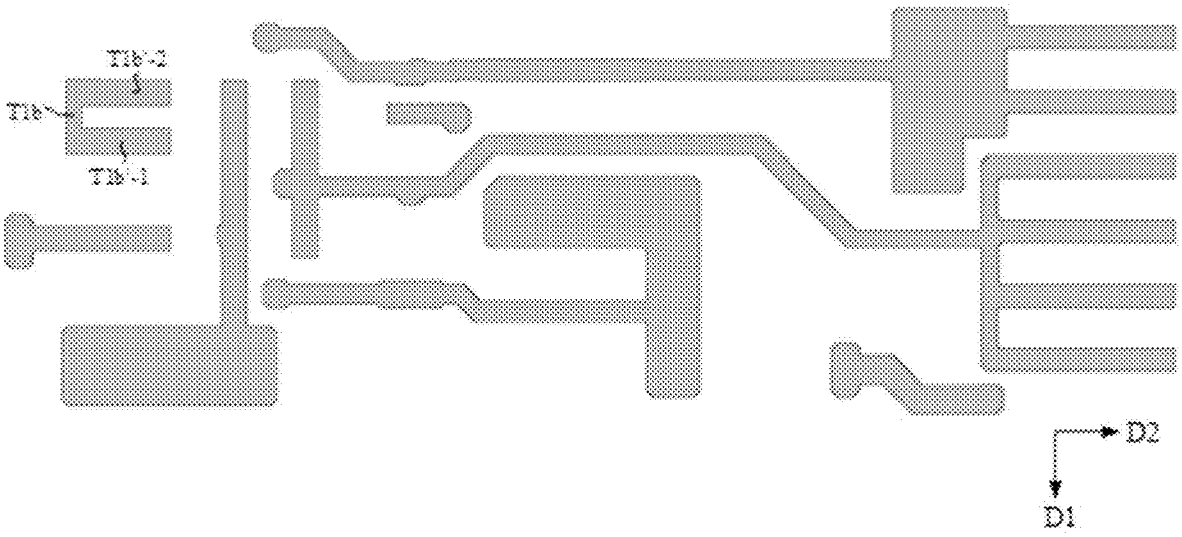
FIG. 32 is a schematic structural diagram of a first conductive layer pattern in FIG. 31.
Figure 33:
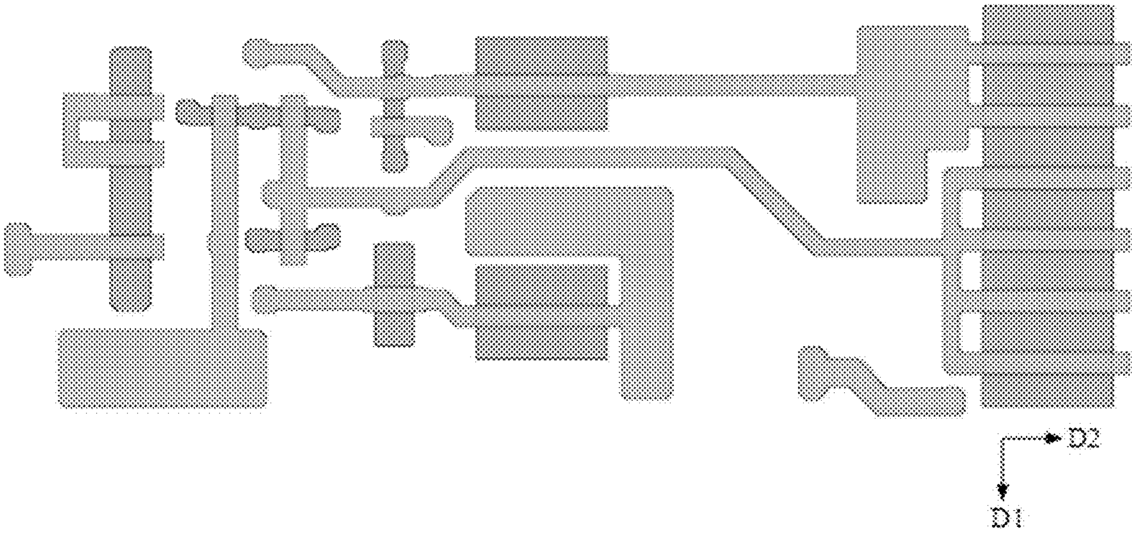
FIG. 33 is a schematic structural diagram of FIG. 31 after the first conductive layer pattern is formed.

A second step, the first conductive layer is formed pattern, including: depositing a first insulating thin film and a first conductive thin film on the base substrate where the aforementioned pattern is formed, and patterning the first insulating thin film and the first conductive thin film through a patterning process to form a first insulating layer pattern and the first conductive layer pattern arranged on the first insulating layer pattern. As shown in FIG. 32 and FIG. 33, FIG. 32 is a schematic diagram of the first conductive layer pattern in FIG. 31, and FIG. 33 is a schematic diagram of FIG. 31 after the first conductive layer pattern is formed. In some embodiments of the present disclosure, the first conductive layer may be referred to as a first gate metal (GATE1) layer.

In some embodiments of the present disclosure, as shown in FIG. 32 and FIG. 33, a third electrode T1*b*' of the first transistor includes: a first third-electrode part T1*b*-1 and a second third-electrode part T1*b*'-2. The third electrode T1*b*' of the first transistor is in a lying-down "n" shape, the first third-electrode part T1*b*'-1 and the second third-electrode part T1*b*'-2 of the first transistor both extend in the second direction D2, and an end part of the first third-electrode part T1*b*'-1 of the first transistor is connected with an end part of the second third-electrode part T1*b*'-2 of the first transistor.

In some embodiments of the present disclosure, a preparation process of the first conductive layer is similar to the aforementioned preparation process, which is not repeated here.

A third step, a second conductive layer pattern is formed, including: depositing a second insulating thin film and a second conductive thin film on the base substrate where the aforementioned patterns are formed, and patterning the second insulating thin film and the second conductive thin film through a patterning process to form a second insulating layer pattern and the second conductive layer pattern located on the second insulating layer pattern. As shown in FIG. 21 and FIG. 22, FIG. 21 is a schematic diagram of the second conductive layer pattern in FIG. 17, and FIG. 22 is a schematic diagram of FIG. 17 after the second conductive layer pattern is formed. In some embodiments of the present disclosure, the second conductive layer may be referred to as a second gate metal (GATE2) layer.

Figure 34:
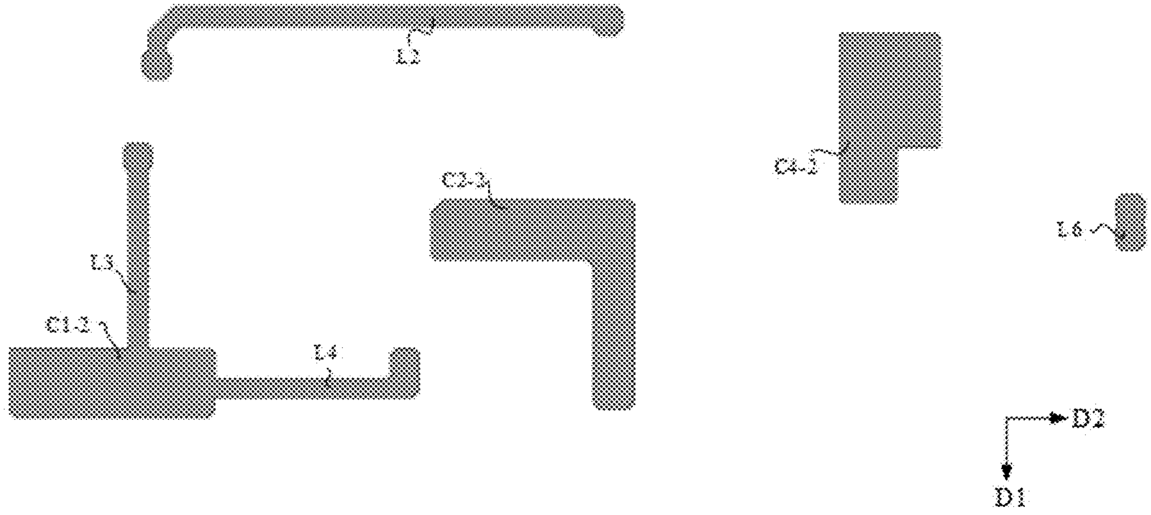
FIG. 34 is a schematic structural diagram of a second conductive layer pattern in FIG. 31.
Figure 35:
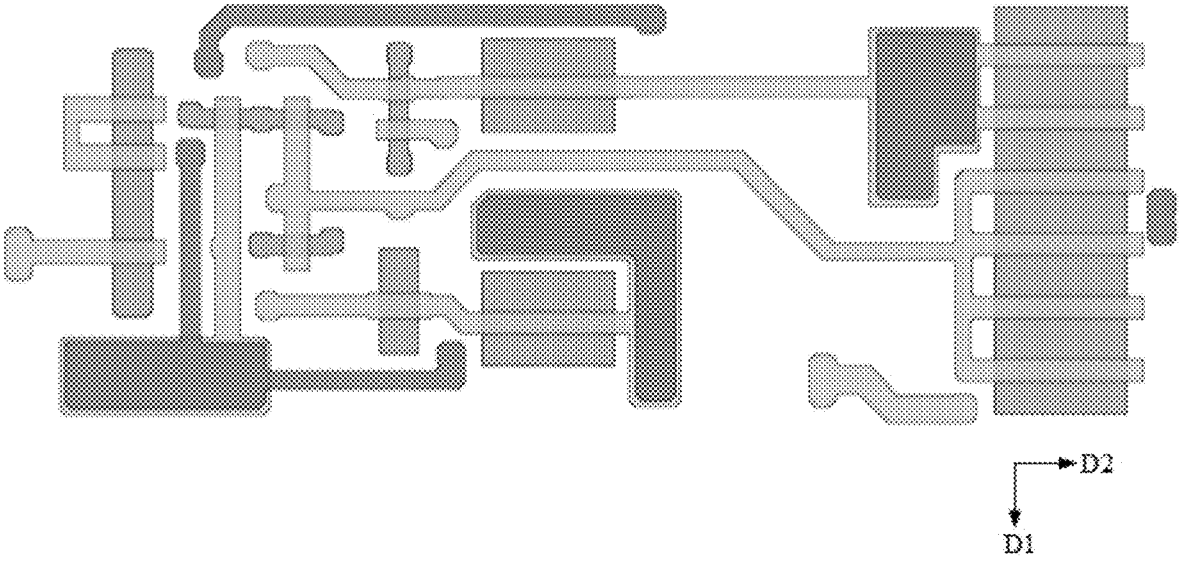
FIG. 35 is a schematic structural diagram of FIG. 31 after the second conductive layer pattern is formed.

In some embodiments of the present disclosure, as shown in FIG. 34 and FIG. 35, the second conductive layer pattern may include: a second electrode plate C1-2 of the first capacitor, a second electrode plate C2-2 of the second capacitor, a second electrode plate C4-2 of the fourth capacitor, a second connecting part L2, a third connecting part L3, a fourth connecting part L4 and a sixth connecting part L6, which are located on at least one grade of shifting register unit.

In some embodiments of the present disclosure, a preparation process of the second conductive layer is similar to the aforementioned preparation process, which is not repeated here.

Figure 36:
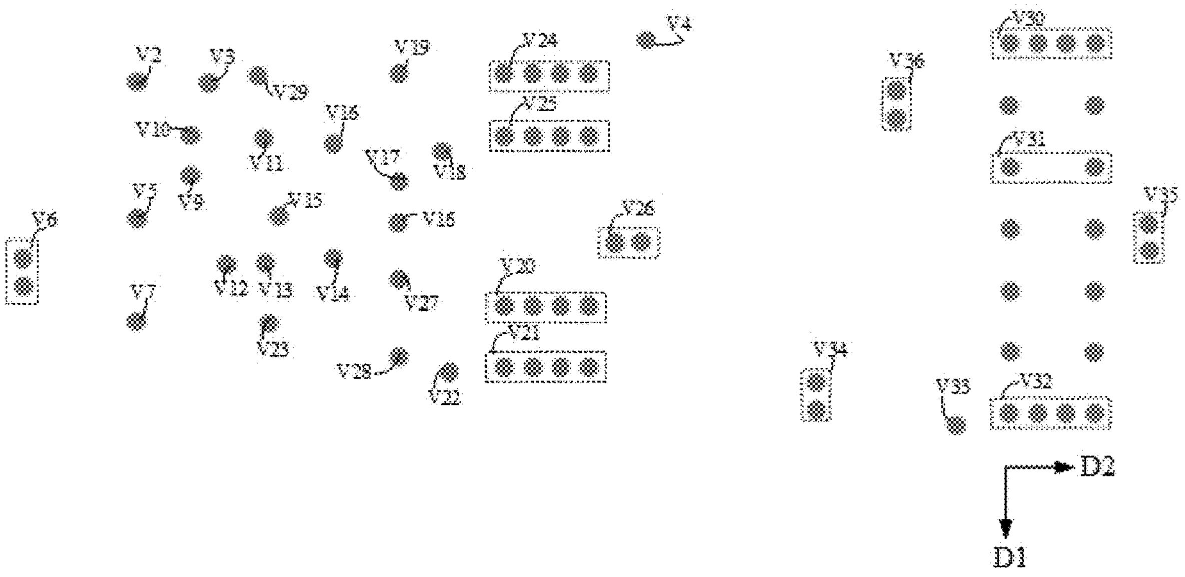
FIG. 36 is a schematic structural diagram of a third insulating layer pattern in FIG. 31.
Figure 37:
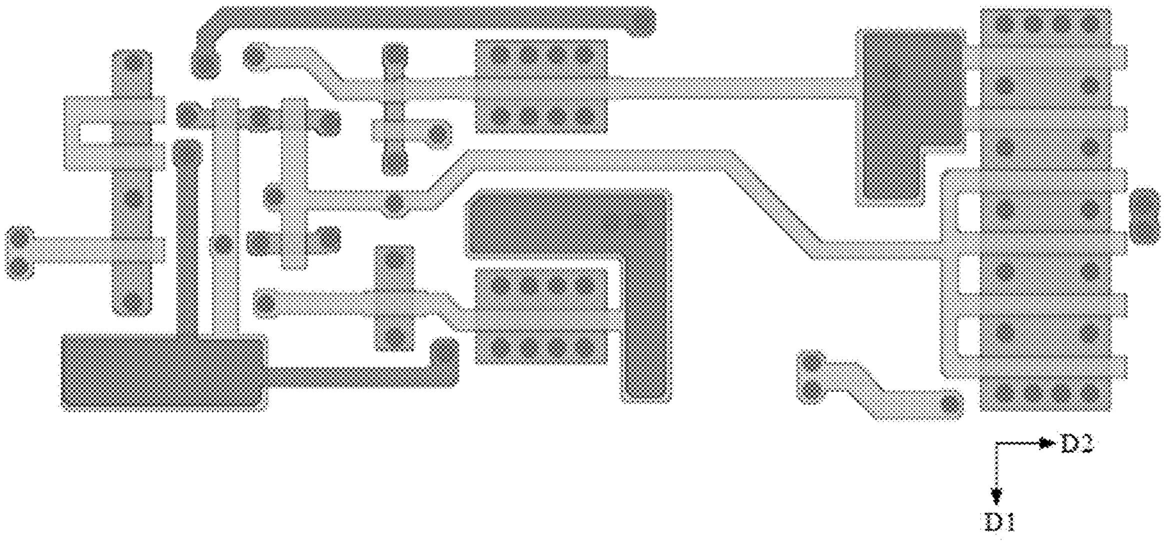
FIG. 37 is a schematic structural diagram of FIG. 31 after the third insulating layer pattern is formed.

A fourth step, a third insulating layer pattern is formed, including: depositing a third insulating thin film on the base substrate where the aforementioned patterns are formed, and performing composition on the third insulating thin film through a patterning process to form the third insulating layer pattern covering the aforementioned structure. A plurality of via hole patterns are formed in the third insulating layer. As shown in FIG. 36 and FIG. 37, FIG. 36 is a schematic diagram of third insulating layer via hole patterns in FIG. 31, and FIG. 37 is a schematic diagram of FIG. 31 after the third insulating layer pattern is formed.

In some embodiments of the present disclosure, as shown in FIG. 23 and FIG. 24, the plurality of via hole patterns may include: a second via hole V2 to a seventh via hole V7, and a ninth via hole V9 to a thirty-seventh via hole V37.

In some embodiments of the present disclosure, a preparation process of the third insulating layer is similar to the aforementioned preparation process, which is not repeated here.

Figure 38:
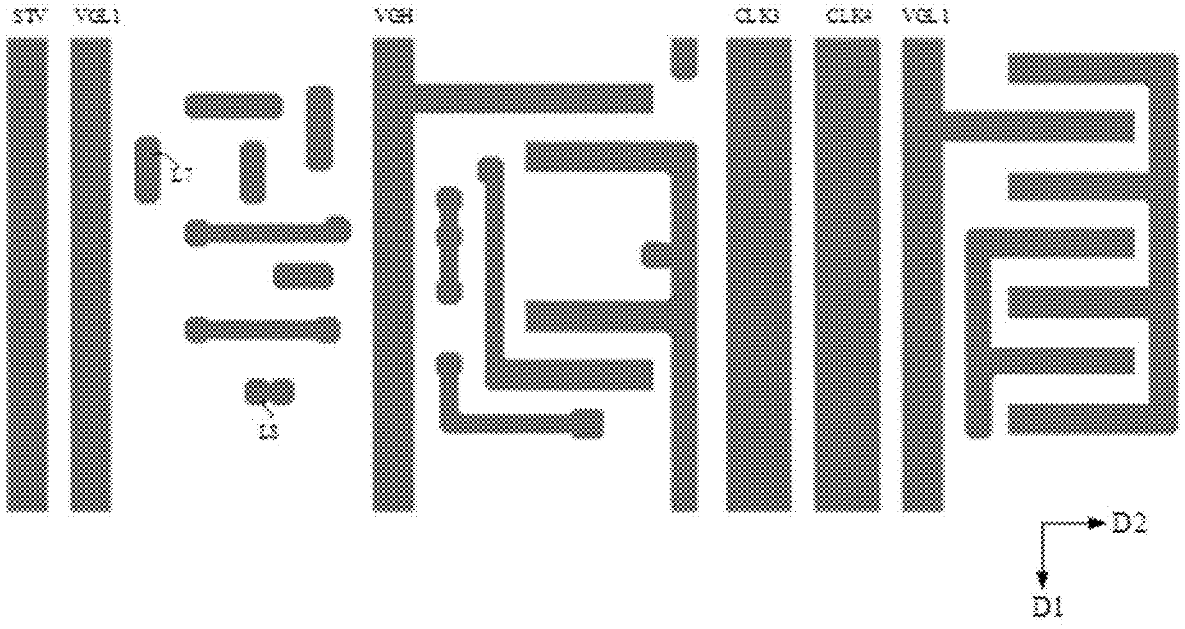
FIG. 38 is a schematic structural diagram of a third conductive layer pattern in FIG. 31.
Figure 39:
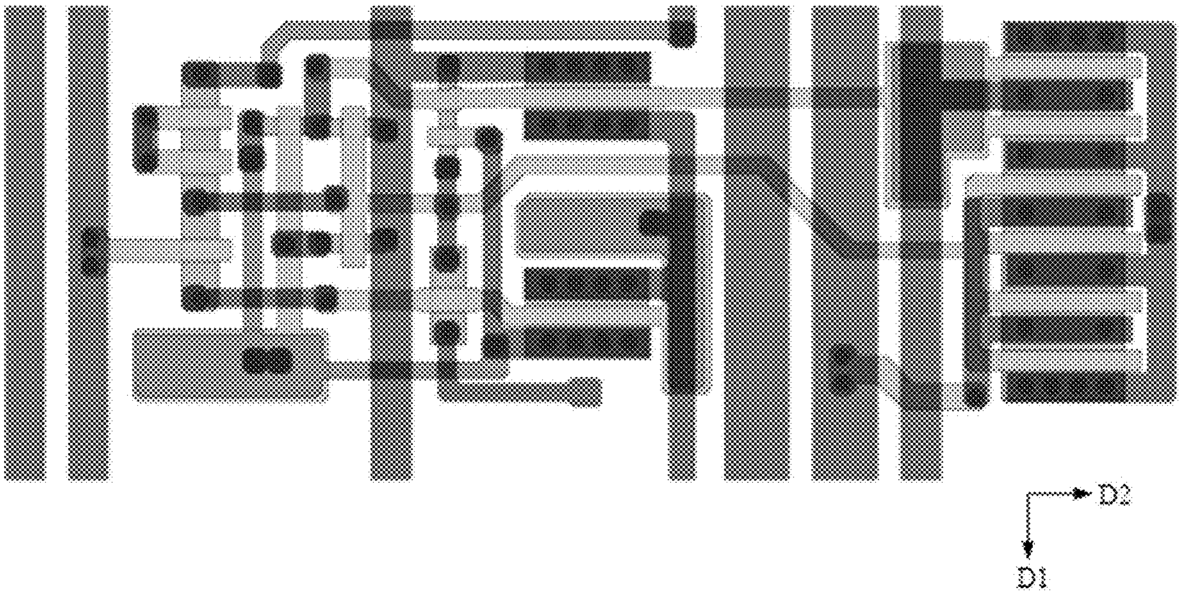
FIG. 39 is a schematic structural diagram of FIG. 31 after the third conductive layer pattern is formed.

A fifth step, a third conductive layer pattern is formed, including: depositing a third conductive thin film on the base substrate where the aforementioned patterns are formed, and performing composition on the third conductive thin film through a patterning process to form the third conductive layer pattern. As shown in FIG. 38 and FIG. 39, FIG. 38 is a schematic diagram of the third conductive layer pattern in FIG. 31, and FIG. 39 is a schematic diagram of FIG. 31 after the third conductive pattern is formed. In some embodiments of the present disclosure, the third conductive layer may be referred to as a first source-drain metal (SD1) layer.

In some embodiments of the present disclosure, as shown in FIG. 38 and FIG. 39, the third conductive layer pattern may include: an input signal line STV, two first voltage signal lines VGL1, a second voltage signal line VGH, a third clock signal line CLK3, a fourth clock signal line CLK4, a seventh connecting part L7, an eighth connecting part L8 as well as a first electrode T1*c*-1 and a second electrode T1*c*-2 of the first transistor to a first electrode T12*c*-1 and a second electrode T12*c*-2 of the twelfth transistor located at the present grade shifting register unit.

In some embodiments of the present disclosure, a preparation process of the third conductive layer is similar to the aforementioned preparation process, which is not repeated here.

Figure 40:
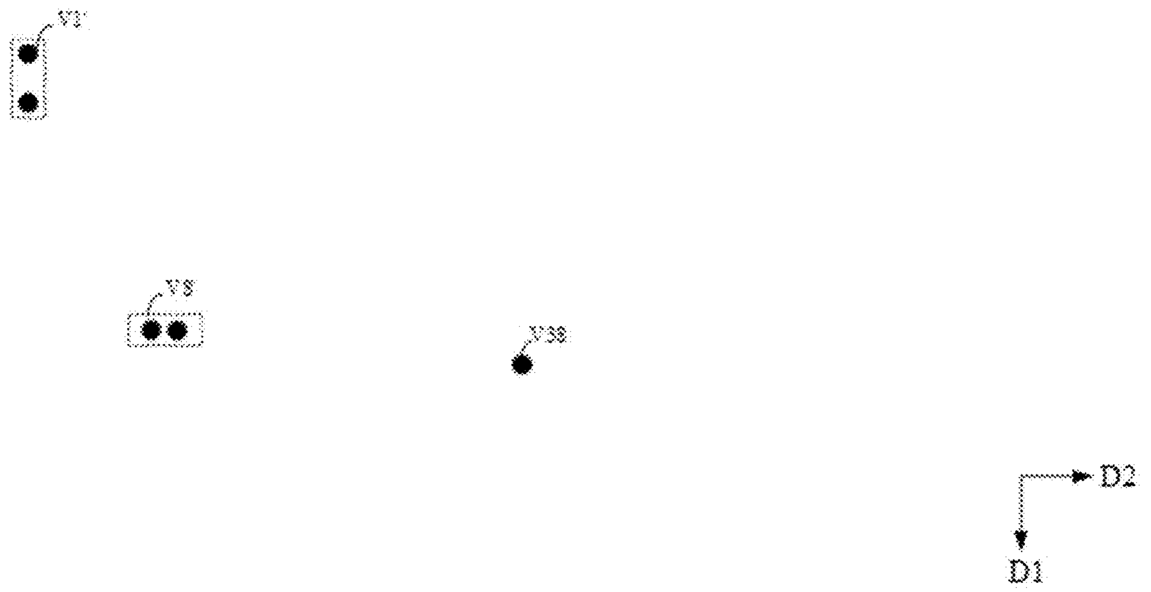
FIG. 40 is a schematic structural diagram of a fourth insulating layer pattern in FIG. 31.
Figure 41:
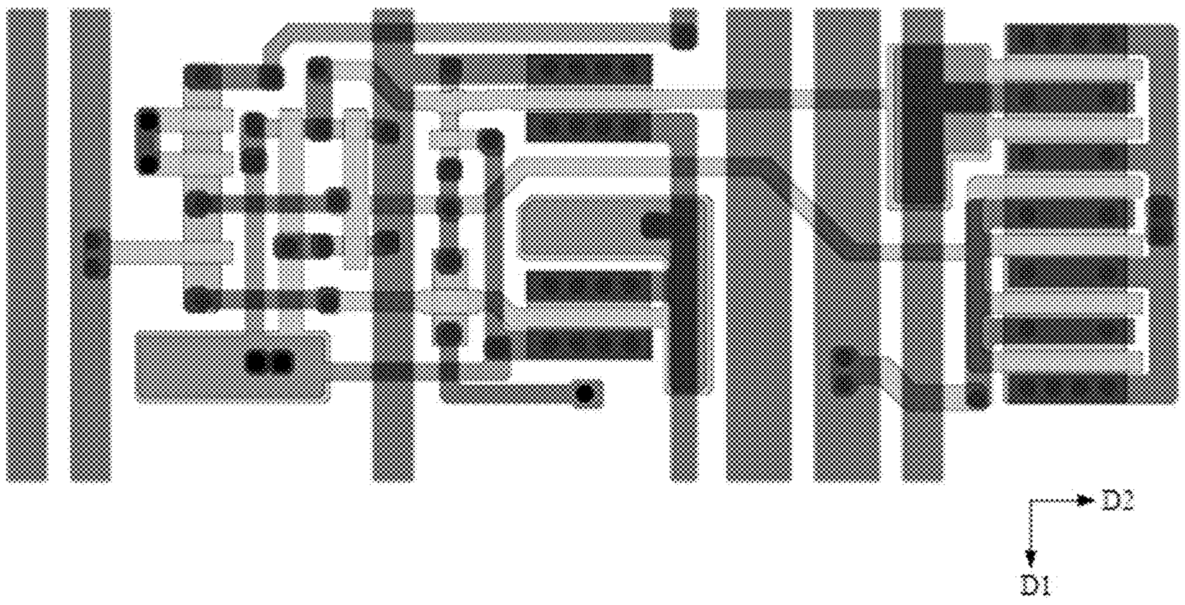
FIG. 41 is a schematic structural diagram of FIG. 31 after the fourth insulating layer pattern is formed.

A sixth step, a fourth insulating layer pattern is formed, including: depositing a fourth insulating thin film on the base substrate where the aforementioned patterns are formed, and performing composition on the fourth insulating thin film through a patterning process to form the fourth insulating layer pattern covering the aforementioned structure. A via hole pattern is formed in the fourth insulating layer. As shown in FIG. 40 and FIG. 41, FIG. 40 is a schematic diagram of a second via hole pattern in FIG. 31, and FIG. 41 is a schematic diagram of FIG. 31 after the fourth insulating layer pattern is formed.

In some embodiments of the present disclosure, as shown in FIG. 40 and FIG. 41, the via hole pattern may include: a first via hole V1', an eighth via hole V8' and a thirty-eighth via hole V38.

In some embodiments of the present disclosure, as shown in FIG. 40 and FIG. 41, an orthographic projection of the first via hole V1' on the base substrate is located within a range of an orthographic projection of the third electrode of the first transistor on the base substrate, and the second insulating layer, the third insulating layer and the third conductive layer below the first via hole V1' are etched to expose a surface of the third electrode of the first transistor. The first via hole V1' is configured to make one of the first clock signal line and the second clock signal line formed by a subsequent process electrically connected with the third electrode of the first transistor.

In some embodiments of the present disclosure, as shown in FIG. 40 and FIG. 41, an orthographic projection of the eighth via hole V8' on the base substrate is located within a range of an orthographic projection of the second electrode plate of the first transistor on the base substrate, and the third insulating layer and the third conductive layer below the eighth via hole V8' are etched to expose a surface of the second electrode plate of the first capacitor. The eighth via hole V8' is configured to make the other one of the first clock signal line and the second clock signal line formed by the subsequent process electrically connected with the second electrode plate of the first capacitor.

In some embodiments of the present disclosure, a preparation process of the fourth insulating layer is similar to the aforementioned preparation process, which is not repeated here.

Figure 42:
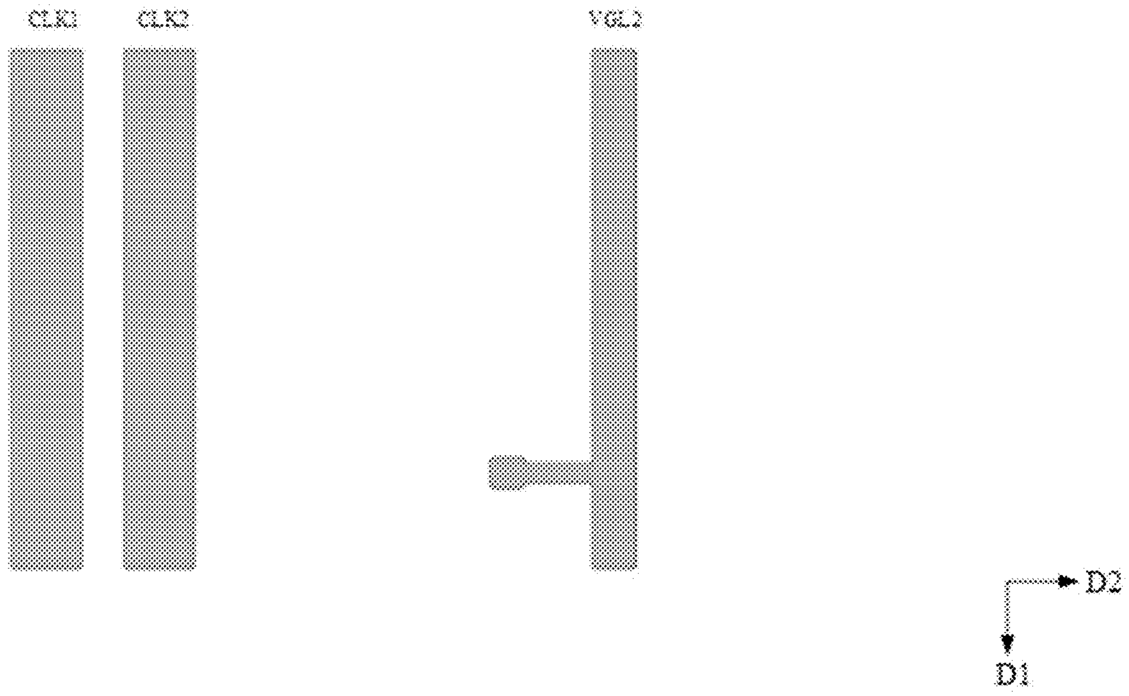
FIG. 42 is a schematic structural diagram of a fourth conductive layer pattern in FIG. 31.
Figure 43:
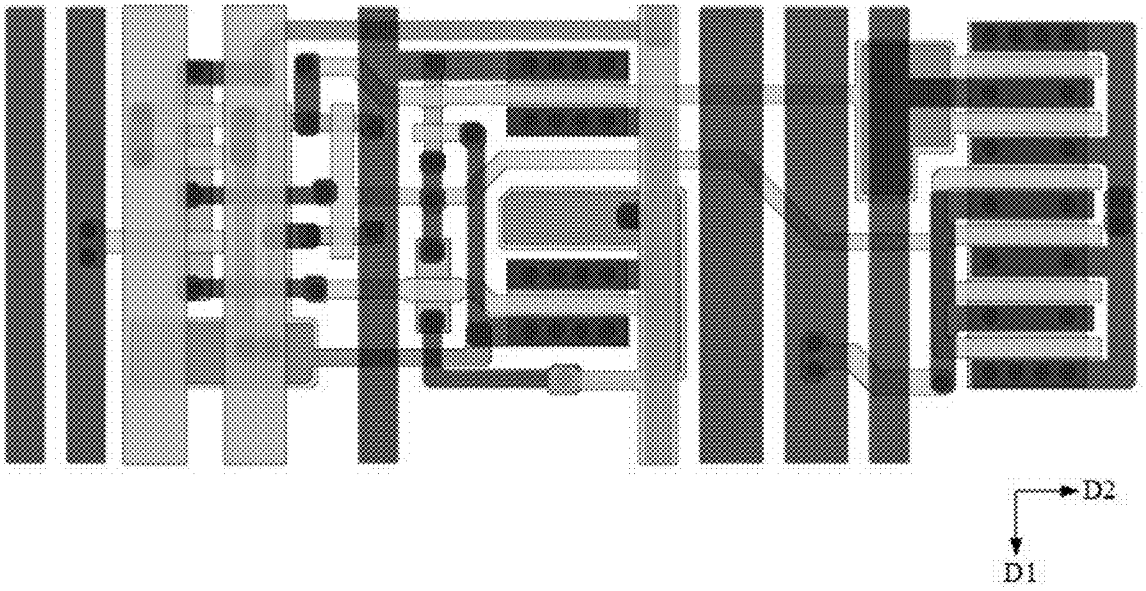
FIG. 43 is a schematic structural diagram of FIG. 31 after the fourth conductive layer pattern is formed.

A seventh step, a fourth conductive layer pattern is formed, including: depositing a fourth conductive thin film on the base substrate where the aforementioned patterns are formed, and performing composition on the fourth conductive thin film through a patterning process to form the fourth conductive layer pattern. As shown in FIG. 42 and FIG. 43, FIG. 42 is a schematic diagram of the fourth conductive layer pattern in FIG. 31, and FIG. 43 is a schematic diagram of FIG. 31 after the fourth conductive layer pattern is formed. In some embodiments of the present disclosure, the fourth conductive layer may be referred to as a second source-drain metal (SD2) layer.

In some embodiments of the present disclosure, as shown in FIG. 42 and FIG. 43, the fourth conductive layer pattern may include: the first clock signal line CLK1, the second clock signal line CLK2 and the third voltage signal line VGL2.

In some embodiments of the present disclosure, as shown in FIG. 42 and FIG. 43, the first clock signal line CLK1 may be in a line shape, and extends in the first direction D1. An orthographic projection of the first clock signal line CLK1 on the base substrate is located between the first voltage signal line VGL1 away from the display region and the second voltage signal line VGH, and the orthographic projection of the first clock signal line CLK1 on the base substrate partially overlaps orthographic projections of the first transistor, the seventh transistor and the first capacitor on the base substrate.

In some embodiments of the present disclosure, as shown in FIG. 42 and FIG. 43, the first clock signal line CLK1 is electrically connected with the third electrode T1*b* of the first transistor through the first via hole V1'.

In some embodiments of the present disclosure, as shown in FIG. 42 and FIG. 43, the second clock signal line CLK2 may be in a line shape, and extends in the first direction D1. An orthographic projection of the second clock signal line CLK2 on the base substrate is located between the first voltage signal line VGL1 away from the display region and the second voltage signal line VGH, and the orthographic projection of the second clock signal line CLK2 on the base substrate partially overlaps orthographic projections of the second transistor and the first capacitor on the base substrate.

In some embodiments of the present disclosure, as shown in FIG. 42 and FIG. 43, the second clock signal line CLK2 is electrically connected with the second electrode plate C2-2 of the first capacitor through the eighth via hole V8'.

In some embodiments of the present disclosure, as shown in FIG. 42 and FIG. 43, the third voltage signal line VGL2 may be in a line shape, and extends in the first direction D1. An orthographic projection of the third voltage signal line VGL2 on the base substrate is located between the second voltage signal line VGH and the third clock signal line CLK3, and the orthographic projection on the base substrate partially overlaps an orthographic projection of the second capacitor on the base substrate.

In some embodiments of the present disclosure, as shown in FIG. 42 and FIG. 43, the third voltage signal line VGL2 is electrically connected with the first electrode T12*c*-1 of the twelfth transistor through the thirty-eighth via hole V38.

An eighth step, a flat layer pattern is formed. This process is similar to the aforementioned preparation process, which is not repeated here.

In some embodiments of the present disclosure, the first clock signal line CLK1, the second clock signal line CLK2 and the third voltage signal line VGL2 are arranged at the same layer, so that a dimension of the shifting register unit in the first direction may be reduced by about 25 microns, the dimension of the shifting register unit is effectively reduced, a bezel length of the non-display region may be further reduced, and narrow-bezel design is facilitated.

In some embodiments of the present disclosure, the semiconductor layer may be an amorphous silicon layer or a poly-silicon layer, or a metal oxide layer. The metal oxide layer may adopt oxides containing indium and tin, oxides containing tungsten and indium, oxides containing tungsten, indium and zinc, oxides containing titanium and indium, oxides containing titanium, indium and tin, oxides containing indium and zinc, oxides containing silicon, indium and tin, or oxides containing indium or gallium and zinc. The metal oxide layer may be single-layer, or double-layer, or multi-layer.

In some embodiments of the present disclosure, the first conductive layer, the second conductive layer, the third conductive layer, and the fourth conductive layer may be made of metal materials, such as any one or more of silver (Ag), copper (Cu), aluminum (Al), and molybdenum (Mo), or alloy materials of the aforementioned metals, such as an aluminum neodymium alloy (AlNd) or a molybdenum niobium alloy (MoNb), and the layers may be of single-layer structures or multi-layer composite structures, such as Mo/Cu/Mo.

In some embodiments of the present disclosure, the first insulating layer, the second insulating layer, the third insulating layer, the fourth insulating layer, and the fifth insulating layer may adopt any one or more of a silicon oxide (SiOx), a silicon nitride (SiNx), and silicon oxynitride (SiON), and may be a single layer, multiple layers, or composite layers.

In some embodiments of the present disclosure, the flat layer may be made of an organic material, such as resin.

In some embodiments of the present disclosure, after the driving structure layer is prepared, a light emitting structure layer is prepared on the driving structure layer, and a preparation process of the light emitting structure layer may include the following operations.

An anode conductive thin film is deposited on the base substrate where the aforementioned patterns are formed, the anode conductive thin film is patterned by using a patterning process to form an anode conductive layer pattern arranged on the flat layer, a pixel defining thin film is deposited on the base substrate where the aforementioned patterns are formed, the pixel defining thin film is patterned through the patterning process to form a pixel defining layer pattern exposing the anode conductive layer pattern, the base substrate where the pixel defining layer pattern is formed is coated with an organic light emitting material, the organic light emitting material is patterned through the patterning process to form an organic structure layer pattern, and a cathode conductive thin film is deposited on the base substrate where the organic material layer pattern is formed, and the cathode conductive thin film is patterned through the patterning process to form a cathode conductive layer.

So far, the light emitting structure layer is prepared on the base substrate.

In some embodiments of the present disclosure, a subsequent preparation flow may include: forming a packaging structure layer on the cathode conductive layer. The packaging structure layer may include a first packaging layer, a second packaging layer and a third packaging layer arranged in a stacked mode, the first packaging layer and the third packaging layer may be made of inorganic materials, the second packaging layer may be made of organic materials, the second packaging layer is arranged between the first packaging layer and the third packaging layer, and it may guarantee that external vapor cannot enter the light emitting structure layer.

In some embodiments of the present disclosure, the anode conductive layer at least includes a plurality of anode patterns.

In some embodiments of the present disclosure, the anode conductive layer adopts a single-layer structure, such as indium tin oxide ITO or indium zinc oxide IZO, or may adopt a multi-layer composite structure, such as ITO/Ag/ITO.

In some embodiments of the present disclosure, the organic structure layer may at least include: an organic light emitting layer of a light emitting device.

In some embodiments of the present disclosure, the cathode conductive layer may at least include: cathodes of a plurality of light emitting devices.

In some embodiments of the present disclosure, the cathode layer may be made of metal materials, such as any one or more of silver (Ag), copper (Cu), aluminum (Al), and molybdenum (Mo), or alloy materials of the aforementioned metals, such as an aluminum neodymium alloy (AlNd) or a molybdenum niobium alloy (MoNb), and the layer may be of a single-layer structure or a multi-layer composite structure, such as Mo/Cu/Mo. Exemplarily, the fourth conductive layer may be of a three-layer stacked structure formed by titanium, aluminum and titanium.

The display substrate in the embodiment of the present disclosure may be applicable to display products of any resolution.

The accompanying drawings in the present disclosure only involve the structures involved in the embodiments of the present disclosure, and other structures can refer to usual design.

For clarity, in the accompanying drawings used to describe the embodiments of the present disclosure, the thickness and dimension of the layers or microstructures are enlarged. It can be understood that when elements such as layers, films, regions, or substrates are referred to as being located “above” or “below” another element, the elements may be “directly” located “above” or “below” another element, or there may be intermediate elements present.

Although the implementations disclosed in the present disclosure are as above, the content described is only implementations adopted for the convenience of understanding the present disclosure and is not intended to limit the present disclosure. Any person skilled in the art to which the present disclosure belongs may make any modification and change in the form and details of implementation without departing from the spirit and scope disclosed in the present disclosure. However, the scope of patent protection in the present disclosure shall still be subject to the scope defined in the attached claims.

What is claimed is:

1. A shifting register unit, comprising:

a shifting register configured to output a cascaded signal through a cascaded output terminal; and an output circuit electrically connected with the shifting register, and configured to control a driving output terminal to output a gate scanning signal according to a signal of a first voltage signal terminal and a signal of a reference signal terminal; wherein the shifting register comprises: a first control sub-circuit;

the first control sub-circuit is electrically connected with a first node, a second node, a second voltage signal terminal and a first clock signal terminal in the shifting register; and the first control sub-circuit is configured to control a voltage of the second node according to a voltage of the first node and a signal of the first clock signal terminal;

wherein the output circuit comprises: a tenth transistor, an eleventh transistor and a thirteenth transistor;

a first electrode of the tenth transistor is electrically connected with the reference signal terminal, a second electrode of the tenth transistor is electrically connected with the driving output terminal, and a third electrode of the tenth transistor is electrically connected with a second electrode of the thirteenth transistor;

a first electrode of the eleventh transistor is electrically connected with the first voltage signal terminal, a second electrode of the eleventh transistor is electrically connected with the driving output terminal, and a third electrode of the eleventh transistor is electrically connected with the second node; and a first electrode of the thirteenth transistor is electrically connected with the first node, and a third electrode of the thirteenth transistor is electrically connected with the first voltage signal terminal.

2. The shifting register unit according to claim 1, further comprising: an input sub-circuit; and the input sub-circuit is configured to provide a signal of an input signal terminal to the first node according to a signal of a second clock signal terminal.

3. The shifting register unit according to claim 2, wherein the input sub-circuit comprises: a first transistor; and a first electrode of the first transistor is electrically connected with the input signal terminal, a second electrode of the first transistor is electrically connected with the first node, and a third electrode of the first transistor is electrically connected with the second clock signal terminal.

4. The shifting register unit according to claim 2, wherein the signal of the first clock signal terminal and the signal of the second clock signal terminal are not effective level signals at the same time.

5. The shifting register unit according to claim 1, wherein the first control sub-circuit comprises: a second transistor, a third transistor, a fourth transistor and a first capacitor;

a first electrode of the second transistor is electrically connected with the first clock signal terminal, a second electrode of the second transistor is electrically connected with the second node, and a third electrode of the second transistor is electrically connected with a third node;

a first electrode of the third transistor is electrically connected with the second voltage signal terminal, a second electrode of the third transistor is electrically connected with the third node, and a third electrode of the third transistor is electrically connected with the first node;

a first electrode of the fourth transistor is electrically connected with the second voltage signal terminal, a second electrode of the fourth transistor is electrically connected with the second node, and a third electrode of the fourth transistor is electrically connected with the first node; and a first electrode of the first capacitor is electrically connected with the first clock signal terminal, and a second electrode of the first capacitor is electrically connected with the third node.

6. The shifting register unit according to claim 1, further comprising: a second control sub-circuit;

the second control sub-circuit is electrically connected with the first node, the second node, the second voltage signal terminal and the first clock signal terminal; and the second control sub-circuit is configured to transmit a signal from the second voltage signal terminal to the first node according to the voltage of the second node and the signal of the first clock signal terminal.

7. The shifting register unit according to claim 6, wherein the second control sub-circuit comprises: a fifth transistor and a sixth transistor;

a first electrode of the fifth transistor is electrically connected with the second voltage signal terminal, a second electrode of the fifth transistor is electrically connected with a first electrode of the sixth transistor, and a third electrode of the fifth transistor is electrically connected with the second node; and a second electrode of the sixth transistor is electrically connected with the first node, and a third electrode of the sixth transistor is electrically connected with the first clock signal terminal.

8. The shifting register unit according to claim 1, further comprising: a voltage stabilizing sub-circuit; and the voltage stabilizing sub-circuit is electrically connected with the first node, a fourth node and the first voltage signal terminal, and the voltage stabilizing sub-circuit is configured to transmit a voltage from the first node to the fourth node according to the signal of the first voltage signal terminal.

9. The shifting register unit according to claim 8, wherein the voltage stabilizing sub-circuit comprises: a seventh transistor; and a first electrode of the seventh transistor is electrically connected with the first node, a second electrode of the seventh transistor is electrically connected with the fourth node, and a third electrode of the seventh transistor is electrically connected with the first voltage signal terminal.

10. The shifting register unit according to claim 8, further comprising: a pull-down sub-circuit; and the pull-down sub-circuit is electrically connected with a third voltage signal terminal and the first node, and is configured to transmit a signal from the third voltage signal terminal to the first node.

11. The shifting register unit according to claim 10, wherein an amplitude of a voltage signal of the third voltage signal terminal is greater than an amplitude of a voltage signal of the first voltage signal terminal.

12. The shifting register unit according to claim 11, wherein the pull-down sub-circuit comprises: a twelfth transistor; and a first electrode of the twelfth transistor is electrically connected with the third voltage signal terminal, a second electrode of the twelfth transistor is electrically connected with the first node, and a third electrode of the twelfth transistor is electrically connected with the fourth node; or the pull-down sub-circuit comprises: a twelfth transistor; and a first electrode of the twelfth transistor is electrically connected with the third voltage signal terminal, a second electrode of the twelfth transistor is electrically connected with the first node, and a third electrode of the twelfth transistor is electrically connected with the first node.

13. The shifting register unit according to claim 1, further comprising: a cascaded sub-circuit; and the cascaded sub-circuit is electrically connected with the second node, a fourth node, the first clock signal terminal and the second voltage signal terminal, and the cascaded sub-circuit is configured to make the cascaded output terminal output the cascaded signal according to voltages of the second node and the fourth node.

14. The shifting register unit according to claim 13, wherein the cascaded sub-circuit comprises: an eighth transistor, a ninth transistor and a second capacitor;

a first electrode of the eighth transistor is electrically connected with the first clock signal terminal, a second electrode of the eighth transistor is electrically connected with the cascaded output terminal, and a third electrode of the eighth transistor is electrically connected with the fourth node;

a first electrode of the ninth transistor is electrically connected with the second voltage signal terminal, a second electrode of the ninth transistor is electrically connected with the cascaded output terminal, and a third electrode of the ninth transistor is electrically connected with the second node; and a first electrode of the second capacitor is electrically connected with the fourth node, and a second electrode of the second capacitor is electrically connected with the cascaded output terminal.

15. The shifting register unit according to claim 14, wherein the cascaded sub-circuit comprises: a third capacitor; and a first electrode of the third capacitor is electrically connected with the second voltage signal terminal, and a second electrode of the third capacitor is electrically connected with the cascaded output terminal.

16. The shifting register unit according to claim 1, wherein the output circuit further comprises: a fourth capacitor; and a first electrode of the fourth capacitor is electrically connected with the first voltage signal terminal, and a second electrode of the fourth capacitor is electrically connected with the second node.

17. The shifting register unit according to claim 1, wherein the signal of the reference signal terminal and the signal of the first clock signal terminal are inversion signals for each other.

18. A display panel, comprising:

a base substrate comprising a display region and a non-display region; wherein the display region comprises:

a plurality of sub-pixels; and a plurality of scanning lines, wherein one row of sub-pixels in the plurality of sub-pixels is electrically connected with at least one scanning line in the plurality of scanning lines correspondingly; and the non-display region comprises:

a gate driving circuit comprising a plurality of shifting register units of claim 1, wherein a driving output terminal of each shifting register unit in the plurality of shifting register units is electrically connected with at least one scanning line in the plurality of scanning lines correspondingly.

19. The display panel according to claim 18, further comprising: an input signal line electrically connected with the gate driving circuit and arranged at the non-display region, a first voltage signal line away from the display region, a first clock signal line and a second clock signal line; wherein any one of the input signal line, the first voltage signal line away from the display region, the first clock signal line and the second clock signal line extends in a first direction, a gate line extends in a second direction, and the first direction and the second direction intersect.

20. The display panel according to claim 19, wherein orthographic projections of the input signal line, the first clock signal line, the second clock signal line and the first voltage signal line away from the display region on the base substrate are distributed sequentially in a direction close to the display region, and are located on a side away from the display region, of the shifting register units, or orthographic projections of the input signal line, the first voltage signal line away from the display region, the first clock signal line and the second clock signal line on the base substrate are distributed sequentially in a direction close to the display region, and are located on a side away from the display region, of the shifting register units.

21. The display panel according to claim 20, wherein the input signal line, the first clock signal line, the second clock signal line and the first voltage signal line away from the display region are arranged at the same layer, or the input signal line and the first voltage signal line away from the display region are arranged at the same layer, the first clock signal line and the second clock signal line are arranged at the same layer, and the input signal line and the first voltage signal line away from the display region are not arranged at the same layer with the first clock signal line and the second clock signal line.

22. The display panel according to claim 19, further comprising: a second voltage signal line electrically connected with the gate driving circuit and arranged at the non-display region, wherein the second voltage signal line extends in the first direction.

23. The display panel according to claim 22, wherein the second voltage signal line is arranged on a side, close to the display region, of the first voltage signal line away from the display region.

24. The display panel according to claim 22, further comprising: a third voltage signal line electrically connected with the gate driving circuit and arranged at the non-display region, wherein the third voltage signal line extends in the first direction.

25. The display panel according to claim 24, wherein the third voltage signal line is arranged on a side close to the display region, of the second voltage signal line.

26. The display panel according to claim 24, further comprising: a third clock signal line electrically connected with the gate driving circuit and arranged at the non-display region, a fourth clock signal line and a first voltage signal line close to the display region, wherein the third clock signal line, the fourth clock signal line and the first voltage signal line close to the display region extend in the first direction.

27. The display panel according to claim 26, wherein any one of the third clock signal line and the fourth clock signal line is arranged on a side close to the display region, of the third voltage signal line; and the first voltage signal line close to the display region is located on a side close to the display region, of any one of the third clock signal line and the fourth clock signal line.

28. The display panel according to claim 26, wherein a reference signal terminal of an $i^{th}$ grade shifting register unit is electrically connected with one of the third clock signal line and the fourth clock signal line, and a reference signal terminal of an $(i+1)^{th}$ grade shifting register unit is electrically connected with the other one of the third clock signal line and the fourth clock signal line.

29. The display panel according to claim 26, wherein a width of any one of the input signal line, the first voltage signal line, the second voltage signal line and the third voltage signal line in the second direction is less than a width of any one of the first clock signal line, the second clock signal line, the third clock signal line and the fourth clock signal line in the second direction.

30. The display panel according to claim 26, wherein each of the shifting register units comprises: a first transistor, a second transistor, a third transistor, a fourth transistor, a seventh transistor and a first capacitor; and at least part of any transistor or capacitor in the first transistor, the second transistor, the third transistor, the fourth transistor, the seventh transistor and the first capacitor is located between the first voltage signal line and the second voltage signal line, or each of the shifting register units comprises: a fifth transistor, a sixth transistor, an eighth transistor, a ninth transistor, a twelfth transistor and a second capacitor; and at least part of any transistor or capacitor in the fifth transistor, the sixth transistor, the eighth transistor, the ninth transistor, the twelfth transistor and the second capacitor is located between the second voltage signal line and the third voltage signal line, or each of the shifting register units comprises: a tenth transistor, an eleventh transistor and a third capacitor;

at least part of any transistor or capacitor in the tenth transistor, the eleventh transistor and the third capacitor is located on a side, close to the display region, of the first voltage signal line close to the display region; and an orthographic projection of the first voltage signal line close to the display region on the base substrate partially overlaps an orthographic projection of the third capacitor on the base substrate.

31. The display panel according to claim 30, wherein an active layer of the twelfth transistor extends in the first direction, at least part of any one of a first electrode and a second electrode of the twelfth transistor extends in the second direction, and a third electrode of the twelfth transistor extends in the second direction.

32. The display panel according to claim 30, wherein a channel width of an active layer of the tenth transistor is greater than a channel width of an active layer of the eighth transistor.

33. The display panel according to claim 32, wherein the channel width of the active layer of the tenth transistor is not less than 90 microns, or the channel width of the active layer of the eighth transistor is not greater than 50 microns.

34. The display panel according to claim 30, wherein a channel width of an active layer of the eleventh transistor is greater than a channel width of an active layer of the ninth transistor.

35. The display panel according to claim 34, wherein the channel width of the active layer of the eleventh transistor is not less than 90 microns, or he channel width of the active layer of the ninth transistor is not greater than 50 microns.

36. The display panel according to claim 19, wherein a first clock signal terminal of an $i^{th}$ grade shifting register unit is electrically connected with one of the first clock signal line and the second clock signal line, and a second clock signal terminal of the $i^{th}$ grade shifting register unit is electrically connected with the other one of the first clock signal line and the second clock signal line; and the first clock signal terminals of adjacent shifting register units are connected with different signal lines, and the second clock signal terminals of the adjacent shifting register units are connected with different signal lines.

37. A display apparatus, comprising: the display panel according to claim 18.

38. A driving method of a shifting register, comprising:

providing, by an input sub-circuit, a signal of an input signal terminal to a first node under control of a signal of a second clock signal terminal;

controlling, by a first control sub-circuit, a voltage of a second node under control of a voltage of the first node and a signal of a first clock signal terminal;

providing, by a second control sub-circuit, a signal of a second voltage signal terminal to the first node under control of the voltage of the second node and the signal of the first clock signal terminal;

providing, by a voltage stabilizing sub-circuit, the voltage of the first node to a fourth node under control of a signal of a first voltage signal terminal;

providing, by a cascaded sub-circuit, the signal of the second voltage signal terminal or the signal of the first clock signal terminal to a cascaded output terminal under control of voltages of the second node and the fourth node; and providing, by an output circuit, a signal of a reference signal terminal or the signal of the first voltage signal terminal to a driving output terminal under control of the voltages of the first node and the second node.

39. The method according to claim 38, wherein the shifting register unit further comprises: a pull-down sub-circuit; and the method further comprises: providing, by the pull-down sub-circuit, a signal of a third voltage signal terminal to the first node under control of the voltages of the first node or the fourth node.

* * * * *